US 9,378,108 B2

(12) United States Patent
Cohen et al.

(10) Patent No.: US 9,378,108 B2
(45) Date of Patent: Jun. 28, 2016

(54) IMPLEMENTING PERFORMANCE-DEPENDENT TRANSFER OR EXECUTION DECISIONS FROM SERVICE EMULATION INDICATIONS

(75) Inventors: Alexander J. Cohen, Mill Valley, CA (US); Edward K. Y. Jung, Bellevue, WA (US); Royce A. Levien, Lexington, MA (US); Robert W. Lord, Seattle, WA (US); Mark A. Malamud, Seattle, WA (US); John D. Rinaldo, Jr., Bellevue, WA (US); Lowell L. Wood, Jr., Bellevue, WA (US)

(73) Assignee: Invention Science Fund I, LLC, Bellevue, WA (US)

( * ) Notice: Subject to any disclaimer, the term of this patent is extended or adjusted under 35 U.S.C. 154(b) by 855 days.

(21) Appl. No.: 11/728,268

(22) Filed: Mar. 22, 2007

(65) Prior Publication Data
US 2008/0234999 A1  Sep. 25, 2008

(51) Int. Cl.
G06F 9/455 (2006.01)
G06F 11/26 (2006.01)
G06F 17/50 (2006.01)

(52) U.S. Cl.
CPC .......... *G06F 11/261* (2013.01); *G06F 17/5027* (2013.01)

(58) Field of Classification Search
CPC .... G06F 21/53; G06F 11/3664; G06F 11/261
USPC .............................. 703/23, 22, 26, 27; 714/28
See application file for complete search history.

(56) References Cited

U.S. PATENT DOCUMENTS

| | | | |
|---|---|---|---|
| 4,400,769 A | 8/1983 | Kaneda et al. | |
| 4,875,154 A | 10/1989 | Mitchell | |
| 4,898,461 A | 2/1990 | Portney | |
| 5,109,489 A | 4/1992 | Umeno et al. | |
| 5,574,927 A | 11/1996 | Scantlin | |
| 5,692,067 A | 11/1997 | Raterman et al. | |
| 5,805,867 A | 9/1998 | Kodaira | |
| 5,877,839 A | 3/1999 | Portney | |
| 5,889,954 A * | 3/1999 | Gessel et al. .................. 709/223 |
| 5,991,531 A | 11/1999 | Song et al. | |
| 6,218,930 B1 | 4/2001 | Katzenberg et al. | |
| 6,240,544 B1 | 5/2001 | Kaneko | |
| 6,253,224 B1 | 6/2001 | Brice, Jr. et al. | |
| 6,353,897 B1 | 3/2002 | Nock et al. | |
| 6,480,952 B2 | 11/2002 | Gorishek, IV et al. | |
| 6,527,389 B2 | 3/2003 | Portney | |
| 6,564,179 B1 | 5/2003 | Belhaj | |
| 6,564,339 B1 | 5/2003 | Swoboda et al. | |
| 6,672,963 B1 | 1/2004 | Link | |
| 6,718,535 B1 | 4/2004 | Underwood | |

(Continued)

OTHER PUBLICATIONS

Stelios Sidiroglou, Michael E. Locasto, Stephen W. Boyd, Angelos D. Keromytis, "Building a Reactive Immune System for Software Services", 2005, USENIX Annual Technical Conference, p. 149-161.*

(Continued)

*Primary Examiner* — Omar Fernandez Rivas
*Assistant Examiner* — Bernard E Cothran

(57) ABSTRACT

A system, method, computer program product, and carrier are described for obtaining data from a first emulator and from a first emulation environment hosting software and signaling a decision whether to transfer any of the data to a second emulator at least partly as a result of the first emulation environment hosting the software.

41 Claims, 39 Drawing Sheets

(56) References Cited

U.S. PATENT DOCUMENTS

| | | | |
|---|---|---|---|
| 6,907,519 B2 | 6/2005 | Desoli | |
| 6,910,024 B2 | 6/2005 | Krishnamurthy et al. | |
| 6,920,416 B1* | 7/2005 | Swoboda et al. | 703/13 |
| 6,954,790 B2 | 10/2005 | Forslöw | |
| 6,980,946 B2 | 12/2005 | Giles et al. | |
| 7,065,680 B2 | 6/2006 | Mantyla | |
| 7,073,129 B1 | 7/2006 | Robarts et al. | |
| 7,089,377 B1 | 8/2006 | Chen | |
| 7,111,145 B1 | 9/2006 | Chen et al. | |
| 7,130,788 B2* | 10/2006 | Reblewski | 703/28 |
| 7,275,136 B1 | 9/2007 | Chen | |
| 7,475,431 B2* | 1/2009 | Chao | 726/30 |
| 7,496,494 B2 | 2/2009 | Altman et al. | |
| 7,505,889 B2* | 3/2009 | Salmonsen et al. | 703/23 |
| 7,647,589 B1* | 1/2010 | Dobrovolskiy et al. | 718/1 |
| 7,685,597 B1 | 3/2010 | Czajkowski et al. | |
| 8,074,115 B2 | 12/2011 | Stolfo et al. | |
| 8,135,994 B2 | 3/2012 | Keromytis et al. | |
| 8,250,519 B2 | 8/2012 | Budko et al. | |
| 8,274,518 B2 | 9/2012 | Blythe | |
| 8,438,609 B2* | 5/2013 | Cohen et al. | 726/1 |
| 8,489,931 B2 | 7/2013 | Keromytis et al. | |
| 8,601,322 B2 | 12/2013 | Stolfo et al. | |
| 8,615,601 B2 | 12/2013 | Patrick et al. | |
| 8,694,833 B2 | 4/2014 | Keromytis et al. | |
| 8,850,573 B1* | 9/2014 | Chen et al. | 726/22 |
| 2002/0108107 A1* | 8/2002 | Darnell et al. | 717/153 |
| 2002/0112228 A1 | 8/2002 | Granston et al. | |
| 2002/0129335 A1 | 9/2002 | Lewis | |
| 2003/0014738 A1 | 1/2003 | Dawkins et al. | |
| 2003/0046665 A1 | 3/2003 | Ilin | |
| 2003/0056151 A1 | 3/2003 | Makiyama | |
| 2003/0065943 A1 | 4/2003 | Geis et al. | |
| 2003/0131246 A1 | 7/2003 | Reeves et al. | |
| 2003/0132853 A1 | 7/2003 | Ebert | |
| 2004/0088526 A1 | 5/2004 | Colavin et al. | |
| 2004/0103406 A1 | 5/2004 | Patel | |
| 2004/0133777 A1 | 7/2004 | Kiriansky et al. | |
| 2004/0139480 A1 | 7/2004 | Delpuch et al. | |
| 2004/0153831 A1 | 8/2004 | Kuth | |
| 2004/0167984 A1 | 8/2004 | Herrmann | |
| 2004/0168049 A1 | 8/2004 | Lee | |
| 2004/0181476 A1 | 9/2004 | Smith et al. | |
| 2004/0230437 A1 | 11/2004 | Havrilak, Jr. | |
| 2004/0255165 A1* | 12/2004 | Szor | 713/201 |
| 2005/0004863 A1 | 1/2005 | Havrilak | |
| 2005/0015686 A1 | 1/2005 | Atoji et al. | |
| 2005/0050389 A1* | 3/2005 | Chaurasia | 714/15 |
| 2005/0055189 A1* | 3/2005 | Nakamura | 703/14 |
| 2005/0055190 A1* | 3/2005 | Hosokawa | G06F 17/5022 703/14 |
| 2005/0055458 A1 | 3/2005 | Mohan et al. | |
| 2005/0066195 A1 | 3/2005 | Jones | |
| 2005/0071824 A1* | 3/2005 | K. N. et al. | 717/138 |
| 2005/0102129 A1* | 5/2005 | Bond et al. | 703/26 |
| 2005/0132054 A1 | 6/2005 | Chang et al. | |
| 2005/0132367 A1 | 6/2005 | Tewari et al. | |
| 2005/0160423 A1 | 7/2005 | Bantz et al. | |
| 2005/0175183 A1 | 8/2005 | Ovadia et al. | |
| 2005/0212763 A1 | 9/2005 | Okamura | |
| 2005/0273850 A1 | 12/2005 | Freund | |
| 2005/0281190 A1 | 12/2005 | McGee et al. | |
| 2006/0005185 A1 | 1/2006 | Nguyen | |
| 2006/0010492 A9 | 1/2006 | Heintz et al. | |
| 2006/0020939 A1 | 1/2006 | Fellenstein et al. | |
| 2006/0036463 A1 | 2/2006 | Patrick et al. | |
| 2006/0075076 A1 | 4/2006 | Sinha | |
| 2006/0130060 A1 | 6/2006 | Anderson et al. | |
| 2006/0130134 A1 | 6/2006 | Colas | |
| 2006/0136911 A1 | 6/2006 | Robinson et al. | |
| 2006/0143522 A1* | 6/2006 | Multhaup et al. | 714/28 |
| 2006/0146057 A1 | 7/2006 | Blythe | |
| 2006/0155912 A1 | 7/2006 | Singh et al. | |
| 2006/0184349 A1 | 8/2006 | Goud et al. | |
| 2006/0195745 A1* | 8/2006 | Keromytis et al. | 714/741 |
| 2006/0206873 A1 | 9/2006 | Argade | |
| 2006/0248390 A1* | 11/2006 | Hori et al. | 714/28 |
| 2006/0253824 A1 | 11/2006 | Iizuka | |
| 2006/0256106 A1 | 11/2006 | Scarlata et al. | |
| 2006/0259947 A1 | 11/2006 | Aarnos et al. | |
| 2007/0043896 A1* | 2/2007 | Daruwala et al. | 711/6 |
| 2007/0074199 A1 | 3/2007 | Schoenberg | |
| 2007/0107057 A1 | 5/2007 | Chander et al. | |
| 2007/0156951 A1 | 7/2007 | Sultan et al. | |
| 2007/0299906 A1 | 12/2007 | Bose et al. | |
| 2008/0133208 A1 | 6/2008 | Stringham | |
| 2008/0133214 A1* | 6/2008 | Leventhal et al. | 703/26 |
| 2008/0263650 A1 | 10/2008 | Kerschbaum | |
| 2008/0313648 A1 | 12/2008 | Wang et al. | |
| 2009/0113413 A1 | 4/2009 | Reinz | |
| 2009/0210427 A1 | 8/2009 | Eidler et al. | |
| 2009/0282476 A1 | 11/2009 | Nachenberg et al. | |
| 2010/0138208 A1 | 6/2010 | Hattori et al. | |

OTHER PUBLICATIONS

Michael E. Locasto, Stelios Sidiroglou, and Angelos D. Keromytis, "Software Self-Healing Using Collaborative Application Communities", 2006, Internet Society Symposium on Network and distributed system security, San Diego, CA.*

Stelios Sidiroglou, Michael E. Locasto, Stephen W. Boyd and Angelos D. Keromytis, "Building a Reactive Immune System for Software Services", 2005, USENIX Annual Technical Conference.*

Peter Ferrie, "Attacks on Virtual Machine Emulators", Jan. 2007, Symantec Advanced Threat Research.*

Stelios Sidiroglou, Michael E. Locasto, Stephen W. Boyd, and Angelos D. Keromytis, "Building a Reactive Immune System for Software Services", USENIX 2005.*

Anil Desai, NPL publication, "Which servers and applications are good virtualization candidates?", Jul. 2006, http://searchservervirtualization.techtarget.com/tip/Which-servers-and-applications-are-good-virtualization-candidates.*

Adams, Keith; Agesen, Ole; "A Comparison of Software and Hardware Techniques for x86 Virtualization"; Architectural Support for Programming Languages and Operating Systems—Proceedings of the 12th International Conference on Architectural Support for Programming Languages Operating Systems; bearing a date of 2006; pp. 2-13; ACM Press; located at: http://www.vmware.com/pdf/asplos235_adams.pdf.

"Best Practices: Using VMware Infrastructure for Backup and Restore"; VMware; bearing a date of Oct. 26, 2006; pp. 1-20; VMware, Inc.; located at: http://www.vmware.com/pdf/esx3_backup_wp.pdf.

"Brochure: VMware Infrastructure 3: Data Center Management and Optimization Suite"; VMware; bearing a date of 2006; pp. 1-4; VMware, Inc.; located at: http://www.shi.com/Global/Content/Vendors/VMware/vi_brochure.pdf.

Dodge, John; "White Paper: VirtualCenter 2: Templates Usage and Best Practices"; VMware; bearing a date of Jun. 5, 2006; pp. 1-13; VMware, Inc.; located at http://www.vmware.com/pdf/vc_2_templates_usage_best_practices_wp.pdf.

Humphreys, John; Grieser, Tim; "White Paper: Mainstreaming Server Virtualization: The Intel Approach"; IDC Analyze the Future; bearing a date of Jun. 2006; pp. 1-10; IDC; located at: http://www.intel.com/business/technologies/idc_virtualization_wp.pdf.

Locasto, Michael E.; Keromytis, Angelos D.; "Speculative Execution as an Operating System Service"; pp. 1-6; located at: http://mice.cs.columbia.edu/getTechreport.php?techreportID=407.

Locasto, Michael E.; Stavrou, Angelos; Cretu, Gabriela F.; Keromytis, Angelos D.; Stolfo, Salvatore J.; "Quantifying Application Behavior Space for Detection and Self-Healing"; pp. 1-19; located at: http://www.1.cs.columbia.edu/~gcretu/papers/cucs-017-06.pdf.

Makhija, Vikram; Herndon, Bruce; Smith, Paula; Roderick, Lisa; Zamost, Eric; Anderson, Jennifer; "VMmark: A Scalable Benchmark for Virtualized Systems: Technical Report VMware-TR-2006-002"; bearing a date of Sep. 25, 2006; pp. 1-13; VmWare, Inc.; located at: http://www.vmware.com/pdf/vmmark_intro.pdf.

(56) References Cited

OTHER PUBLICATIONS

"Optimizing Virtualized Datacetners: Comparing the Scalability of Intel® Xeon® Processor-based Server Platforms for VMware-based Consolidation Soluctions for Intel"; Edison Group, Inc.; bearing dates of Mar. 2006 and Apr. 4, 2006; pp. 1-27; Edison Group, Inc.; located at: http://www.theedison.com/index.php/articles/175.

"Performance Benchmarking Guidelines for VMware Workstation 5.5"; VMware; bearing a date of Apr. 14, 2006; pp. 1-30; VMware, Inc.; located at: http://www.vmware.com/pdf/WS55_Benchmarking_Guidelines.pdf.

"Performance Study: A Performance Comparison of Hypervisors"; VMware; pp. 1-22; VMware, Inc.; located at: http://www.vmware.com/pdf/hypervisor_performance.pdf.

Qin, Feng; Tucek, Joseph; Sundaresan, Jagadeesan; Zhou, Yuanyuan; "Rx: Treating Bugs as Allergies—A Safe Method to Survive Software Failures"; bearing a date of Oct. 2005; pp. 1-14; ACM; located at: http://opera.cs.uiuc.edu/paper/Rx-SOSP05.pdf.

"Reference Architecture: The Portable Datacenter"; VMware:SmartronIx; bearing a date of Sep. 2006; pp. 1-10; VMware, Inc.; located at: http://whitepapers.zdnet.com/whitepaper.aspx?&tags=EMC+Corp.&docid=283992.

Rinard, Martin; Cadar, Cristian; Dumitran, Daniel; Roy, Daniel M.; Leu, Tudor; Beebee, William S., Jr.; "Enhancing Server Availability and Security Through Failure-Oblivious Computing"; MIT Computer Science and Artificial Intelligence Laboratory; pp. 1-14; located at: http://web.mit.edu/droy/www/papers/osdi04.pdf.

Sidiroglou, Stelios; Locasto, Michael E.; Boyd, Stephen W.; Keromytis, Angelos D.; "Building a Reactive Immune System for Software Services"; USENIX Association; bearing a date of 2005; pp. 149-161; USENIX Annual Technical Conference; located at: http://www1.cs.columbia.edu/~locasto/papers/RISSS.pdf.

"Technical Note: VMware ESX Server: Performance Tuning Best Practices for ESX Server 3"; VMware; pp. 1-22; VMware, Inc.; located at: http://www.vmware.com/pdf/vi_performance_tuning.pdf.

"VMware Infrastructure 3: Data Center Management and Optimization Suite"; VMware; bearing a date of 2006; pp. 1-6; VMware, Inc.; located at: http://www.virtualizeasap.com/about/resources/vi_key_features_benefits.pdf.

"VMware Performance Study: Recommendations for Aligning VMFS Partitions"; VMware; bearing dates of 1998-2006; pp. 1-10; VMware, Inc.; located at: http://www.vmware.com/pdf/esx3_partition_align.pdf.

"VMware Technical Note: Replacing VirtualCenter Server Certificates" VMware; bearing a date of Dec. 19, 2006; pp. 1-12; VMware, Inc.; located at: http://www.vmware.com/pdf/vi_vcserver_certificates.pdf.

"A Performance Comparison of Hypervisors"; VMware; Bearing a Copyright Date of © 2007 VMware, Inc.; pp. 1-22; VMware, Inc.

Locasto, Michael E. et al.; "Quantifying Application Behavior Space for Detection and Self-Healing"; Bearing a Date of 2006; pp. 1-19; Located at: http://hdl.handle.net/10022/AC:P:29454; Repository: Academic Commons by Columbia University Libraries.

Locasto, Michael E. et al.; "Speculative Execution as an Operating System Service"; Bearing an Issue Date of May 12, 2006; pp. 1-6; Located at: http://hdl.handle.net/10022/AC:P:29461.

"Performance Tuning Best Practices for ESX Server 3"; VMware; Bearing a Copyright Date of © 1998-2006 VMware, Inc.; pp. 1-22.

Rinard, Martin et al.; "Enhancing Server Availability and Security Through Failure-Oblivious Computing"; Bearing a Date of Publication of 2004; pp. 1-14; USENIX Association; San Francisco, CA.

Cowan et al.; "StackGuard: Automatic Adaptive Detection and Prevention of Buffer-Overflow Attacks"; Proceedings of the 7th USENIX Security Symposium; Jan. 1998; 15 pages.

* cited by examiner

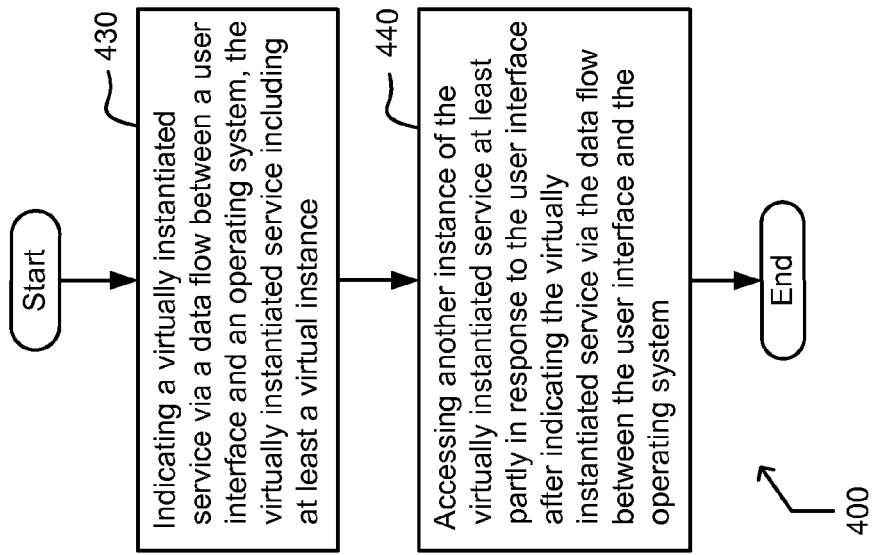
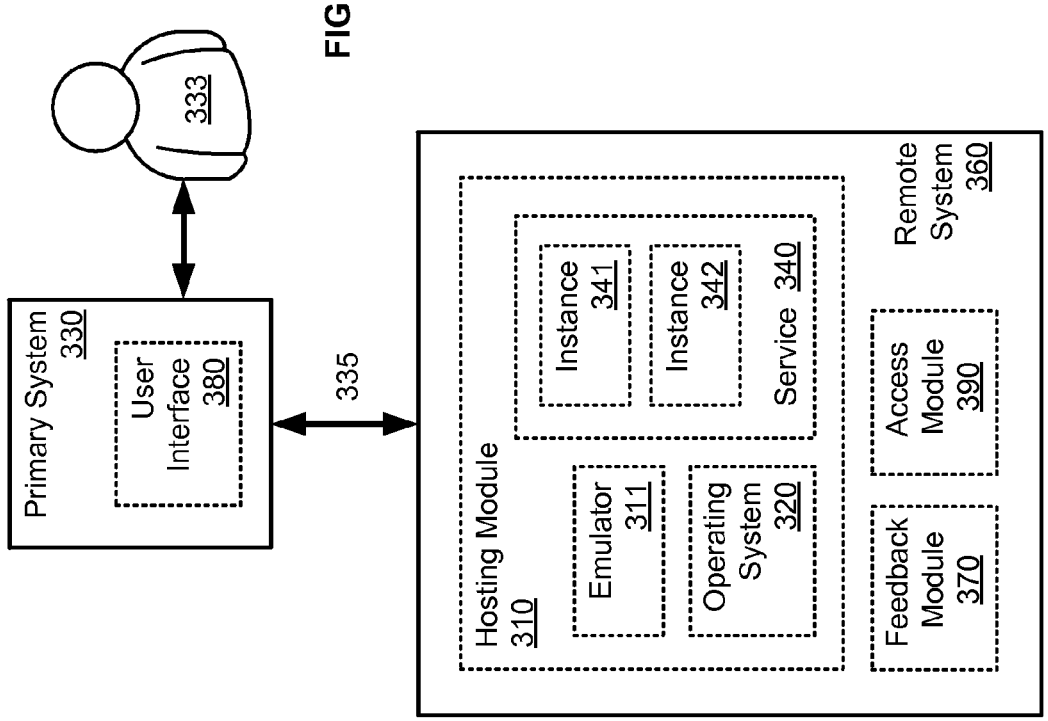

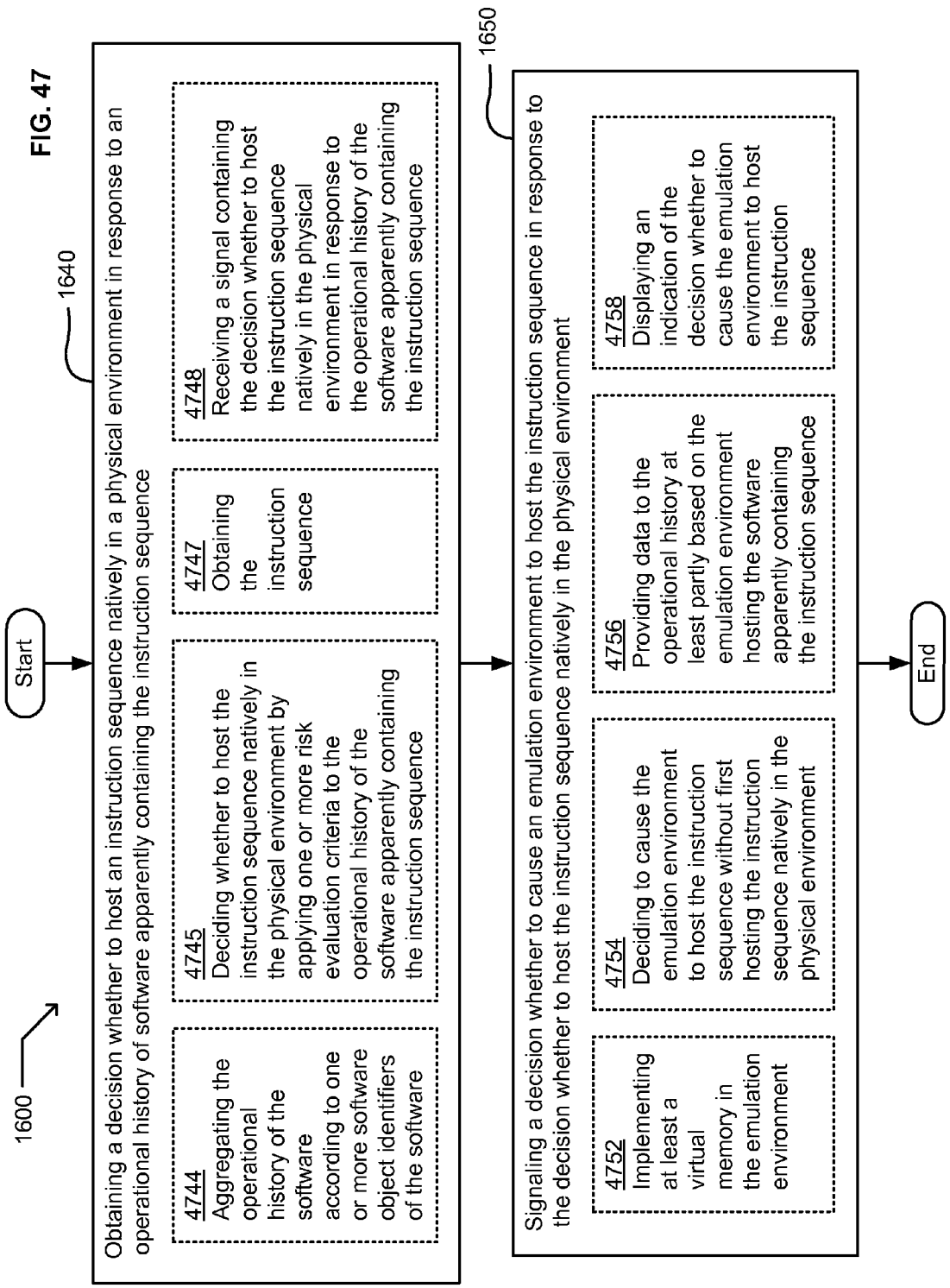

IMPLEMENTING PERFORMANCE-DEPENDENT TRANSFER OR EXECUTION DECISIONS FROM SERVICE EMULATION INDICATIONS

CROSS-REFERENCE TO RELATED APPLICATIONS

The present application is related to and claims the benefit of the earliest available effective filing date(s) from the following listed application(s) (the "Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a continuation-in-part of U.S. patent application Ser. No. 11/728,269, entitled COORDINATING INSTANCES OF A THREAD OR OTHER SERVICE IN EMULATION, naming Alexander J. Cohen, Edward K. Y. Jung, Royce A. Levien, Robert W. Lord, Mark A. Malamud, John D. Rinaldo, Jr. and Lowell L. Wood, Jr. as inventors, filed 22 Mar. 2007, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/728,269, entitled RESOURCE AUTHORIZATIONS DEPENDENT ON EMULATION ENVIRONMENT ISOLATION POLICIES, naming Alexander J. Cohen, Edward K. Y. Jung, Royce A. Levien, Robert W. Lord, Mark A. Malamud, John D. Rinaldo, Jr. and Lowell L. Wood, Jr. as inventors, filed 22 Mar. 2007, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/728,312, entitled IMPLEMENTING SECURITY CONTROL PRACTICE OMISSION DECISIONS FROM SERVICE EMULATION INDICATIONS, naming Alexander J. Cohen, Edward K. Y. Jung, Royce A. Levien, Robert W. Lord, Mark A. Malamud, John D. Rinaldo, Jr. and Lowell L. Wood, Jr. as inventors, filed 22 Mar. 2007, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/728,314, entitled IMPLEMENTING EMULATION DECISIONS IN RESPONSE TO SOFTWARE EVALUATIONS OR THE LIKE, naming Alexander J. Cohen, Edward K. Y. Jung, Royce A. Levien, Robert W. Lord, Mark A. Malamud, John D. Rinaldo, Jr. and Lowell L. Wood, Jr. as inventors, filed 22 Mar. 2007, which is currently co-pending, or is an application of which a currently co-pending application is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, Benefit of Prior-Filed Application, USPTO Official Gazette Mar. 18, 2003, which is currently available at the USPTO's website for the Week 11 OG in 2003. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

SUMMARY

In one aspect, a method includes but is not limited to obtaining a software flaw indication resulting from an emulation of a first instance of a thread at least partly in response to a first input from a user interface and manipulating a second instance of the thread at least partly in response to a second input arriving from the user interface after beginning the emulation of the first instance of the thread. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In one aspect, a system includes but is not limited to circuitry for obtaining a software flaw indication resulting from an emulation of a first instance of a thread at least partly in response to a first input from a user interface and circuitry for manipulating a second instance of the thread at least partly in response to a second input arriving from the user interface after beginning the emulation of the first instance of the thread. In addition to the foregoing, other system aspects are described in the claims, drawings, and text forming a part of the present disclosure.

In one aspect, a method includes but is not limited to indicating a virtually instantiated service via a data flow between a user interface and an operating system, the virtually instantiated service including at least a virtual instance and accessing another instance of the virtually instantiated service at least partly in response to the user interface after indicating the virtually instantiated service via the data flow between the user interface and the operating system. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In one aspect, a system includes but is not limited to circuitry for indicating a virtually instantiated service via a data flow between a user interface and an operating system, the virtually instantiated service including at least a virtual instance and circuitry for accessing another instance of the virtually instantiated service at least partly in response to the user interface after indicating the virtually instantiated service via the data flow between the user interface and the operating system. In addition to the foregoing, other system aspects are described in the claims, drawings, and text forming a part of the present disclosure.

In one aspect, a method includes but is not limited to obtaining a resource authorization dependent upon apparent compliance with a policy of causing an emulation environment to isolate a first software object type from a second software object type and signaling a decision whether to comply with the policy of causing the emulation environment to isolate the first software object type from the second software object type. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In one aspect, a system includes but is not limited to circuitry for obtaining a resource authorization dependent upon apparent compliance with a policy of causing an emulation environment to isolate a first software object type from a second software object type and circuitry for signaling a decision whether to comply with the policy of causing the emulation environment to isolate the first software object type from the second software object type. In addition to the foregoing, other system aspects are described in the claims, drawings, and text forming a part of the present disclosure.

In one aspect, a method includes but is not limited to obtaining an indication of an emulation of a service in a first environment with a first security control practice and signaling a decision whether to use a second environment without the first security control practice in performing at least a portion of the service as a result of the indication of the emulation of the service in the first environment with the first security control practice. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In one aspect, a system includes but is not limited to circuitry for obtaining an indication of an emulation of a service in a first environment with a first security control practice and circuitry for signaling a decision whether to use a second environment without the first security control practice in performing at least a portion of the service as a result of the indication of the emulation of the service in the first environment with the first security control practice. In addition to the foregoing, other system aspects are described in the claims, drawings, and text forming a part of the present disclosure.

In one aspect, a method includes but is not limited to obtaining one or more gradational norms of software performance in an emulation environment and signaling a decision whether to allow a software object to execute in another environment at least partly as a result of whether the software object apparently performed in conformity with the one or more gradational norms of software performance in the emulation environment. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In one aspect, a system includes but is not limited to circuitry for obtaining one or more gradational norms of software performance in an emulation environment and circuitry for signaling a decision whether to allow a software object to execute in another environment at least partly as a result of whether the software object apparently performed in conformity with the one or more gradational norms of software performance in the emulation environment. In addition to the foregoing, other system aspects are described in the claims, drawings, and text forming a part of the present disclosure.

In one aspect, a method includes but is not limited to obtaining data from a first emulator and from a first emulation environment hosting software and signaling a decision whether to transfer any of the data to a second emulator at least partly as a result of the first emulation environment hosting the software. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In one aspect, a system includes but is not limited to circuitry for obtaining data from a first emulator and from a first emulation environment hosting software and circuitry for signaling a decision whether to transfer any of the data to a second emulator at least partly as a result of the first emulation environment hosting the software. In addition to the foregoing, other system aspects are described in the claims, drawings, and text forming a part of the present disclosure.

In one aspect, a method includes but is not limited to obtaining a decision whether to host an instruction sequence in an emulation environment at least in response to an evaluation of software containing the instruction sequence and causing another environment to host the instruction sequence in response to the decision whether to host the instruction sequence in the emulation environment. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In one aspect, a system includes but is not limited to circuitry for obtaining a decision whether to host an instruction sequence in an emulation environment at least in response to an evaluation of software containing the instruction sequence and circuitry for causing another environment to host the instruction sequence in response to the decision whether to host the instruction sequence in the emulation environment. In addition to the foregoing, other system aspects are described in the claims, drawings, and text forming a part of the present disclosure.

In one aspect, a method includes but is not limited to obtaining a decision whether to host an instruction sequence natively in a physical environment in response to an operational history of software apparently containing the instruction sequence and signaling a decision whether to cause an emulation environment to host the instruction sequence in response to the decision whether to host the instruction sequence natively in the physical environment. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

In one aspect, a system includes but is not limited to circuitry for obtaining a decision whether to host an instruction sequence natively in a physical environment in response to an operational history of software apparently containing the instruction sequence and circuitry for signaling a decision whether to cause an emulation environment to host the instruction sequence in response to the decision whether to host the instruction sequence natively in the physical environment. In addition to the foregoing, other system aspects are described in the claims, drawings, and text forming a part of the present disclosure.

In addition to the foregoing, various other method and/or system and/or program product and/or physical carrier aspects are set forth and described in the teachings such as text (e.g., claims and/or detailed description) and/or drawings of the present disclosure.

The foregoing is a summary and thus contains, by necessity, simplifications, generalizations and omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

BRIEF DESCRIPTION OF THE FIGURES

FIG. 3 depicts an exemplary environment in which one or more technologies may be implemented.

FIG. 4 depicts a high-level logic flow of an operational process.

FIG. 47 depicts variants of the flow of FIG. 16.

DETAILED DESCRIPTION

Figure 2:
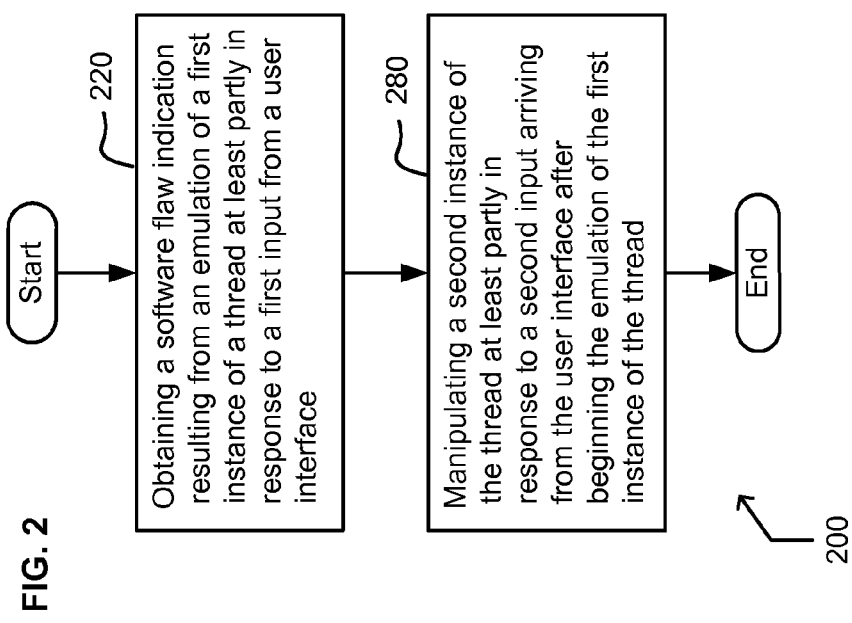
FIG. 2 depicts a high-level logic flow of an operational process.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In the following detailed description, reference is made to the accompanying drawings, which form a part hereof. The use of the same symbols in different drawings typically indicates similar or identical items. The illustrative embodiments described in the detailed description, drawings, and claims are not meant to be limiting. Other embodiments may be utilized, and other changes may be made, without departing from the spirit or scope of the subject matter presented here.

Following are a series of systems and flowcharts depicting implementations of processes. For ease of understanding, the flowcharts are organized such that the initial flowcharts present implementations via an initial "big picture" viewpoint and thereafter the following flowcharts present alternate implementations and/or expansions of the "big picture" flowcharts as either sub-steps or additional steps building on one or more earlier-presented flowcharts. Those having skill in the art will appreciate that the style of presentation utilized herein (e.g., beginning with a presentation of a flowchart(s) presenting an overall view and thereafter providing additions to and/or further details in subsequent flowcharts) generally allows for a rapid and easy understanding of the various process implementations. In addition, those skilled in the art will further appreciate that the style of presentation used herein also lends itself well to modular and/or object-oriented program design paradigms.

Figure 1:
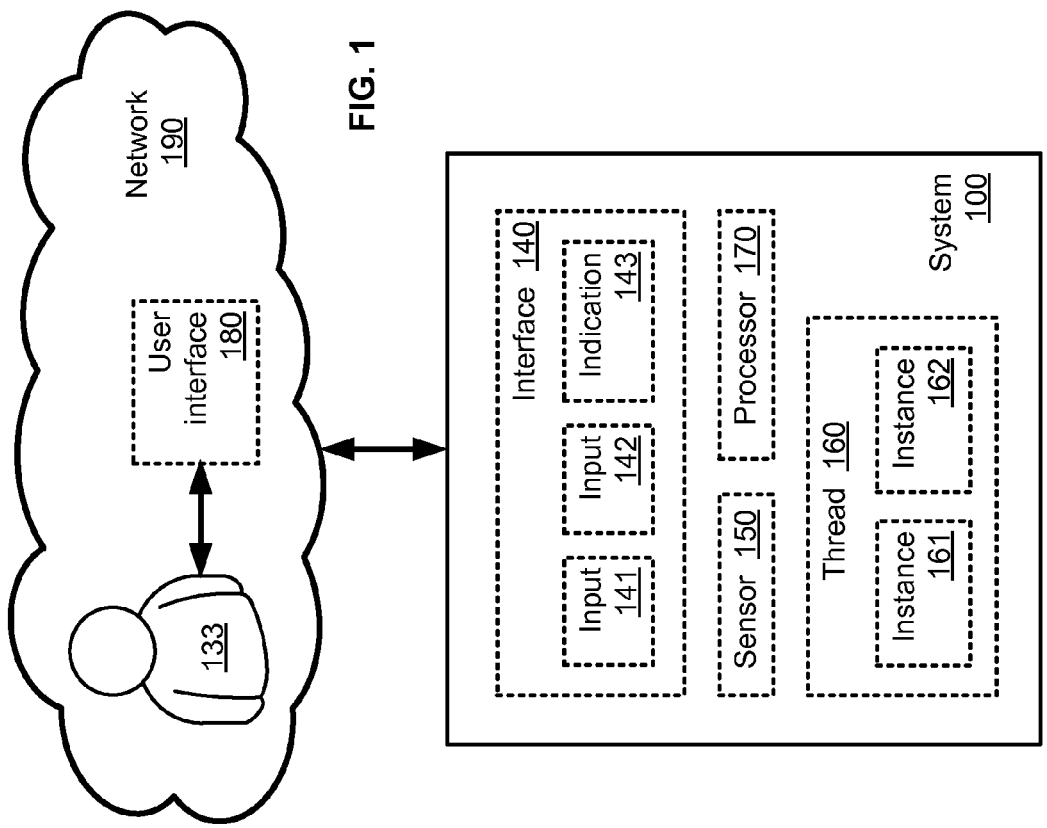
FIG. 1 depicts an exemplary environment in which one or more technologies may be implemented.

With reference now to FIG. 1, shown is an example of a system that may serve as a context for introducing one or more processes and/or devices described herein. As shown system 100 is operable to communicate with network 190, which can include user interface 180 accessible to user 133. System 100 can include one or more instances of interfaces 140, sensors 150, processors 170, or threads 160. Interface 140 can, optionally and at various times, handle one or more of input 141, input 142, or warning 143. Thread 160 can likewise include instances 161, 162 as described below. (In some embodiments, a thread, sequence, application, session, or similar object can have two or more "instances" that are functionally identical but may have differences in instance identity, progress status, location, set membership, policy context, or the like.)

With reference now to FIG. 2, there is shown a high-level logic flow 200 of an operational process. Flow 200 includes operation 220—obtaining a software flaw indication resulting from an emulation of a first instance of a thread at least partly in response to a first input from a user interface (e.g. sensor 150 generating an indication 143 of an error or the like from instance 161 of thread 160 being executed by emulation under external control). The emulation itself can be in response to received input 141 resulting, in some instances, from a task request or the like originating at user interface 180. The software flaw indication can take any of many forms, and can optionally include other information such as an event type or time.

Flow 200 further includes operation 280—manipulating a second instance of the thread at least partly in response to a second input arriving from the user interface after beginning the emulation of the first instance of the thread (e.g. processor 170 creating, switching to, deleting, or otherwise acting upon another instance 162 of thread 160 in response to input 142). In some embodiments, for example, input 142 can be received as user data that user interface 180 merely transmits to interface 140. (In some embodiments, an item selection or other decision can occur "in response to" one or more of a prior or contemporaneous measurement, decision, transition, circumstance, or other determinant. Any such decision may likewise depend upon one or more other prior, contemporaneous, or potential determinants, in various implementations as taught herein.) Further examples are provided below, particularly in descriptions relating to FIGS. 33-35.

With reference now to FIG. 3, shown is an example of a system that may serve as a context for introducing one or more processes and/or devices described herein. As shown primary system 330 can be accessible to user 333 via (optional) user interface 380, and is operatively coupled with remote system 360. Remote system 360 can include one or more of hosting module 310, feedback module 370, or access module 390. Hosting module 310 can include one or more of emulator 311, operating system 320, service 340, or instances 341, 342 thereof. Hosting module 310 can be coupled with (at least operating system 320 of) remote system 360 via data flow 335 in either or both directions.

With reference now to FIG. 4, there is shown a high-level logic flow 400 of an operational process. Flow 400 includes operation 430—indicating a virtually instantiated service via a data flow between a user interface and an operating system, the virtually instantiated service including at least a virtual instance (e.g. feedback module 370 indicating service 340 via flow 335 between operating system 320 and user interface 380). Emulator 311 can emulate (virtual) instance 341 of service 340, for example.

Flow 400 further includes operation 440—accessing another instance of the virtually instantiated service at least partly in response to the user interface after indicating the virtually instantiated service via the data flow between the user interface and the operating system (e.g. access module 390 accessing another instance 342 of service 340 in response to user interface 380 after performing operation 440 at least partially, for example). Such access can occur in response to a message flow to user interface 380, for example, in response to a command flow from user 333, or in response to some later event enabled by such flow. In some variants, one or more of the instances 341, 342 can reside in primary system 330 or otherwise local to user 333, especially in a network embodiment in which the service is distributed. Further examples are provided below, particularly in descriptions relating to FIGS. 33-35.

Figure 5:
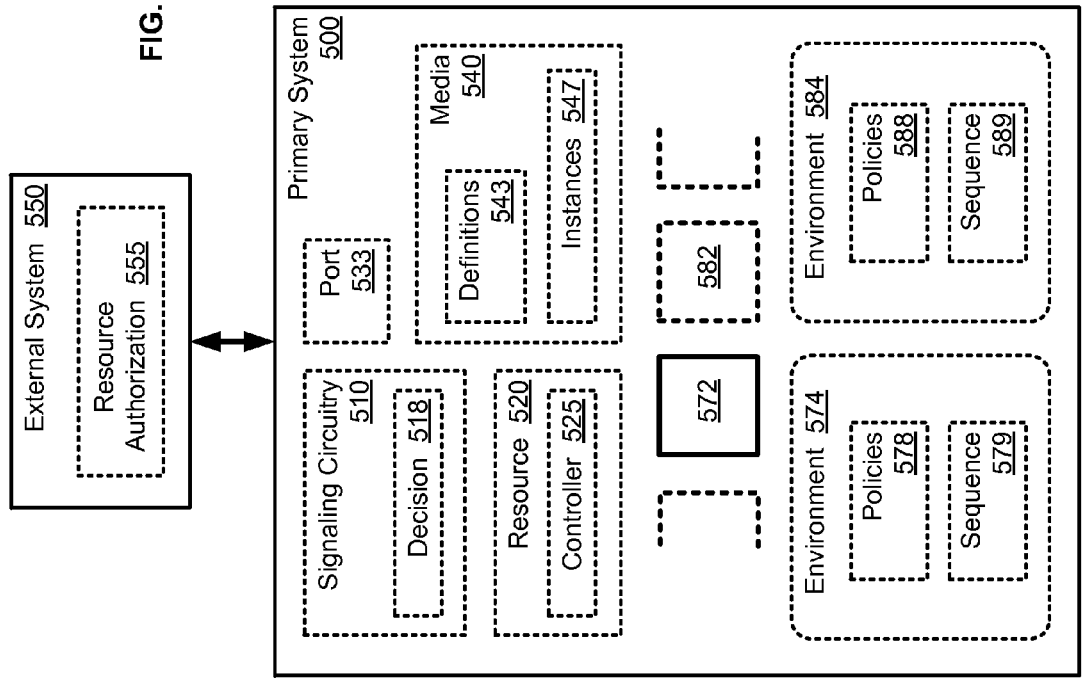
FIG. 5 depicts an exemplary environment in which one or more technologies may be implemented.

With reference now to FIG. 5, shown is an example of a system that may serve as a context for introducing one or more processes and/or devices described herein. As shown primary system 500 includes processor 572 and can include one or more of additional processor(s) 582, environments 574, 584, media 540, or port 533. Primary system 500 can likewise obtain one or more of controller 525 (e.g. within resource 520) or decision 518 (e.g. within signaling circuitry 510). Media 540 can include one or more definitions 543 or instances 547. Primary system 500 can be linked to one or more external system 550, which can be configured to obtain resource authorization 555 such as is described below. Environment 574 can include one or more of policies 578 or sequence(s) 579, and environment 584 can likewise include one or more of policies 588 or sequence(s) 589.

In some embodiments, an "environment" can include one or more primary hardware elements (e.g. a processor or its working space) and one or more primary software elements (e.g. a library module or other instruction sequences). An environment can contain other environments as components, some or all of which may be implemented virtually or physically, in some embodiments. Alternatively or additionally, some or all such components may be duplicated or otherwise adaptively spawned to implement embodiments as described herein.

Figure 6:
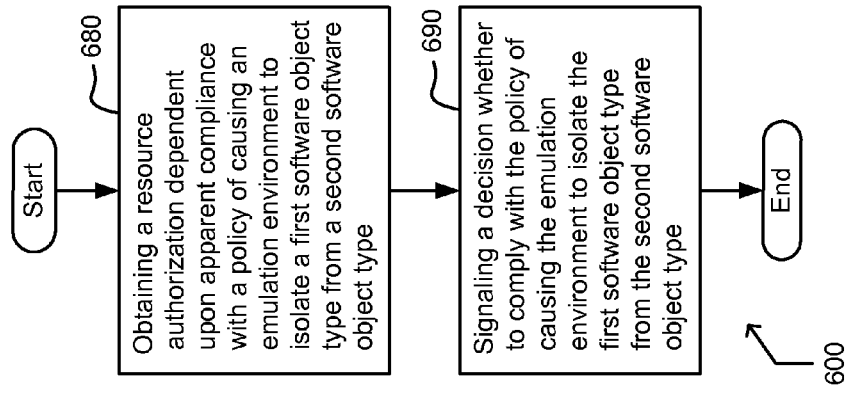
FIG. 6 depicts a high-level logic flow of an operational process.

With reference now to FIG. 6, there is shown a high-level logic flow 600 of an operational process. Flow 600 includes operation 680—obtaining a resource authorization dependent upon apparent compliance with a policy of causing an emulation environment to isolate a first software object type from a second software object type (e.g. port 533 receiving an external resource authorization 555 specifying a conditional access to a resource). Alternatively or additionally, a local access controller 525 can limit access to part or all of a local resource 520 with a similar apparent-compliance-dependent resource authorization—optionally implemented as device-executable code or other instruction sequence. Such access can depend upon one or more of a monitoring system output, a user input, a system-wide policy, or some other manifestation of apparent compliance, for example, with a policy of isolating some types of target software through emulation. The software object types can be defined by one or more definitions 543, optionally in a context in which media 540 contain one or more instances 547 of each defined type. The isolation mode(s) can function in any of several ways, mutual or otherwise, as described below.

Flow 600 further includes operation 690—signaling a decision whether to comply with the policy of causing the emulation environment to isolate the first software object type from the second software object type (e.g. signaling circuitry 510 signaling decision 518 relating to whether the isolation policy will be used by an emulation environment). In some embodiments, "isolation policies" can be associated selectively with certain resources or resource types, at least partly protecting or constraining them from harmful interactions with other items or each other. Those skilled in the art will recognize a variety of such policies exemplified in these teachings and can readily implement others without undue experimentation. Processor 572 can signal such compliance, for example, by including such a policy in policies 578 of emulation environment 574. A negative decision can likewise be signaled by noncompliance, a failure to include any such policy, by routing the policy or resource authorization to another environment, or the like. In some variants, one or more other processors 582 are configured for one or more of monitoring processor 572, implementing an isolation policy, generating the decision whether to comply with the policy, or the like. Further examples are provided below, particularly in descriptions relating to FIGS. 36-38.

Figure 7:
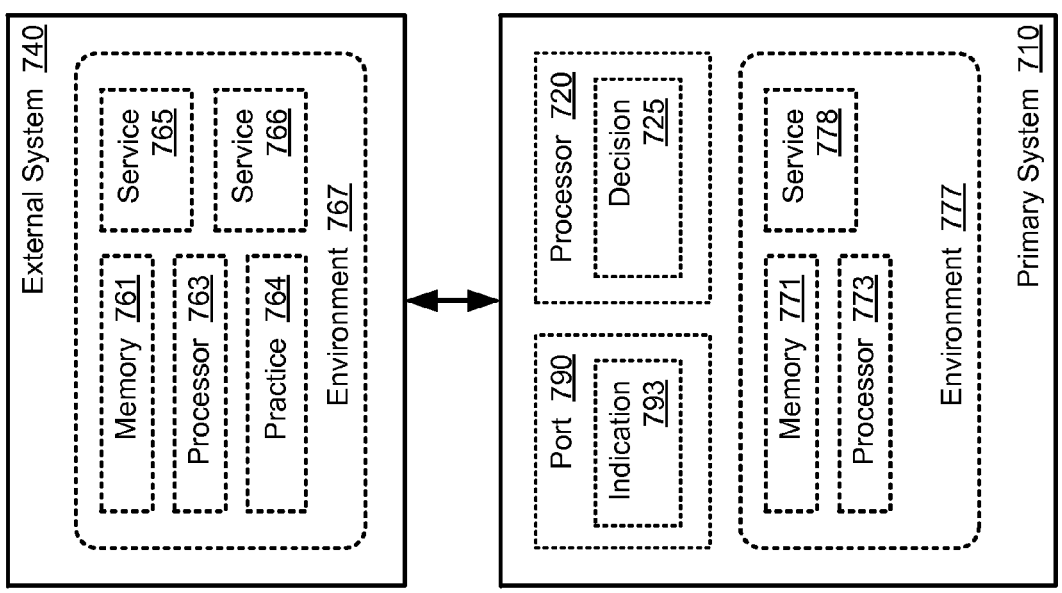
FIG. 7 depicts an exemplary environment in which one or more technologies may be implemented.

With reference now to FIG. 7, shown is an example of a system that may serve as a context for introducing one or more processes and/or devices described herein. As shown primary system 710 can include one or more instances of indications 793 (at port 790, e.g.), decisions 725 (at processor 720, e.g.), memories 771, processors 773, or services 778 (of environment 777, e.g.). As shown, primary system 710 is operatively coupled to at least external system 740, which can include environment 767 with one or more of memory 761, processor 763, practice 764, service 765, or service 766.

Figure 8:
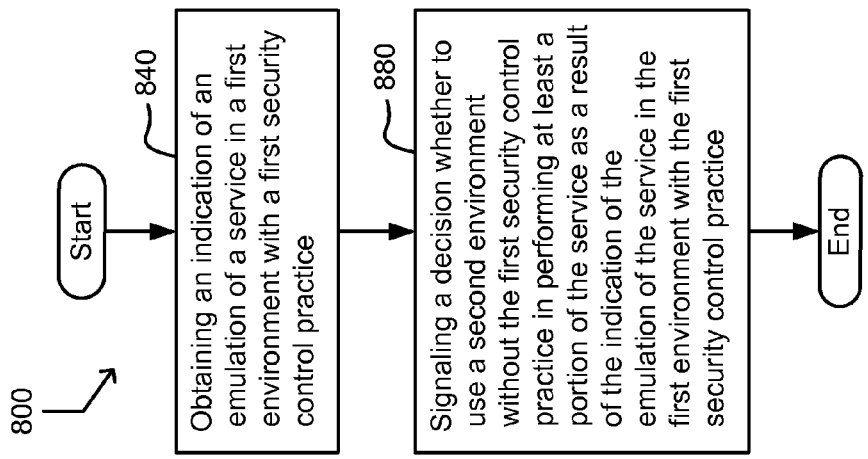
FIG. 8 depicts a high-level logic flow of an operational process.

With reference now to FIG. 8, there is shown a high-level logic flow 800 of an operational process. Flow 800 includes operation 840—obtaining an indication of an emulation of a service in a first environment with a first security control practice (e.g. port 790 receiving indication 793 of services 765, 766 executing in emulation environment 767 at least with security control practice 764). In some embodiments, a "security control practice" can include any data handling, resource control, authorization or other physical or emulated protocols of an environment that helps assure the integrity of data, instructions, or behaviors of software objects functioning normally within the environment. Practice 764 may preclude certain transactions or limit permissible activities of virtual processor 763 or with virtual memory 761, for example. (In some embodiments, a thing's "emulation" can refer to the thing emulating or being emulated as an occurrence, manner, efficiency, outcome, etc.)

Flow 800 further includes operation 880—signaling a decision whether to use a second environment without the first security control practice in performing at least a portion of the service as a result of the indication of the emulation of the service in the first environment with the first security control practice (e.g. processor 720 acting upon or transmitting decision 725 to perform one or more services 765, 766 without security control practice 764). In some embodiments, deciding whether to take an action "as a result of" one or more determinants can result in the action, or in no action, depending upon the determinant(s). Alternatively or additionally, such a decision can result in a provisional, final, or hybrid resolution for later uses: implementation, confirmation, transmission, recordation, analysis or the like.

In various embodiments, the decision can specify one or more of which service(s) to perform, which portion(s) to perform, which environment(s) to use, which practice(s) to use, whether or when to proceed with a specific configuration, what other conditions might warrant a delay, or the like. In some variants, an affirmative decision may be warranted by the emulation encountering one or more of (a) a substantial performance loss or other cost apparently resulting from implementing the practice; (b) a problem that the practice does not solve; (c) an opportunity to substitute an upgraded practice; or the like. For example, such emulations can reflect an apparent or nominal incompatibility between the practice and an element in the second environment: service 766 may be incompatible with a type of memory 771, processor 773, or service 778 in the "second" environment 777 under consideration. Further examples are provided below, particularly in descriptions relating to FIGS. 39-41.

Figure 9:
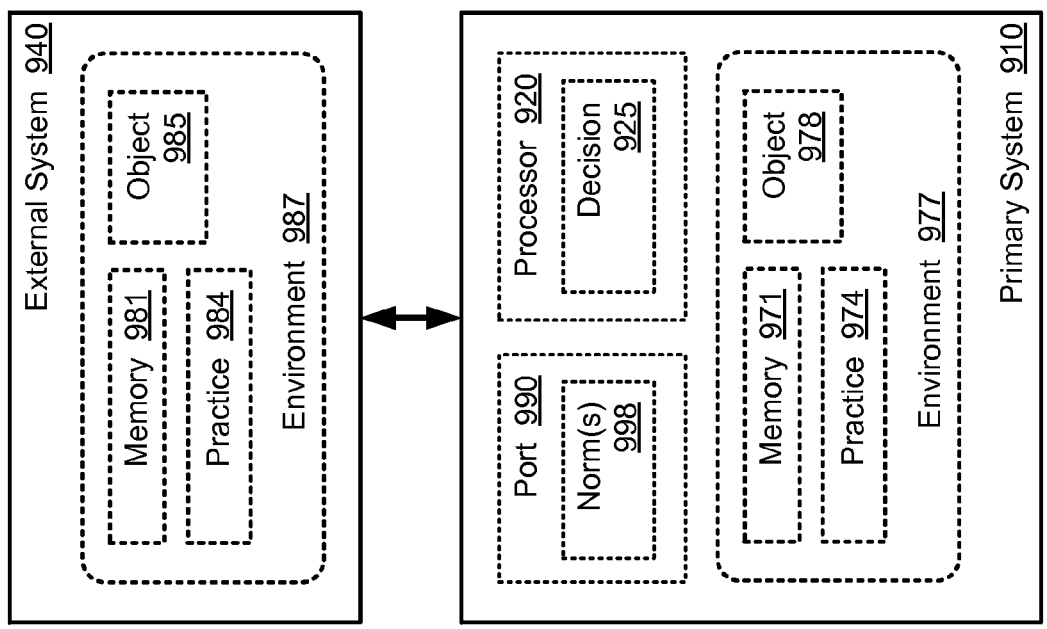
FIG. 9 depicts an exemplary environment in which one or more technologies may be implemented.

With reference now to FIG. 9, shown is an example of a system that may serve as a context for introducing one or more processes and/or devices described herein. As shown primary system 910 can include one or more instances of norm(s) 998 (at port 990, e.g.), decisions 925 (at processor 920, e.g.), memories 971, practices 974, or other objects 978 (of environment 977, e.g.). As shown, primary system 910 is operatively coupled to at least external system 940, which can include one or more environment 987 each with one or more of memory 981, practice 984, or other object(s) 985.

Figure 10:
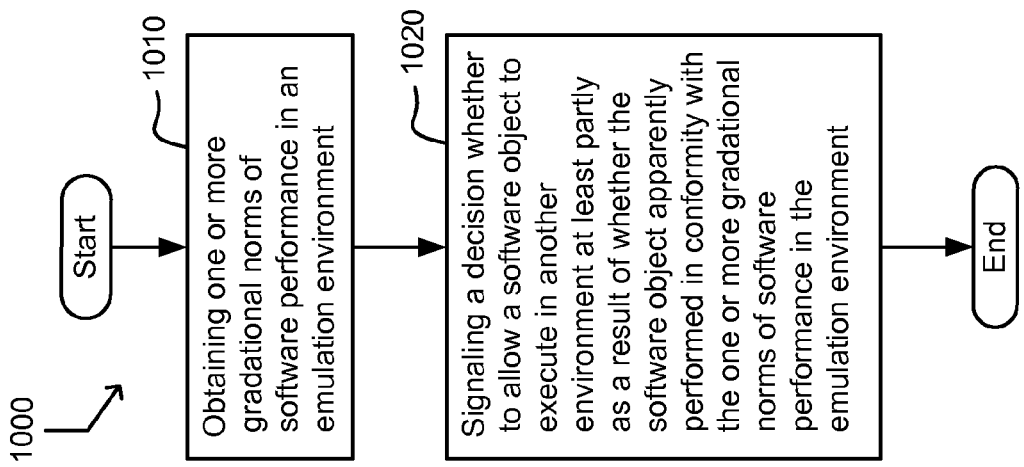
FIG. 10 depicts a high-level logic flow of an operational process.

With reference now to FIG. 10, there is shown a high-level logic flow 1000 of an operational process. Flow 1000 includes operation 1010—obtaining one or more gradational norms of software performance in an emulation environment (e.g. port 990 receiving one or more software performance range limits, physical measurements, or other norm(s) 998 from environment 987 of external system 940). In some embodiments, a "gradational norm" of performance can include one or more instances of performance metrics or other quotas, output ranges, resource usage levels, completion times, performance trends, complaints or error frequencies, success ratios, analog voltages, or the like in association with some software configuration or other object. Alternatively or additionally, gradational norms can include one or more ranges or thresholds against which an observed quantity can be compared. Such norms can be established by setting thresholds against which an emulator or evaluation module, for example, can compare a performance metric. (The results of such comparisons, or other Boolean-type outcome values, can likewise be provided at operation 1010 and can affect the decision of operation 1020, in some embodiments.)

Flow 1000 further includes operation 1020—signaling a decision whether to allow a software object to execute in another environment at least partly as a result of whether the software object apparently performed in conformity with the one or more gradational norms of software performance in the emulation environment (e.g. processor 920 signaling a decision 925 not to accept or not to execute object 985 in environment 977 of primary system 910 based on an apparent failure of object 985 to meet a minimum or maximum threshold in environment 977. This can occur, for example, in embodiments in which environment 977 is "the" emulation environment of operation 1010 and in which environment 987 comprises the "other" environment(s) of operation 1020. Alternatively or additionally, processor 920 can be configured to perform flow 1000 by deciding whether to transmit or authorize object 978 for use in environment 987 at least partly as a result of whether object 978 apparently performed in conformity with the norm(s) while emulated in environment 977. In some variants, the gradational norm(s) can likewise be derived or otherwise obtained by a validation system to ensure compliance with a performance requirement of a target system (e.g. external system 940). Further examples are provided below, particularly in descriptions relating to FIGS. 39-41.

Figure 11:
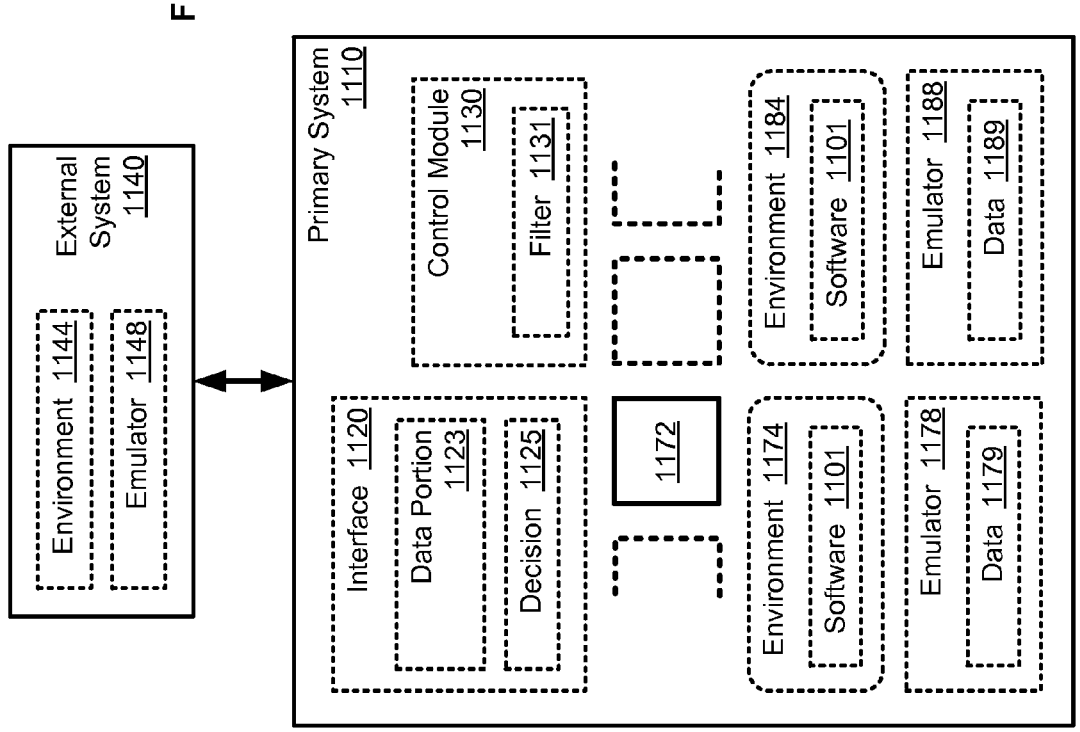
FIG. 11 depicts an exemplary environment in which one or more technologies may be implemented.

With reference now to FIG. 11, shown is an example of a system that may serve as a context for introducing one or more processes and/or devices described herein. As shown primary system 1110 includes processor 1172 and can include one or more instances of interfaces 1120, control modules 1130, environments 1174, 1184 (optionally containing respective instances of software 1101), or data 1179, 1189 (optionally of respective emulators 1178, 1188, e.g., as shown). Interface 1120 can, in some circumstances, obtain or otherwise provide for one or more of data portion 1123 or decision 1125. Control module 1130 can likewise optionally contain filter 1131. As shown primary system 1110 is (directly or indirectly) operatively coupled with external system 1140, within which one or more of environment 1144 or emulator 1148 can reside and operate as described below.

Figure 12:
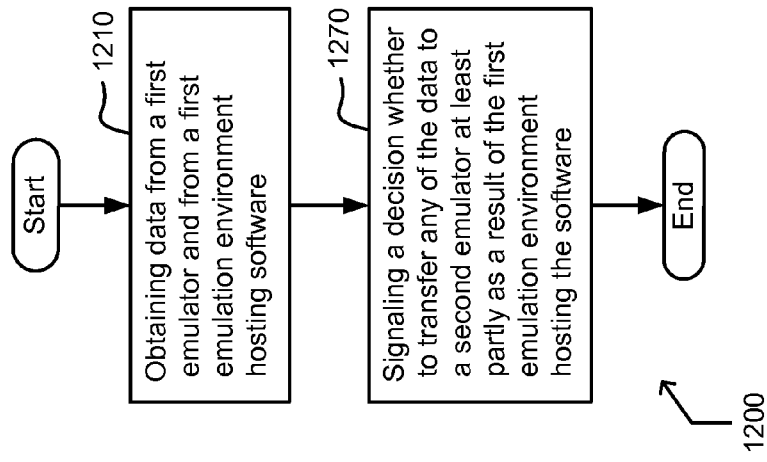
FIG. 12 depicts a high-level logic flow of an operational process.

With reference now to FIG. 12, there is shown a high-level logic flow 1200 of an operational process. Flow 1200 includes operation 1210—obtaining data from a first emulator and from a first emulation environment hosting software (e.g. filter 1131 obtaining data 1189 from emulator 1188 and from emulation environment 1184 hosting a program module or some other software 1101). Filter 1131 or other parts of control module 1130 can use this information effectively to distill data portion 1123 or decision 1125 as described herein, such as by presenting intermediate or final emulation data for a user to decide whether to proceed with a debugging effort, a process characterization, or the like.

Flow 1200 further includes operation 1270—signaling a decision whether to transfer any of the data to a second emulator at least partly as a result of the first emulation environment hosting the software (e.g. interface 1120 manifesting such a decision 1125 by sending at least some data 1189 originally from emulation environment 1184 hosting software 1101 to emulator 1148 or emulator 1178). This information can be useful, for example, in a circumstance in which the data is received by an emulator that has executed or might execute the same software: emulator 1178 executing software 1101 in environment 1174, for example. Further examples are provided below, particularly in descriptions relating to FIGS. 42-44.

Figure 13:
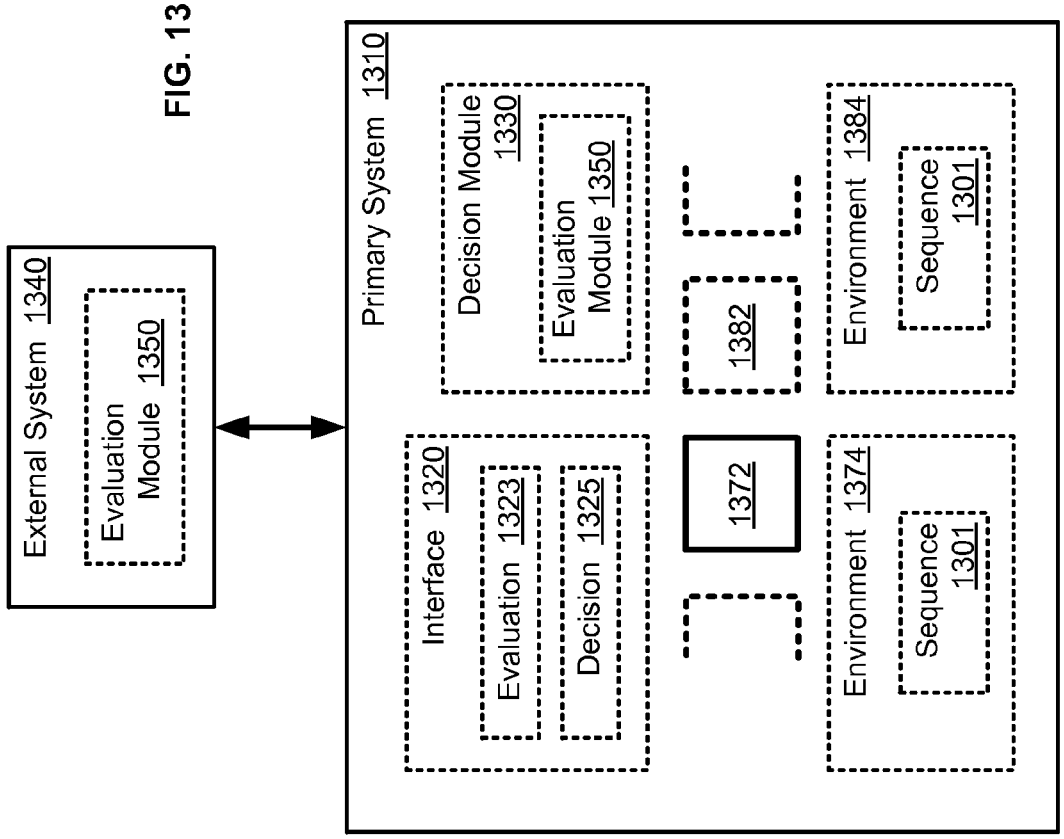
FIG. 13 depicts an exemplary environment in which one or more technologies may be implemented.

With reference now to FIG. 13, shown is an example of a system that may serve as a context for introducing one or more processes and/or devices described herein. As shown primary system 1310 is operatively coupled with external system 1340. Primary system 1310 includes processor 1372, and can include one or more of interface 1320, decision module 1330, processor 1382, environment 1374, or environment 1384. Interface 1320 can optionally handle one or more of evaluation 1323 or decision 1325 as described below. Decision module 1330 or external system 1340 can each (optionally) include one or more instances of evaluation modules 1350. Environment 1374 can include one or more instances of instruction sequence 1301, as can environment 1384.

Figure 14:
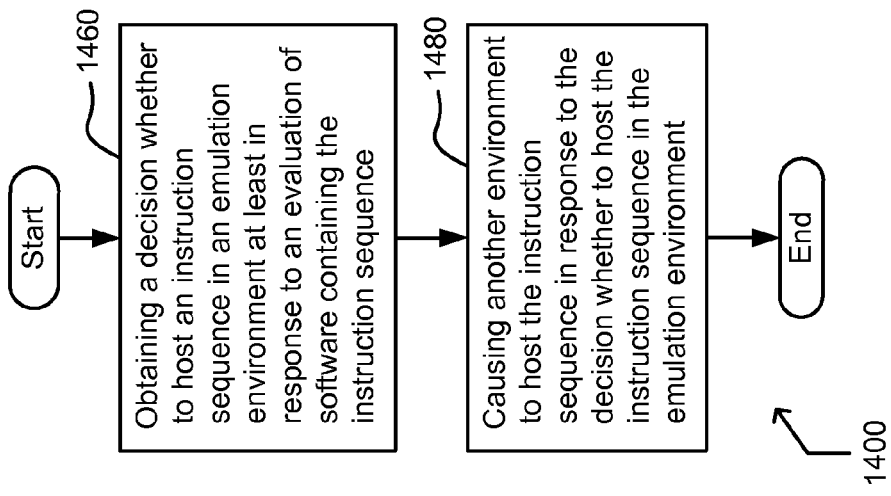
FIG. 14 depicts a high-level logic flow of an operational process.

With reference now to FIG. 14, there is shown a high-level logic flow 1400 of an operational process. Flow 1400 includes operation 1460—obtaining a decision whether to host an instruction sequence in an emulation environment at least in response to an evaluation of software containing the instruction sequence (e.g. decision module 1330 deciding that environment 1374 will host instruction sequence 1301 in response to an evaluation from evaluation module 1350 of at least sequence 1301). Alternatively, in some embodiments, interface 1320 can perform operation 1460 by receiving decision 1325 externally (e.g. from external system 1340).

In some embodiments, "evaluations" of software can include one or more of a count of the errors detected within a nominal trial period, a mean time between failures, an empirically determined probability of a specific fault type, or any other quantity substantially correlating with such fault rate indicators. (Variables correlate "substantially" if a correlation coefficient between them has a magnitude of at least about 0.4, in some embodiments herein.) Alternatively or additionally, modes of obtaining software evaluations from third parties or the like are widely available and generally suitable for use with teachings herein without undue experimentation. See, e.g., U.S. Pat. No. 7,065,680 ("Method and a System for Evaluating the Reliability of a Program in an Electronic Device, and an Electronic Device") filed 17 Jun. 2003. Those skilled in the art can recognize a great variety of workable variants of these modes using ordinary offsets, exponentiations, combinations of these, hybrid indices or the like, readily in light of these teachings.

Flow 1400 further includes operation 1480—causing another environment to host the instruction sequence in response to the decision whether to host the instruction sequence in the emulation environment (e.g. processor 1372 causing environment 1384 to host at least sequence 1301 in response to decision 1325 or decision module 1330). In various embodiments described herein, environment 1384 can include one or more contained environments any of which can optionally be configured for emulation or for partly or fully native execution of sequence 1301 (e.g. by processor 1382). Further examples are provided below, particularly in descriptions relating to FIGS. 45-47.

Figure 15:
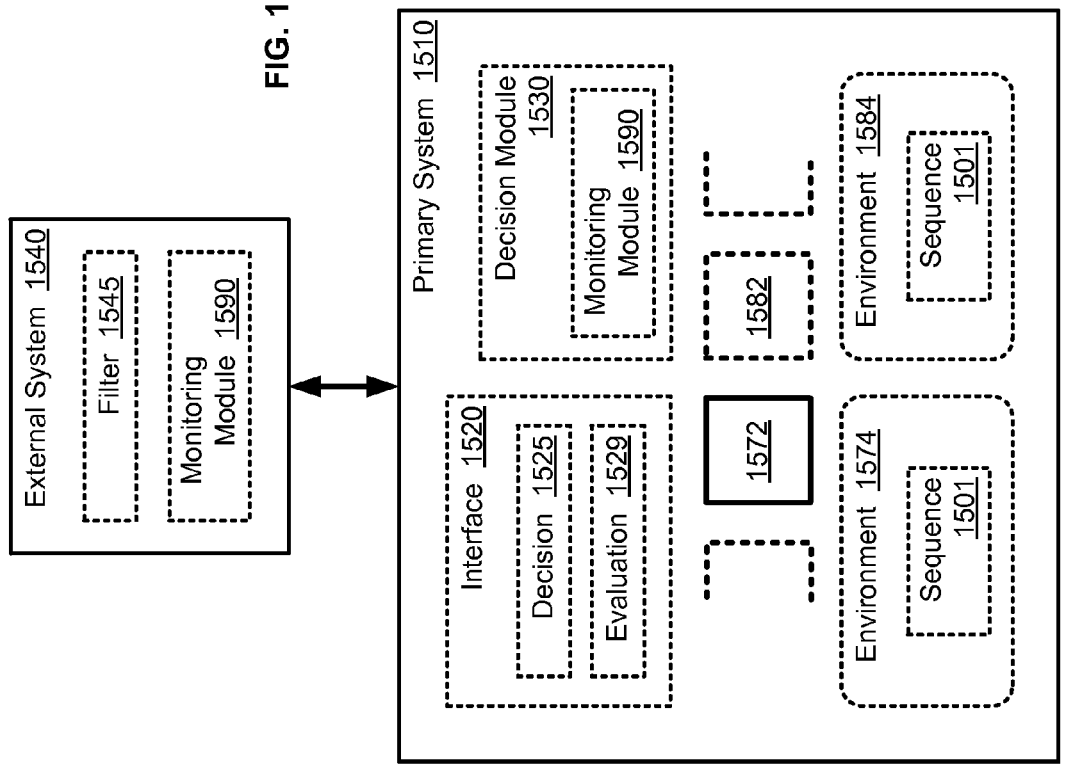
FIG. 15 depicts an exemplary environment in which one or more technologies may be implemented.

With reference now to FIG. 15, shown is an example of a system that may serve as a context for introducing one or more processes and/or devices described herein. As shown primary system 1510 is operatively coupled with external system 1540. External system 1540 can (optionally) include one or more of filter 1545 or monitoring module 1590. Primary system 1510 includes processor 1572, and can include one or more of interface 1520, decision module 1530, processor 1582, environment 1574, or environment 1584. Interface 1520 can optionally handle one or more of decision 1525 or evaluation 1529 as described below. Decision module can optionally include monitoring module 1590. Environment 1574 can likewise include one or more instances of instruction sequence 1501, as can environment 1584.

Figure 16:
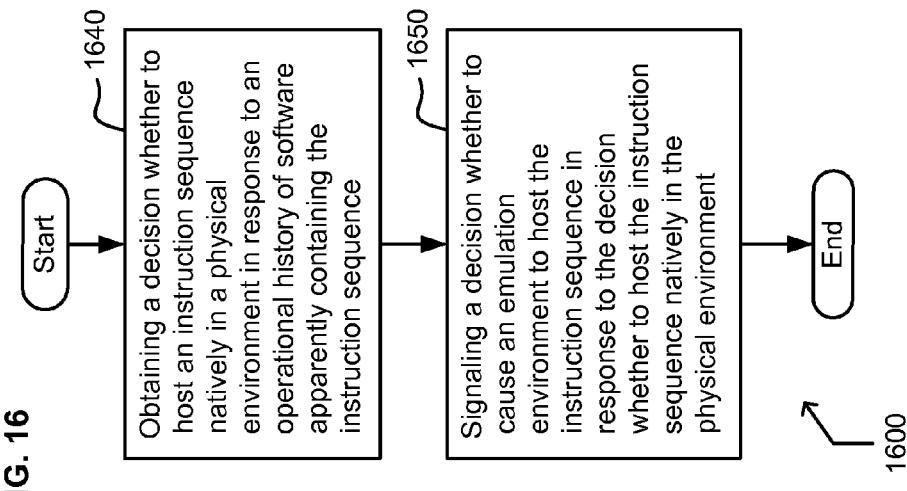
FIG. 16 depicts a high-level logic flow of an operational process.

With reference now to FIG. 16, there is shown a high-level logic flow 1600 of an operational process. Flow 1600 includes operation 1640—obtaining a decision whether to host an instruction sequence natively in a physical environment in response to an operational history of software apparently containing the instruction sequence (e.g. decision module 1530 deciding that environment 1584 will host at least instruction sequence 1501 natively in response to an event series relating at least partly to sequence 1501 signaled from a monitoring module 1590). In some variants, for example, the decision can depend on whether the operational history exists or whether any part of it pertains to the sequence or software. Alternatively or additionally, in some embodiments, interface 1520 can perform operation 1640 by receiving decision 1525 externally (e.g. from external system 1540). In some variants, absent a dispositive circumstance arising from a history, the decision can likewise depend on a reputation, a next performance, etc.

Flow 1600 further includes operation 1650—signaling a decision whether to cause an emulation environment to host the instruction sequence in response to the decision whether to host the instruction sequence natively in the physical environment (e.g. processor 1572 implementing or otherwise indicating a decision for environment 1574 to host at least sequence 1501 in response to decision 1525 or decision module 1530). In various embodiments described herein, environment 1574 can include one or more contained environments any of which can optionally be configured for emulation or for partly or fully native execution of sequence 1501 (e.g. by other processor 1582). Further examples are provided below, particularly in descriptions relating to FIGS. 45-47.

Figure 17:
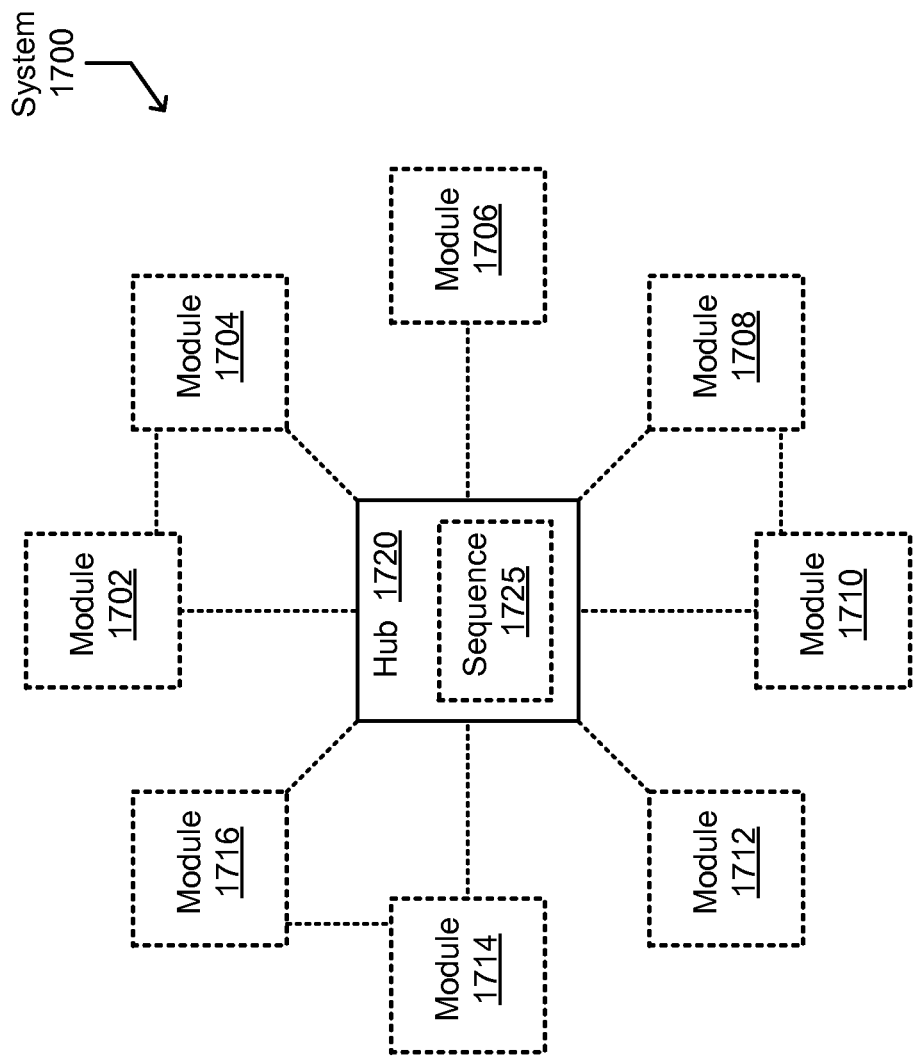
FIGS. 17-32 depict other exemplary environments in each of which one or more technologies may be implemented.

With reference now to FIG. 17, shown is an example of a system that may serve as a context for introducing one or more processes and/or devices described herein. As shown system 1700 includes hub 1720 (optionally operable to host sequence 1725 as described in one or more flows herein and) coupled with one or more instances of modules 1702, 1704, 1706, 1708, 1710, 1712, 1714, or 1716 as shown. In some variants, modules 1702, 1704 can be mutually coupled directly, as shown. Alternatively or additionally, modules 1708, 1710 can likewise be coupled directly with one another, as can modules 1714, 1716. In many contexts, system 1700 can be implemented as one or more computer networks or entirely onto a single common substrate such as a semiconductor chip. Moreover, in many combinations described below, items in hub 1720 can be configured to interact with, include, or otherwise relate to at least one single common emulation (of sequence 1725, e.g.) therein, for example. System 1700, as described below, can include configurations for combining some or all of flows 200, 400, 600, 800, 1000, 1200, 1400 above.

Figure 18:
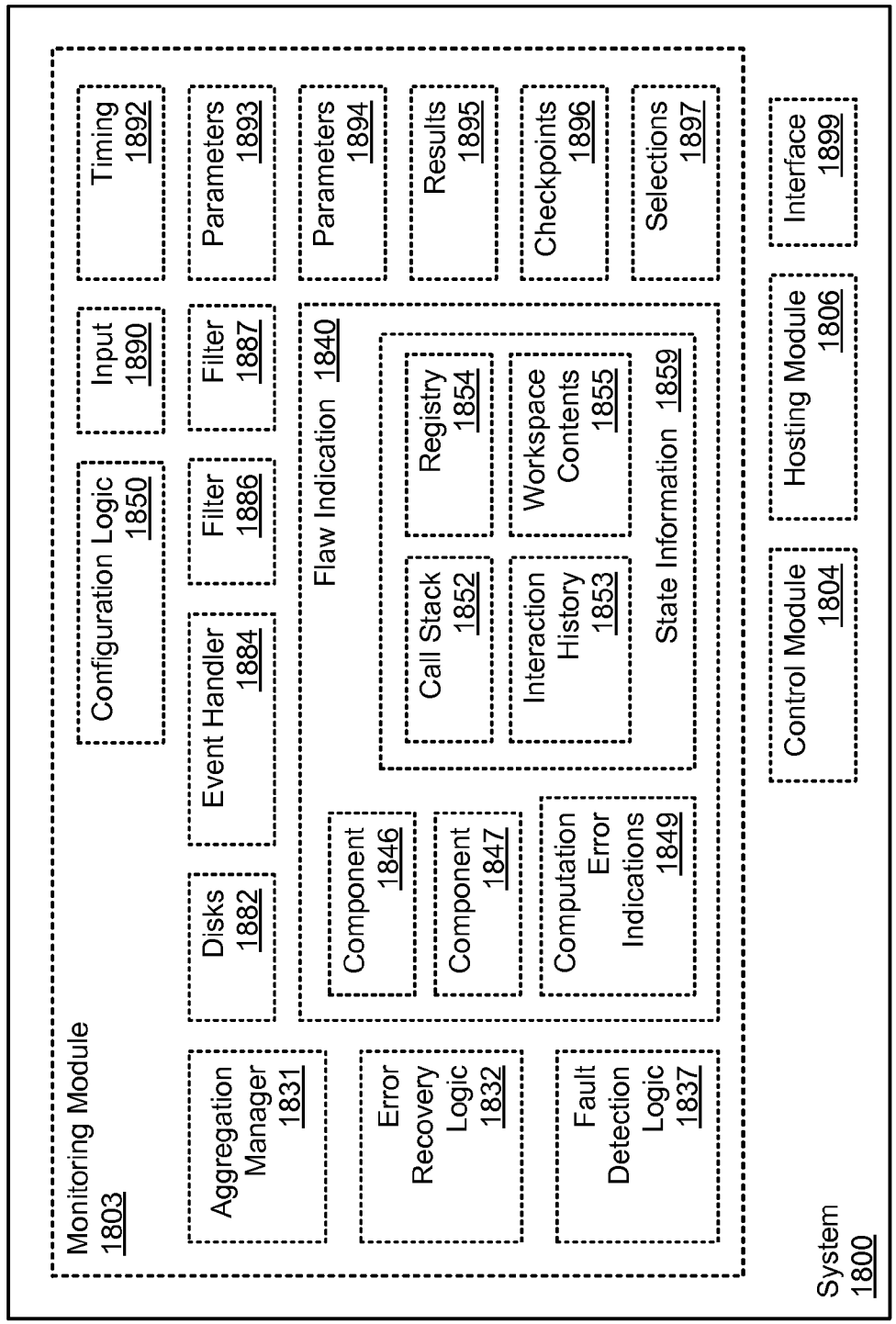

With reference now to FIG. 18, shown is an example of a system that may serve as a context for introducing one or more processes and/or devices described herein. As shown system 1800 can include one or more instances of monitoring modules 1803, control modules 1804, hosting modules 1806, or interfaces 1899. Monitoring module 1803 can include one or more of aggregation manage 1831, error recovery logic 1832, fault detection logic 1837, flaw indication 1840, configuration logic 1850, disks 1882, event handler 1884, filter 1886, filter 1887, input 1890, timing 1892, parameters 1893, 1894, results 1895, checkpoints 1896, selections 1897, or the like. Flaw indication 1840 can include one or more of components 1846, 1847, computation error indications 1849, call stack 1852, interaction history 1853, registry 1854, workspace contents 1855, other state information 1859, or the like. In some embodiments, "state information" can include action sequences, transient or stable variable values, conditional determinations, storage configurations, data aggregations, emulation environment changes, execution outcomes or the like.

Some varieties of system 1800 can be implemented, for example, in system 100 or network 190 of FIG. 1, in module 1702 or hub 1720 of FIG. 17, or as a stand-alone system. In some implementations, differently-configured instances of system 1800 can likewise operate cooperatively. If system 1700 is configured with hub 1720 and module 1702 each implementing an instance of system 1800, for example, monitoring module 1803 can optionally reside entirely within hub 1720 and operate cooperatively with an external instance of control module 1804 or hosting module 1806 resident in module 1702. In such a case the external instance(s) of system 1800 can, of course, exclude monitoring module 1803.

Figure 19:
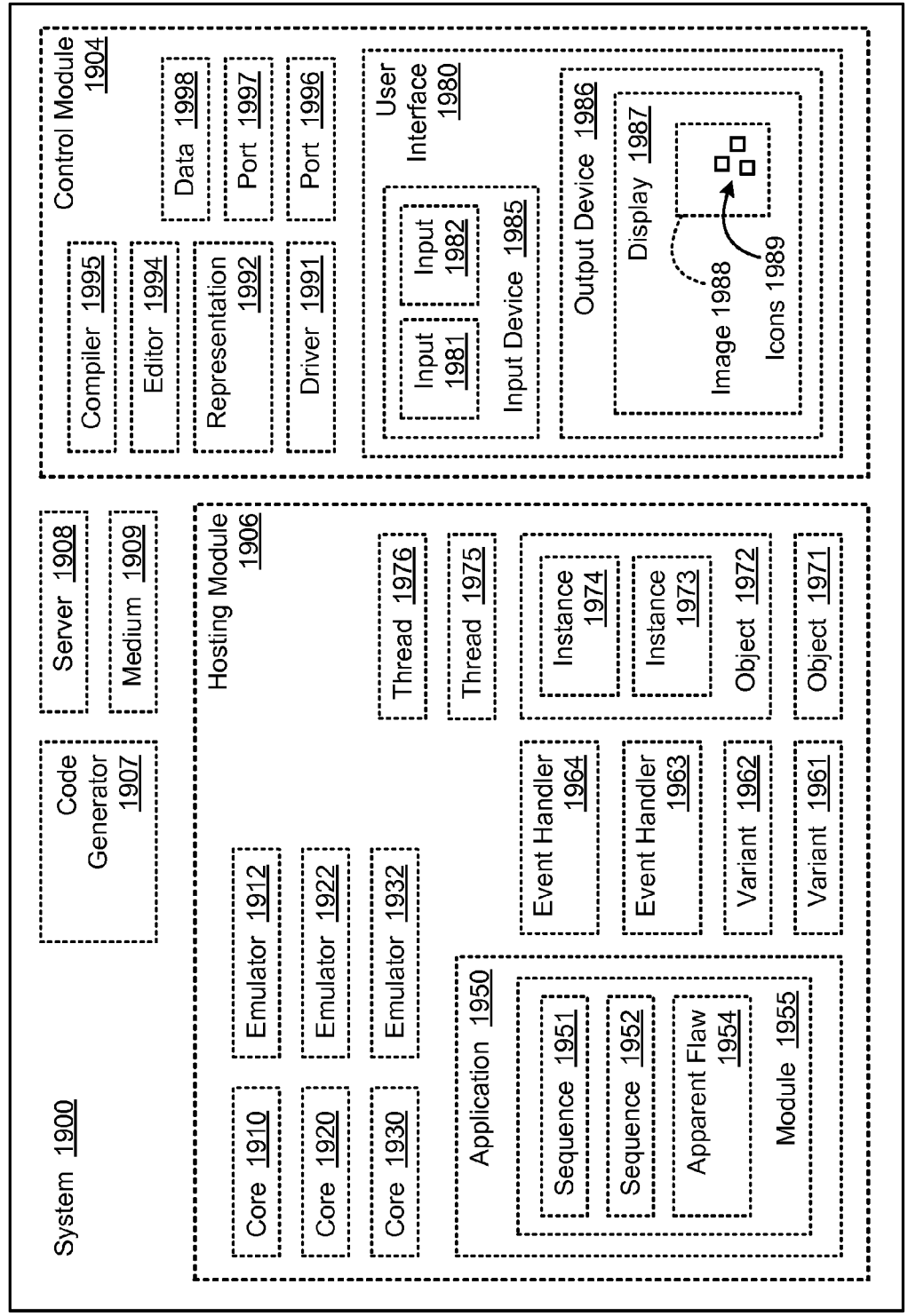

With reference now to FIG. 19, shown is an example of a system that may serve as a context for introducing one or more processes and/or devices described herein. As shown system 1900 can include one or more instances of control modules 1904, hosting modules 1906, code generators 1907, servers 1908, or data-handling media 1909. Code module 1904 can include one or more instances of user interfaces 1980, drivers 1991, representations 1992, editors 1994, compilers 1995, ports 1996, 1997, or data 1998. User interface 1980 can optionally handle inputs 1981, 1982 at input device 1985 or have an output device 1986 in some instances with a display 1987 operable to show at least one image 1988 with one or more icons 1989 as described herein. Hosting module 1906 can include one or more instances of cores 1910, 1920, 1930, emulators 1912, 1922, 1932, module(s) 1955, variants 1961, 1962, event handlers 1963, 1964, objects 1971, 1972, or threads 1975, 1976. Module(s) 1955 can each optionally form a part of application(s) 1950 or can include one or more instruction sequences 1951, 1952 or apparent flaw(s) 1954. In general each object 1972 can have one or more instances 1973, 1974. One or more instances of system 1900 can be implemented, for example, in system 100 or network 190 of FIG. 1, in module 1702 or hub 1720 of FIG. 17, in system 1800 of FIG. 18, or as a stand-alone system.

Figure 20:
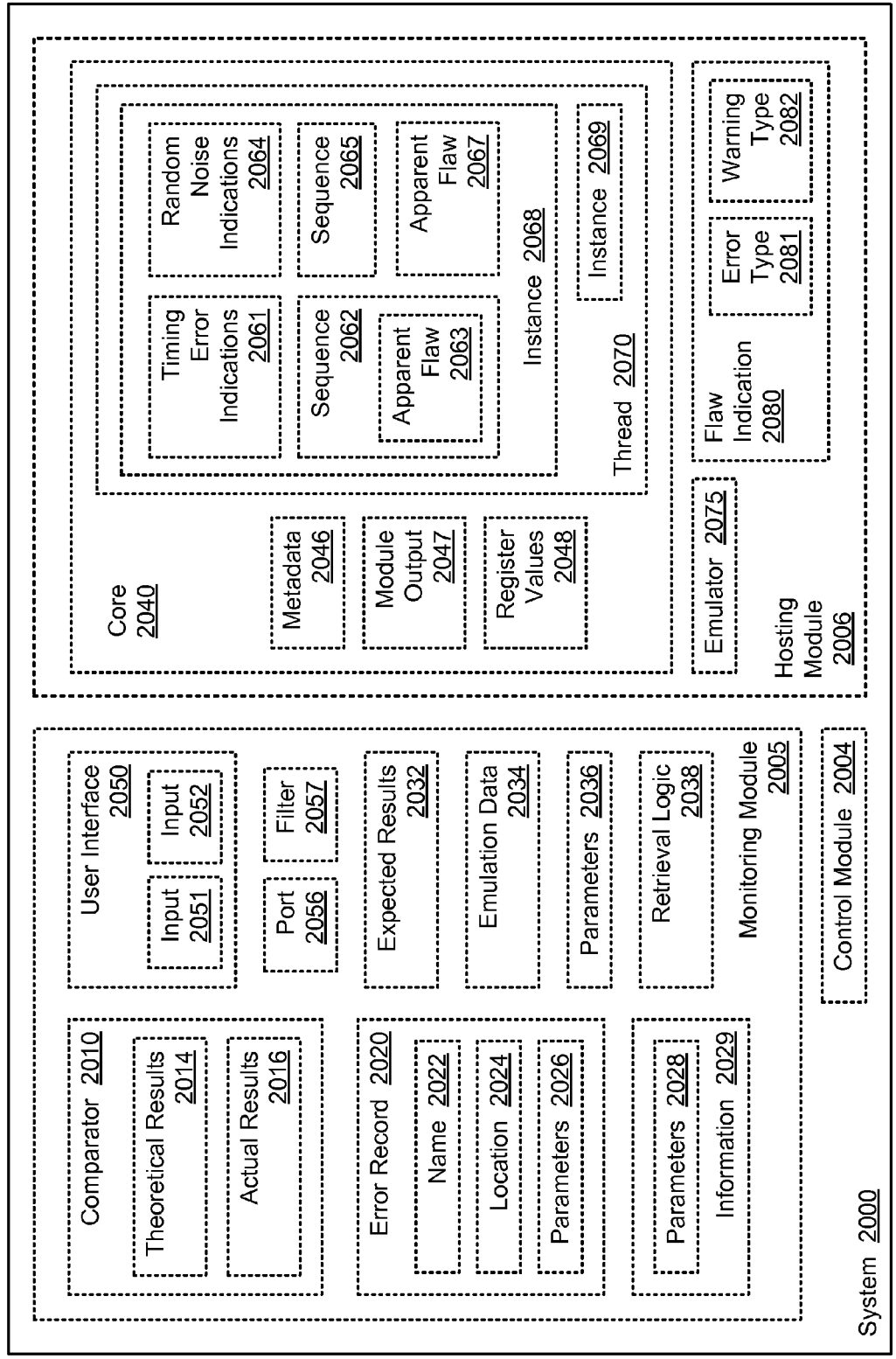

With reference now to FIG. 20, shown is an example of a system that may serve as a context for introducing one or more processes and/or devices described herein. As shown system 2000 can (optionally) include one or more instances of control modules 2004, monitoring modules 2005, or hosting modules 2006. Monitoring module 2005 can include one or more instances of comparators 2010, error records 2020, parameters 2028 and other information 2029, expected results 2032, emulation data 2034, parameters 2036, retrieval logic 2038, inputs 2051, 2052 at user interface 2050 or the like, ports 2056, or filters 2057. Comparator 2010 can include one or more instance of theoretical results 2014, actual results 2016, or the like. Error record 2020 can include one or more instances of names 2022, locations 2024, or other parameters 2026 such as are described herein relating an error type or behavior to an event or service. Hosting module 2006 can include one or more instances of core(s) 2040, emulator(s) 2075, or flaw indication(s) 2080 such as error types 2081, warning types 2082, or the like. Core 2040 can likewise include (at various times as described herein) one or more instances of metadata 2046, module output 2047, register values 2048, or thread(s) 2070. Each such thread can (optionally) include one or more instances of timing error indication 2061, code sequence 2062 (containing apparent flaw 2063 related to error type 2081 or other flaw indication 2080 in some instances), random noise indications 2064, instruction sequence 2065, apparent flaw 2067 (causing warning type 2082 or other flaw indication 2080 in some instances), or the like. Some configurations of system 2000 can be implemented, for example, in system 100 or network 190 of FIG. 1, in module 1702 or hub 1720 of FIG. 17, in system 1900 of FIG. 19, or as a stand-alone system.

Figure 21:
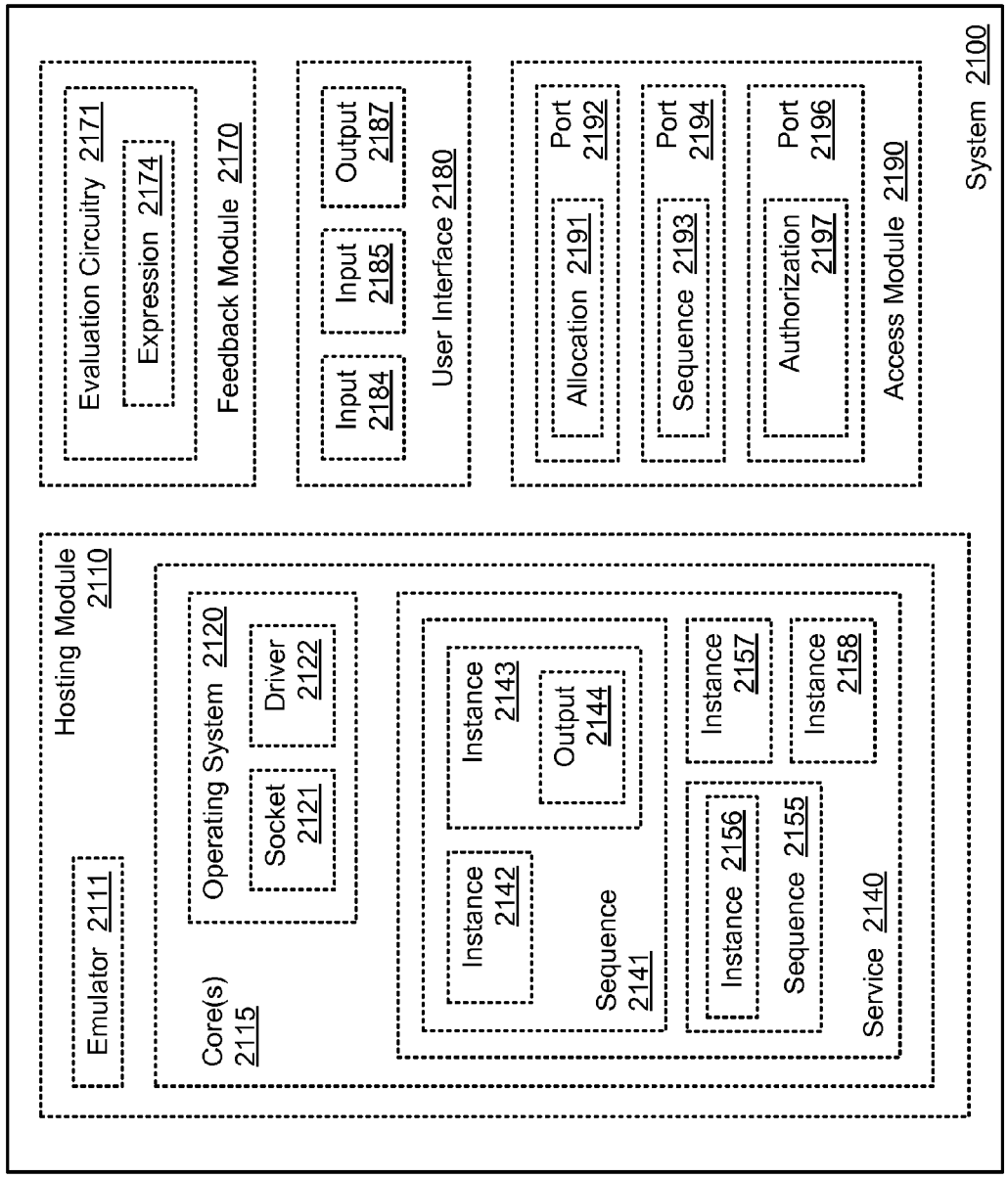

With reference now to FIG. 21, shown is an example of a system that may serve as a context for introducing one or more processes and/or devices described herein. As shown system 2100 can include one or more instances of hosting modules 2110, feedback modules 2170, user interfaces 2180, or access modules 2190. Hosting module 2110 can include one or more instances of emulators 2111 or core(s) 2115, the latter optionally including operating systems 2120 or services 2140. Operating system 2120 can (optionally) include one or more of sockets 2121 or drivers 2122. Service 2140 can likewise include one or more sequences 2141, 2155 or service instances 2156, 2157, 2158. Sequence 2141 can include one or more of instances 2142, 2143, which can optionally obtain instance output 2144 or the like as described below. Feedback module 2170 can include evaluation circuitry 2171, which can optionally generate or otherwise handle expression 2174 as described below. User interface 2180 can handle one or more of inputs 2184, 2185 or output 2187. Access module 2190 can (optionally) include one or more of allocation(s) 2191 at port 2192, sequence(s) 2193 at port 2194, or authorization 2197 at port 2196. Some configurations of system 2100 can be implemented, for example, in primary system 330 or remote system 360 of FIG. 3, in module 1704 or hub 1720 of FIG. 17 (optionally linked directly, through passive media, with module 1702 as described herein), or as a stand-alone system.

Figure 22:
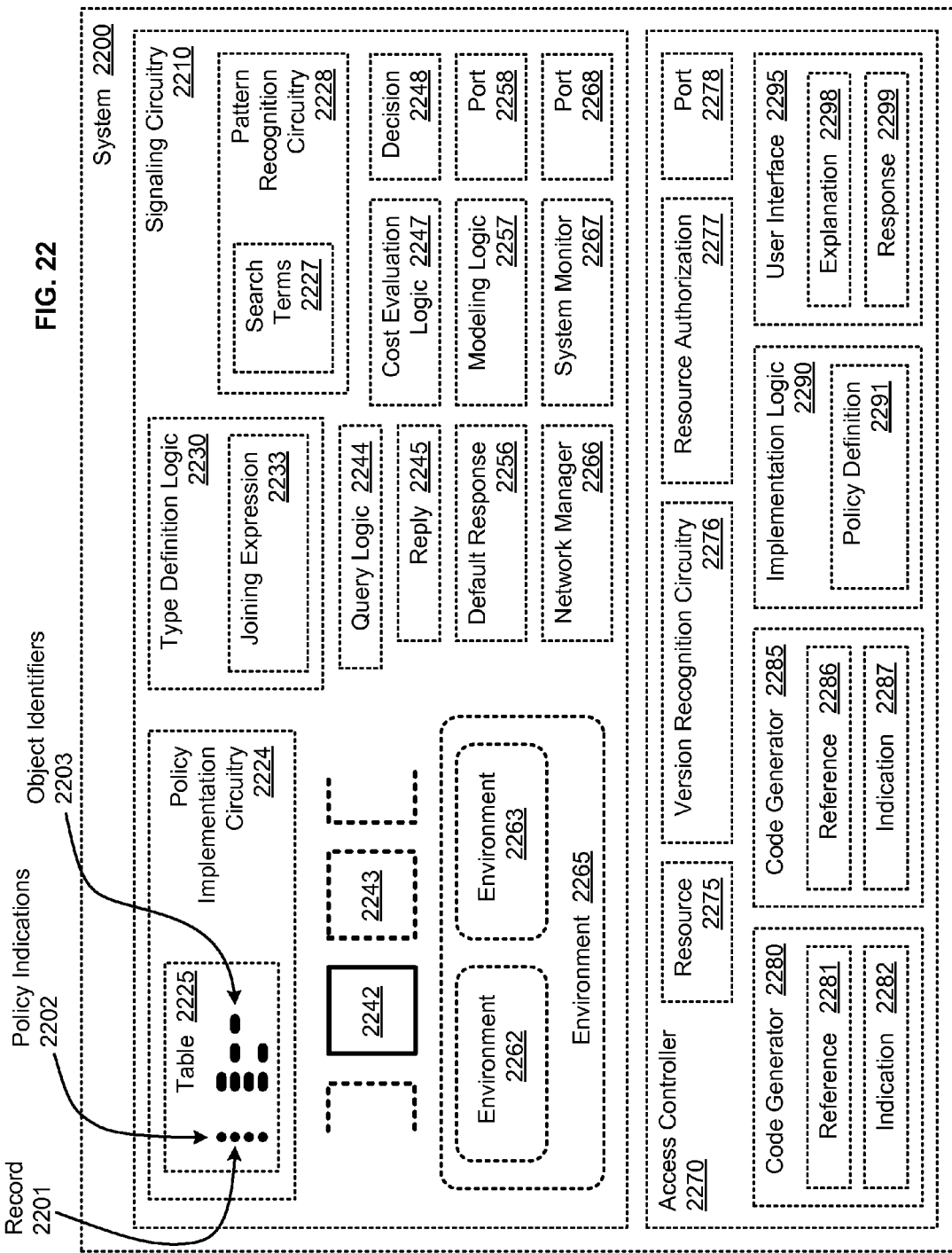

With reference now to FIG. 22, shown is an example of a system that may serve as a context for introducing one or more processes and/or devices described herein. As shown system 2200 can include one or more instances of signaling circuitry 2210 or access controllers 2270. Signaling circuitry 2210 can (optionally) handle or otherwise include one or more instances of tables 2225 or other policy implementation circuitry 2224, search terms 2227 or other pattern recognition circuitry 2228, joining expressions 2233 or other type definition logic 2230, processor(s) 2242, 2243, query logic 2244, replies 2245, cost evaluation logic 2247, decisions 2248, default responses 2256, modeling logic 2257, port(s) 2258, 2268, environments 2262, 2263, 2265, network managers 2266, system monitors 2267, or the like. Table 2225 can include one or more record(s) 2201 each associating one or more policy indications 2202 with one or more identifiers 2203 of variables, sequences, resources, or other objects.

Access controller 2270 can likewise include, at various times in some instances, one or more of resource(s) 2275, version recognition circuitry 2276, resource authorization(s) 2277, port(s) 2278, code generator(s) 2280 (optionally with reference(s) 2281 or indication(s) 2282), code generator(s) 2280 (optionally with reference(s) 2281 or indication(s) 2282), code generator(s) 2285 (optionally with reference(s) 2286 or indication(s) 2287), policy definition(s) 2291 or other implementation logic 2290, user interface 2295, or the like. As exemplified below, user interface 2295 can include one or more of explanation 2298 or response 2299. Some configurations of system 2200 can be implemented, for example, in primary system 500 or external system 550 of FIG. 5, in module 1706 or hub 1720 of FIG. 17, or as a stand-alone system.

Figure 23:
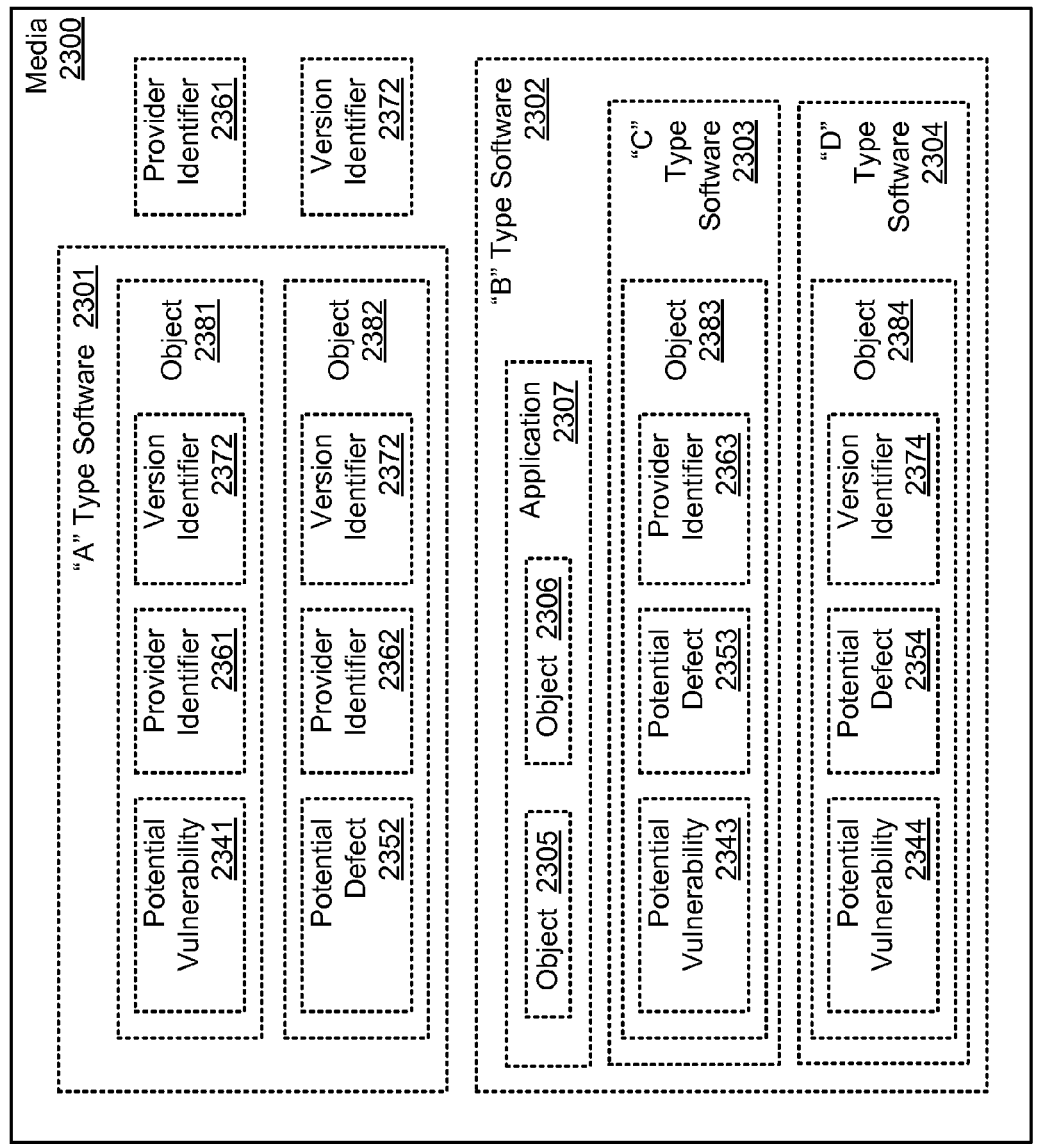

With reference now to FIG. 23, shown is an example of a system that may serve as a context for introducing one or more processes and/or devices described herein. As shown transmission or other media 2300 can bear or otherwise include one or more instances of "A" type software 2301, "B" type software 2302, provider identifier(s) 2361, or version identifier(s) 2372. Object 2381 of "A" type software 2301 can include one or more instances of potential vulnerability 2341, provider identifier(s) 2361, version identifier 2372, or the like. Object 2382 of "A" type software 2301 can likewise (optionally) include one or more instances of potential defect(s) 2352, provider identifier(s) 2362, version identifier 2372 or the like. Optionally, objects 2381, 2382 can likewise both (or all) include a common edition or other version identifiers such as identifier 2372.

"B" type software 2302 can optionally include object(s) 2305, 2306 of application 2307 as well as "C" type software 2303 or "D" type software 2304. For example, object 2383 of "C" type software 2303 can include one or more instances of potential vulnerabilities 2343, potential defects 2353, provider identifiers 2363, or the like. Object 2384 of "D" type software 2304 can likewise include one or more instances of potential vulnerabilities 2344, potential defects 2354, version identifiers 2374, or the like. Some configurations of media 2300 can be implemented, for example, as an element of primary system 500 or external system 550 of FIG. 5, in module 1706 or hub 1720 of FIG. 17, in system 2200 of FIG. 22, or as a storage disc or other article of manufacture.

Figure 24:
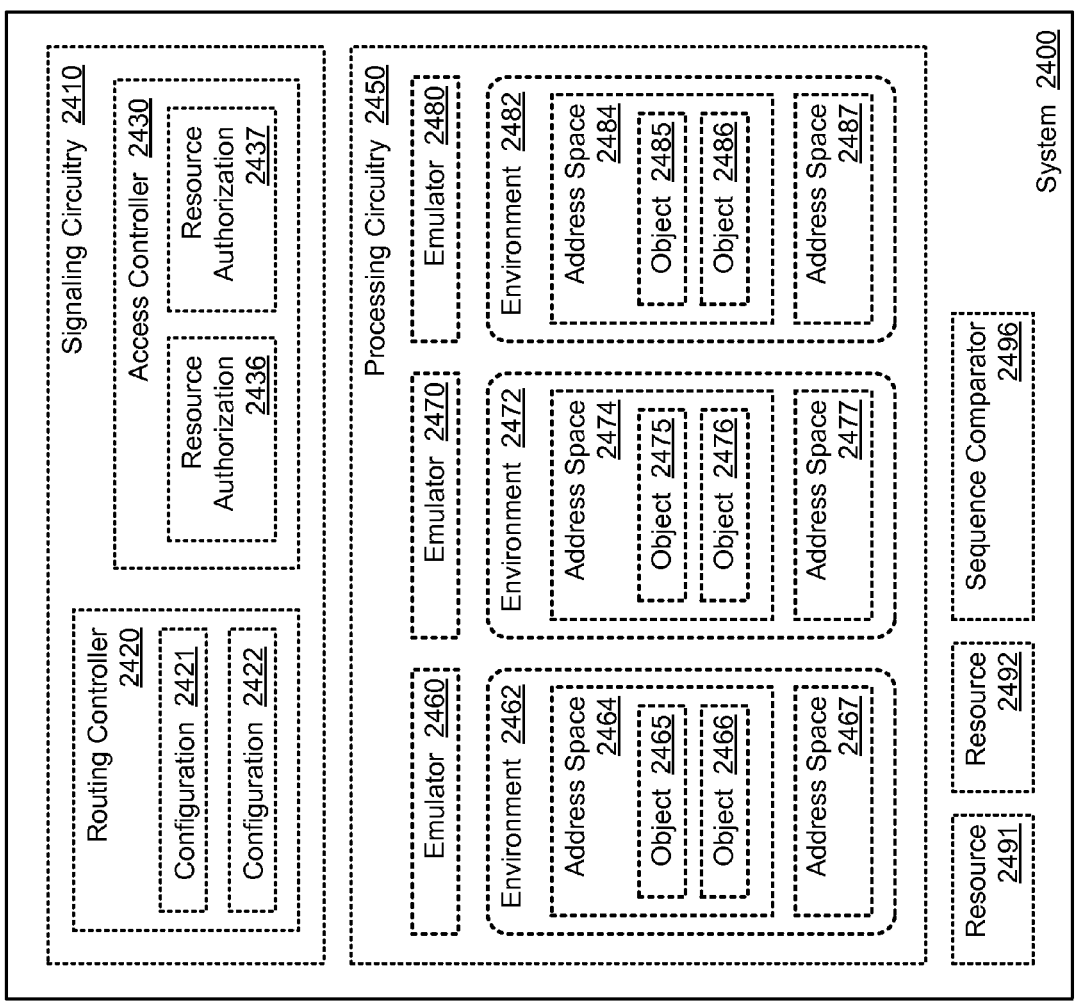

With reference now to FIG. 24, shown is an example of a system that may serve as a context for introducing one or more processes and/or devices described herein. As shown system 2400 can include one or more instances of signaling circuitry 2410, processing circuitry 2450, resources 2491, 2492, or sequence comparators 2496. Signaling circuitry 2410 can (optionally) include one or more instances of routing controllers 2420 (optionally operable for handling configurations 2421, 2422) or access controllers 2430 (optionally operable for handling resource authorizations 2436, 2437).

Processing circuitry 2450 can (optionally) include one or more instances of emulators 2460, 2470, 2480 or environments 2462, 2472, 2482. Environment 2462 can include one or more instances of software objects 2465, 2466 in address spaces 2464, 2467 as shown. (In some embodiments, an "address space" can refer to an allocated portion of a memory or other storage medium, for example.) Environment 2472 can likewise include one or more instances of objects 2475, 2476 in address spaces 2474, 2477 as shown. Further, environment 2482 can likewise include one or more instances of address spaces 2484, 2487, one or more of which can contain code sequences or like objects 2485, 2486 such as are described below, and especially those which are referred to with reference to FIGS. 36-38. Some variants of system 2400 can be implemented, for example, in primary system 500 or external system 550 of FIG. 5, in module 1706 or hub 1720 of FIG. 17, in system 2200 of FIG. 22, or as a stand-alone system.

Figure 25:
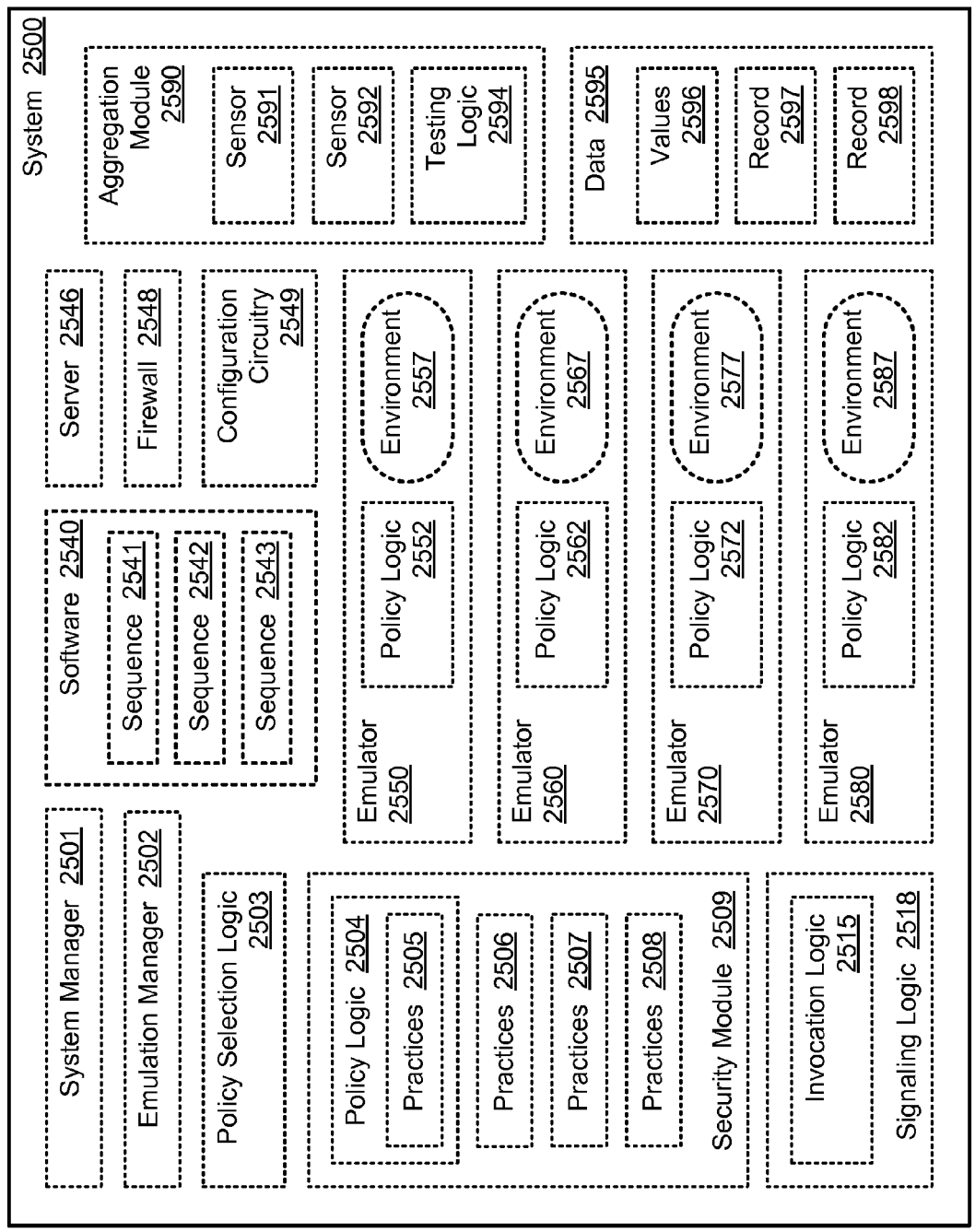

With reference now to FIG. 25, shown is an example of a system that may serve as a context for introducing one or more processes and/or devices described herein. As shown system 2500 can include one or more instances of system managers 2501, emulation managers 2502, policy selection logic 2503, security modules 2509, invocation logic 2515 or other signaling logic 2518, software 2540, servers 2546, firewalls 2548, configuration circuitry 2549, emulators 2550, 2560, 2570, 2580, aggregation modules 2590, or data 2595. Security module 2509 can likewise include, define, or implement one or more instances of practices 2505, 2506, 2507, 2508 or other policy logic 2504. Software 2540 can include one or more instances of instruction sequences 2541, 2542, 2543. Aggregation module 2590 can (optionally) include one or more instances of sensors 2591, 2592 or testing logic 2594. Data 2595 can include one or more instances of values 2596 or record(s) 2597, 2598 as described herein. Emulator 2550 can include one or more instances of policy logic 2552 or environments 2557. Emulator 2560 can include one or more instances of policy logic 2562 or environments 2567. Emulator 2570 can include one or more instances of policy logic 2572 or environments 2577. Emulator 2580 can include one or more instances of policy logic 2582 or environments 2587. Some implementations of system 2500 can be implemented, for example, in primary system 710 or external system 740 of FIG. 7, in module 1708 or hub 1720 of FIG. 17, or as a stand-alone system.

Figure 26:
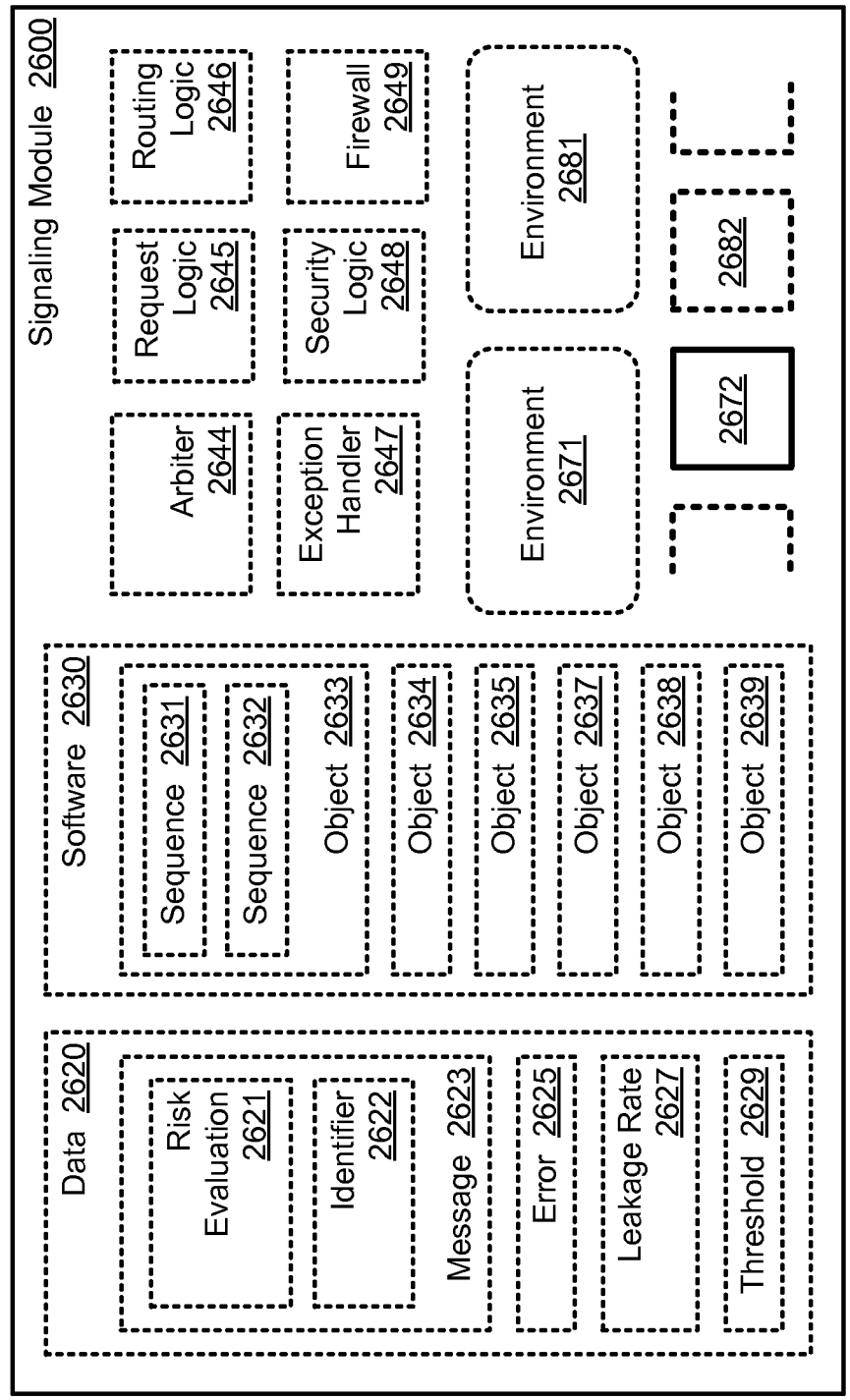

With reference now to FIG. 26, shown is an example of a system that may serve as a context for introducing one or more processes and/or devices described herein. As shown signaling module 2600 can (optionally) include one or more instances of data 2620, software 2630, arbiters 2644, request logic 2645, routing logic 2646, exception handlers 2647, security logic 2648, firewalls 2649, environments 2671, 2681, or processors 2672, 2682. Data 2620 can likewise include one or more instances of risk evaluations 2621 or identifiers 2622 in messages 2623, errors 2625, leakage rates 2627, thresholds 2629, or the like. Software 2630 can (optionally) include instances of sequences 2631, 2632 or objects 2633, 2634, 2635, 2637, 2638, 2639 or the like. One or more instances of signaling module 2600 can be implemented, for example, in primary system 910 of FIG. 9, in module 1710 or hub 1720 of FIG. 17, in system 2200 of FIG. 22, in system 2500 of FIG. 25, or as a stand-alone system.

Figure 27:
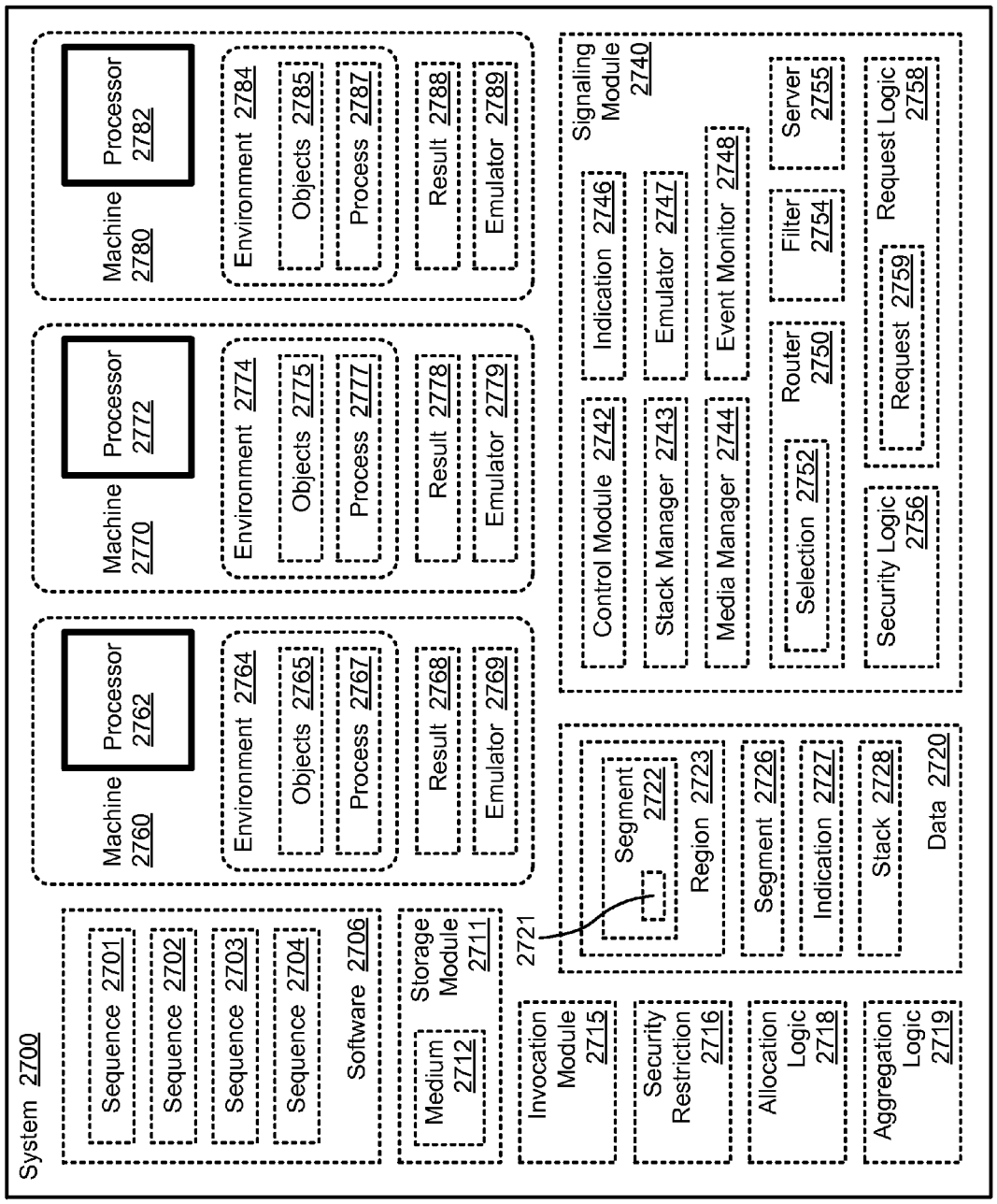

With reference now to FIG. 27, shown is an example of a system that may serve as a context for introducing one or more processes and/or devices described herein. As shown system 2700 can include one or more instances of software 2706, media 2712 or other storage modules 2711, invocation modules 2715, security restrictions 2716, allocation logic 2718, aggregation logic 2719, data 2720, signaling module 2740, or machines 2760, 2770, 2780. Each instance of software 2706 can (optionally) include one or more instruction sequences 2701, 2702, 2703, 2704. Data 2720 can include one or more instances of segments 2722 (optionally with parameter value(s) 2721) in regions 2723, segments 2726, indications 2727, stacks 2728, or the like. Signaling module 2740 can include one or more instances of control module(s) 2742, stack managers 2743, media managers 2744, indications 2746, emulators 2747, event monitors 2748, routers 2750 operable for acting on selections 2752, filters 2754, servers 2755, security logic 2756 or request logic 2758 operable for handling requests 2759. Machine 2760 can include processor 2762 and one or more instances of object 2765 or processes 2767 of environment 2764, results 2768, or emulators 2769. Machine 2770 can likewise include physical or virtual processor 2772 and one or more instances of object 2775 or processes 2777 of environment 2774, results 2778, or emulators 2779. Further, machine 2780 can include processor 2782 and one or more instances of object 2785 or processes 2787 (active or otherwise) of environment 2784 (or others), results 2788, or emulators 2789 as described further below. Some configurations of system 2700 can be implemented, for example, in primary system 1110 or external system 1140 of FIG. 11, in module 1712 or hub 1720 of FIG. 17, or as a stand-alone system.

Figure 28:
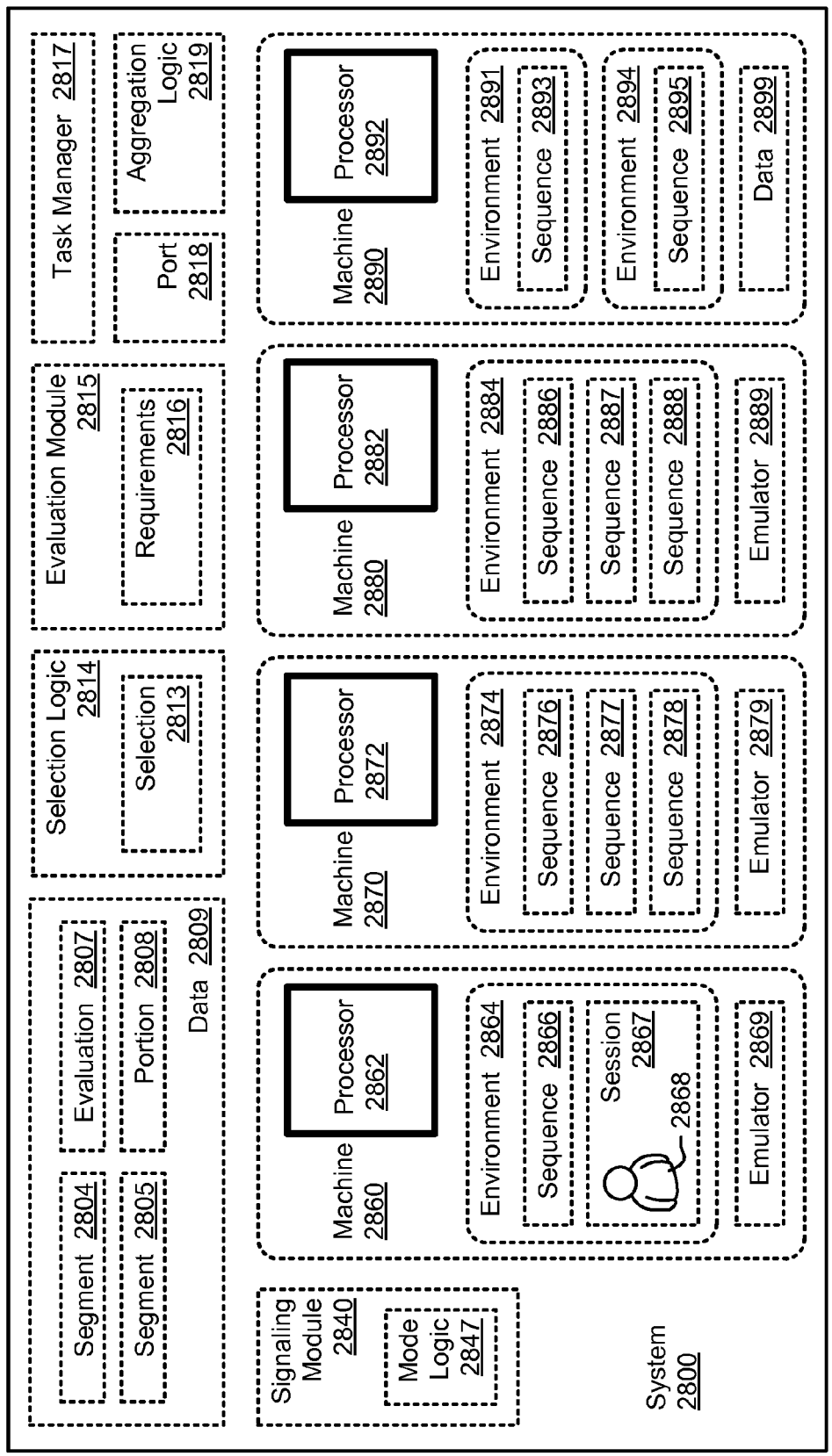

With reference now to FIG. 28, shown is an example of a system that may serve as a context for introducing one or more processes and/or devices described herein. As shown system 2800 can include one or more instances of data 2809, selection logic 2814 operable to handle one or more selections 2813, evaluation modules 2815 operable to apply or otherwise handle one or more performance-indicative requirements 2816, task managers 2817, ports 2818, aggregation logic 2819, signaling modules 2840 (optionally including mode logic 2847), and machines 2860, 2870, 2880, 2890. Data 2809 can include one or more instances of segments 2804, 2805, evaluations 2807, or other portions 2808 of data. Machine 2860 can include one or more instances of (physical or virtual) processors 2862, environments 2864, or emulators 2869. Environment 2864 can (optionally) include one or more instances of sequence(s) 2866 or sessions 2867 associated with user 2868. In machine 2870, processor 2872 can optionally host one or more sequences 2876, 2877, 2878 in environment(s) 2874, such as by emulator 2879. In machine 2880, processor 2882 can optionally host one or more sequences 2886, 2887, 2888 in environment(s) 2884, such as by emulator 2889. In machine 2890, processor 2892 can optionally host one or more of sequence(s) 2892 in environment 2891 or sequence(s) 2895 in environment 2894 so as to generate data 2899 as described herein. Some configurations of system 2800 can be implemented, for example, in primary system 1110 or external system 1140 of FIG. 11, in module 1712 or hub 1720 of FIG. 17, in system 2700 of FIG. 27, or as a stand-alone system.

Figure 29:
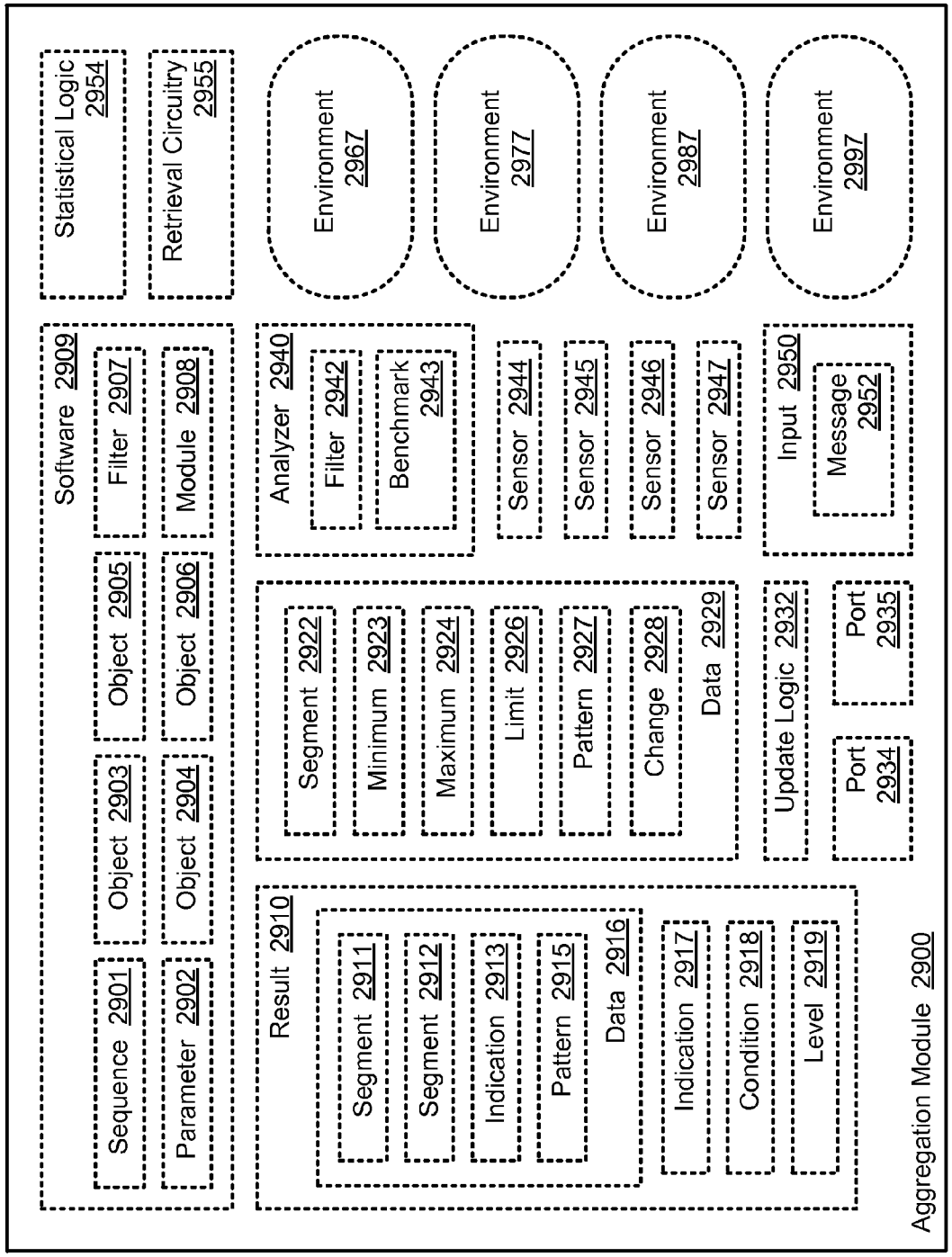

With reference now to FIG. 29, shown is an example of a system that may serve as a context for introducing one or more processes and/or devices described herein. As shown aggregation module 2900 can include one or more instances of sequences 2901, parameters 2902, objects 2903, 2904, 2905, 2906, filters 2907, modules 2908, or other software 2909. System 2900 can likewise include one or more instances of results 2910, data 2929, update logic 2932, ports 2934, 2935, analyzers 2940, sensors 2944, 2945, 2946, 2947, inputs 2950 (such as one or more messages 2952, e.g.), statistical logic 2954, retrieval circuitry 2955, or environment 2967, 2977, 2987, 2997. For example, result 2910 can include one or more instances of segments 2911, 2912, indications 2913, pattern 2915, other data 2916, indications 2917, conditions 2918, levels 2919, or the like. Data 2929 can include one or more instances of segments 2922, minima 2923, maxima 2924, limits 2926, patterns 2927, changes 2928, or the like. Analyzer 2940 can be operable to apply one or more instances of filters 2942 or benchmarks 2943. Some configurations of aggregation module 2900 can be implemented, for example, in primary system 1110 or external system 1140 of FIG. 11, as module 1712 of FIG. 17, in system 2800 of FIG. 28, or as a stand-alone system.

Figure 30:
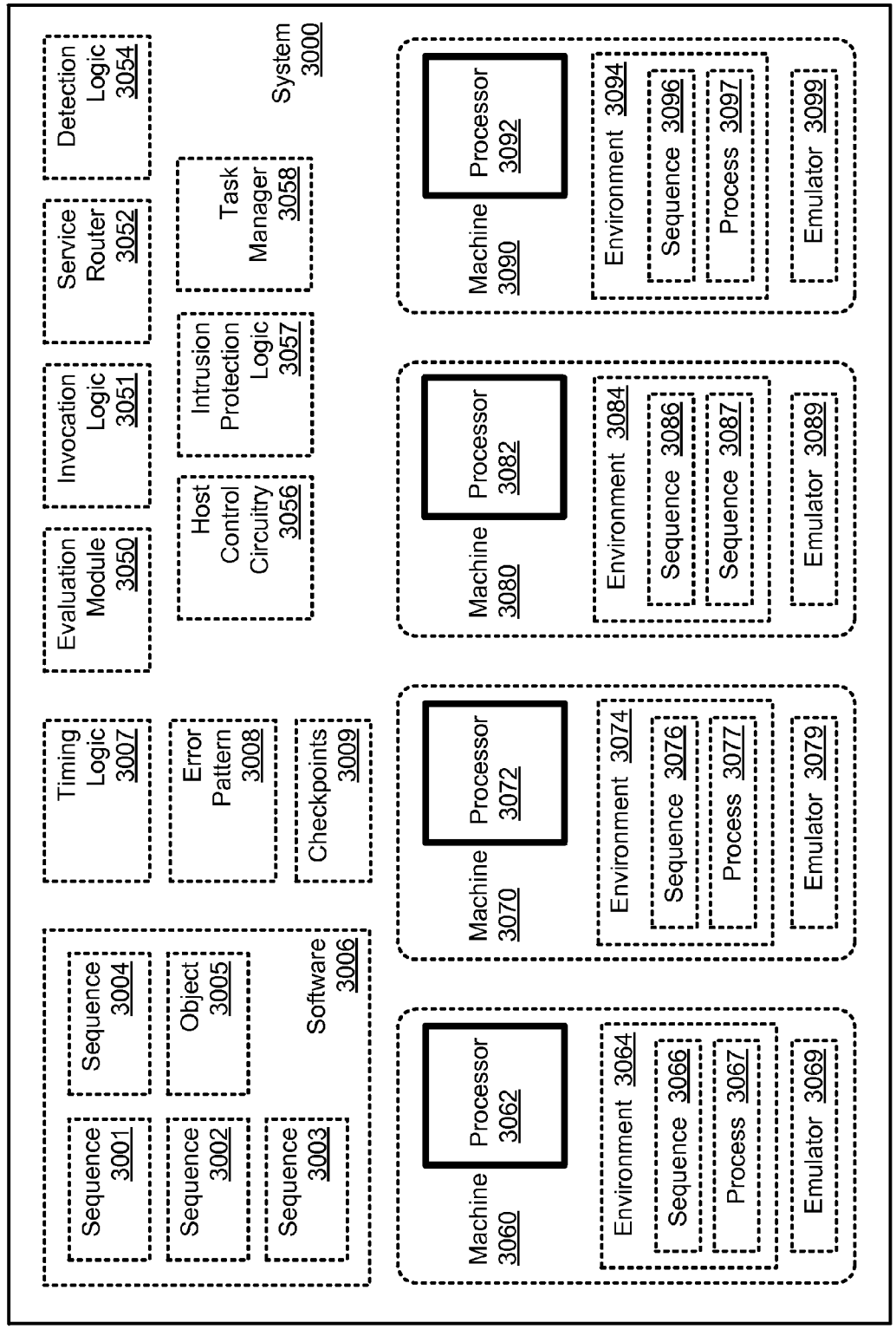

With reference now to FIG. 30, shown is an example of a system that may serve as a context for introducing one or more processes and/or devices described herein. As shown system 3000 can include one or more of instances of software 3006, timing logic 3007, error patterns 3008, one or more checkpoints 3009, evaluation modules 3050, invocation logic 3051, service routers 3052, detection logic 3054, host control circuitry 3056, intrusion protection logic 3057, or task managers 3058. Software 3006 can include one or more instances of instruction sequences 3001, 3002, 3003, 3004, or other software objects 3005. In some embodiments, an "object" of software can include an executable sequence, source code, a data object, a function or other service, or the like, implemented primarily in software. In some contexts, such a "service" can include one or more of an application, a process, a resource, a function, a queue, an operating mode, an emulation environment, or the like.

In some implementations, system 3000 can likewise contain machine 3060 with processor 3062, machine 3070 with processor 3072, machine 3080 with processor 3082, or machine 3090 with processor 3092. Where included, machines 3060, 3070, 3080, 3090 can optionally implement virtual machines in various configurations. In some embodiments, a "machine" for partial or full emulation can include an operating system or other software using generally common resources that are actually available to other software but which usually appear within an emulation environment of the machine to be dedicated resources. These resources can include one or more of an instruction set, a set of registers, a stack, a heap, a peripheral device, a communication bus, a processor, or the like. Processors 3062, 3072, 3082, 3092 can each optionally be physical, emulated, or hybrid, as will be understood by those skilled in the art.

Machine 3060 can include one or more of environment 3064 (with access to one or more of instruction sequence 3066 or process 3067, e.g.) or emulator 3069 as described below. Machine 3070 can likewise include one or more of environment 3074 (with access to one or more of instruction sequence 3076 or process 3077, e.g.) or emulator 3079. Machine 3080 can likewise include one or more of environment 3084 (with access to one or more of instruction sequence 3086 or sequence 3087, e.g.) or emulator 3089. Machine 3090 can likewise include one or more of environment 3094 (with access to one or more of instruction sequence 3096 or process 3097, e.g.) or emulator 3099. Those skilled in the art will recognize a variety of particular configurations and operational relations that can exist among these various components in various instances of system 3000 in light of the following operational descriptions. It will be understood, for example, that one or more of processors 3062, 3072, 3082, 3092 can optionally be implemented in software, for example. Some configurations of system 3000 can be implemented, for example, in primary system 1310 or external system 1340 of FIG. 13, in module 1714 or hub 1720 of FIG. 17, or as a stand-alone system.

Figure 31:
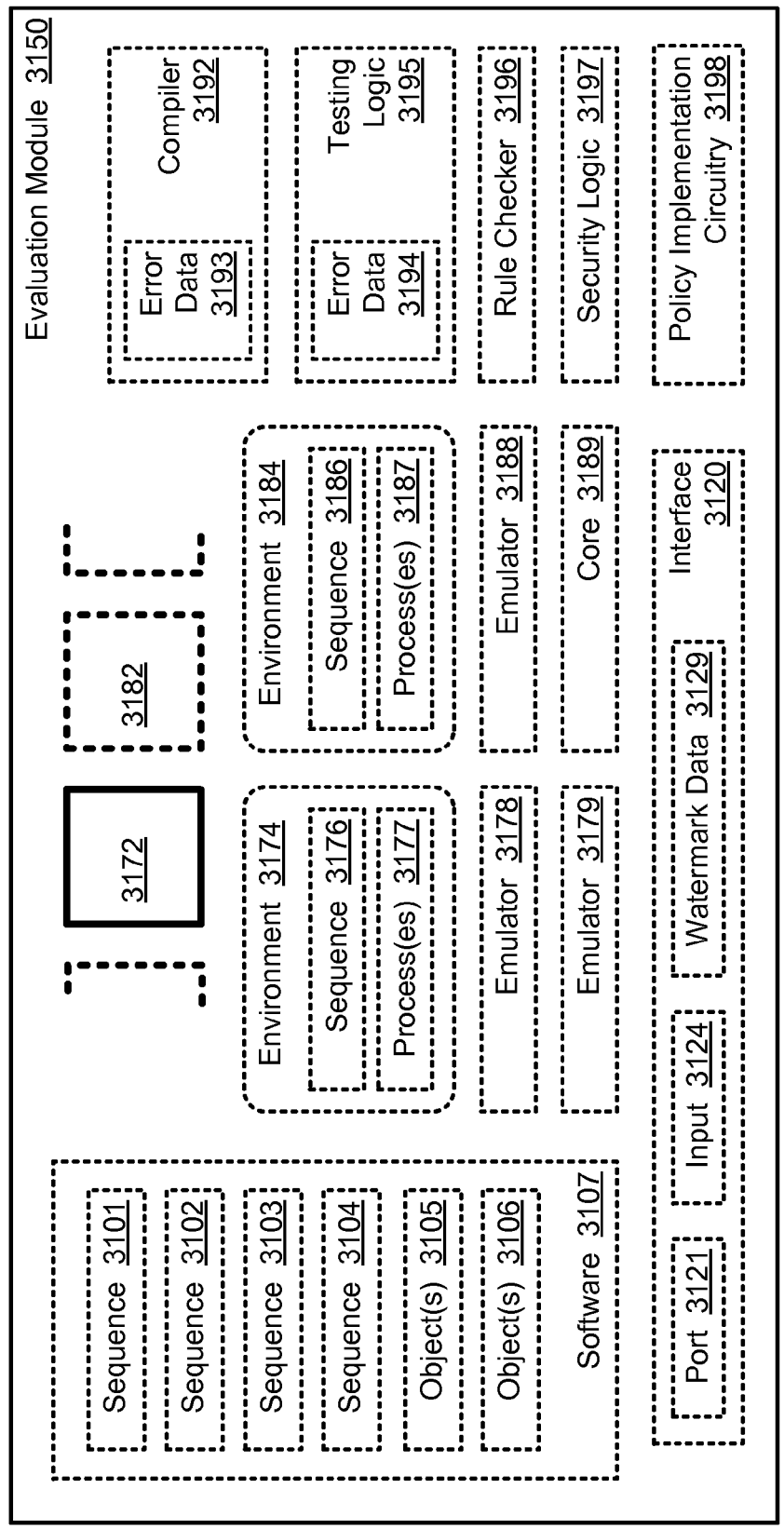

With reference now to FIG. 31, shown is an example of a system that may serve as a context for introducing one or more processes and/or devices described herein. As shown system 3100 includes one or more instances of evaluation modules 3150 with one or more instances of processors 3172. Evaluation module 3150 can further include one or more instances of software 3107, interfaces 3120, environment 3174, emulators 3178, 3179, processors 3182, environments 3184, emulators 3188, cores 3189, compilers 3192 (optionally handling error data 3193), other error data 3194 optionally generated by testing logic 3195, rule checkers 3196, security logic 3197, policy implementation circuitry 3198, or the like. Software 3107 can include one or more of (instruction) sequence 3101, sequence 3102, sequence 3103, sequence 3104, one or more software objects 3105, or one or more software objects 3106. Interface 3120 can include one or more of port 3121, input 3124, or watermark data 3129. Environment 3174 can include one or more of instruction sequence 3176 or process(es) 3177. Environment 3184 can include one or more of instruction sequence 3186 or process(es) 3187. Those skilled in the art will recognize a variety of particular configurations and operational relations that can exist among these various components in various instances of evaluation modules 3150 in light of operational descriptions herein. Some configurations of system 3100 can be implemented, for example, in primary system 1310 or external system 1340 of FIG. 13, in module 1714 or hub 1720 of FIG. 17, in system 3000 of FIG. 30, or as a stand-alone system.

Figure 32:
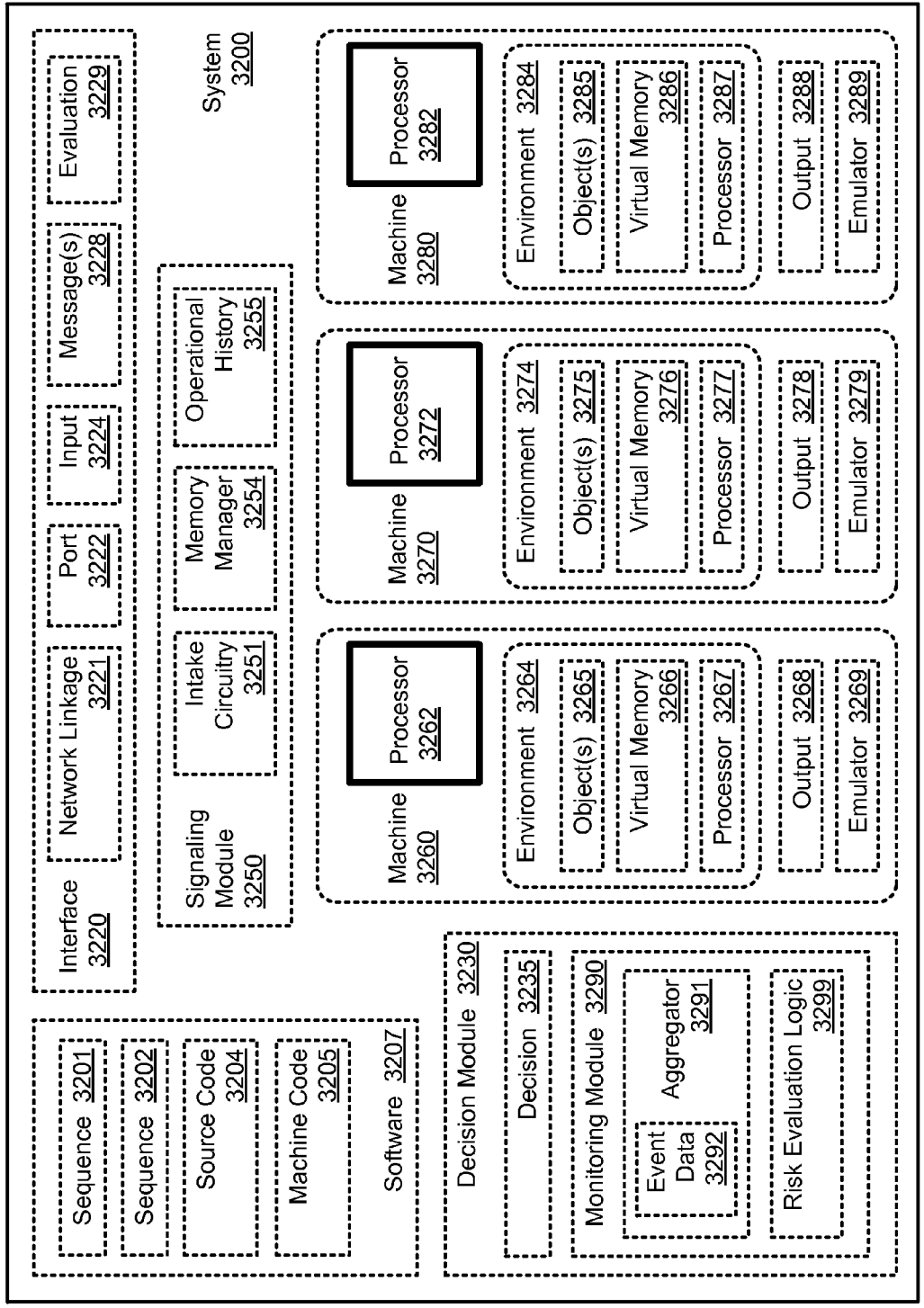

With reference now to FIG. 32, shown is an example of a system that may serve as a context for introducing one or more processes and/or devices described herein. As shown system 3200 can include one or more of software 3207, interface 3220, decision module 3230, signaling module 3250, machine 3260 with processor 3262, machine 3270 with processor 3272, or machine 3280 with processor 3282. Software 3207 can (optionally) include one or more of instruction sequence 3201, instruction sequence 3202, source code 3204, or machine code 3205. Interface 3220 can include one or more of network linkage 3221, port 3222, input 3224, message(s) 3228, or evaluation 3229. Decision module 3230 can include one or more of decision 3235 or monitoring module 3290. Monitoring module 3290 can include one or more of aggregator 3291 (optionally having event data 3292) or risk evaluation logic 3299. Signaling module can include one or more of intake circuitry 3251, memory manager 3254, or operational history 3255. Machine 3260 can include one or more of environment 3264, output 3268, or emulator 3269 as described below. Environment 3264 can access or otherwise "contain" one or more of object(s) 3265, virtual memory 3266, or processor 3267. Environment 3264 can be physical, in some embodiments, emulated (e.g. by emulator 3269 or the like), or some hybrid of the two. Environment 3274 can likewise contain one or more of object(s) 3275, virtual memory 3276, or processor 3277. Environment 3284 can likewise contain one or more of object(s) 3285, virtual memory 3286, or processor 3287. Those skilled in the art will recognize a variety of particular configurations and operational relations that can exist among these various components in various instances of systems 3200 in light of the following operational descriptions. It will be understood, for example, that one or more of processors 3262, 3272, 3282 can optionally be implemented in software, for example. Some configurations of system 3200 can be implemented, for example, in primary system 1510 or external system 1540 of FIG. 15, in module 1716 or hub 1720 of FIG. 17, or as a stand-alone system.

Figure 33:
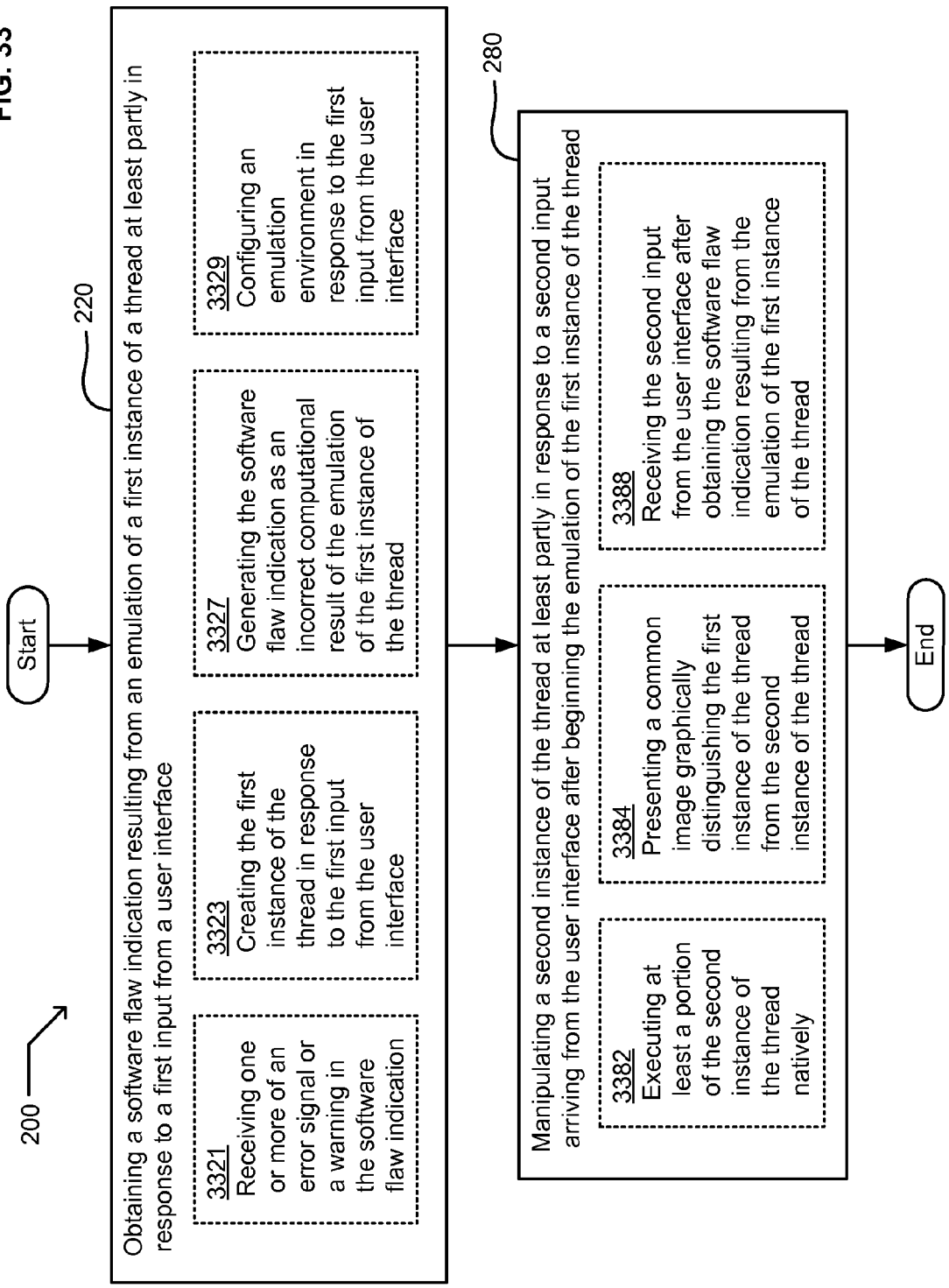
FIGS. 33-34 depict variants of the flow of FIG. 2.

With reference now to FIG. 33, there are shown several variants of the flow 200 of FIG. 2. Operation 220—obtaining a software flaw indication resulting from an emulation of a first instance of a thread at least partly in response to a first input from a user interface—may include one or more of the following operations: 3321, 3323, 3327, or 3329. The thread can, for example, arise by an execution of sequence 1725 or the like, in embodiments in which hub 1720 implements one or more instances of systems 1800, 1900, 2000 as described herein for acting on other sequences, which sequence 1725 can include. Operation 280—manipulating a second instance of the thread at least partly in response to a second input arriving from the user interface after beginning the emulation of the first instance of the thread—may include one or more of the following operations: 3382, 3384, or 3388.

Operation 3321 describes receiving one or more of an error signal or a warning in the software flaw indication (e.g. port 2056 receiving flaw indication 2080 containing at least one of error type 2081 or warning type 2082). This can occur, for example, in embodiments in which one or more instances of monitoring modules 1803, 2005 perform operation 220 and in which one or more instances of control modules 1804, 1904, 2004 or hosting modules 1906, 2006 perform operation 280. Error type 2081 can indicate a divide-by-zero, an illegal write or read, a timeout, or any other (actual or apparent) occurrence of an error. Warning type 2082 can indicate one or more of a failure prediction, a resource shortage record, a risk, a slower-than-nominal rate, or the like.

Operation 3323 describes creating the first instance of the thread in response to the first input from the user interface (e.g. emulator 1932 creating thread 1975 by executing instruction sequence 1952 according to selected parameters 1894 received from user interface 1899). This can occur, for example, in a variant of system 1800 that implements hosting module 1906 or other parts of system 1900, in which hosting module 1906 and monitoring module 1803 jointly perform operation 220, and in which at least control module 1904 performs operation 280'. In some variants, such selections can specify one or more checkpoints 1896, environmental parameters 1893, module parameters 1894, timing 1892, expected intermediate or final results 1895, or the like.

Operation 3327 describes generating the software flaw indication as an incorrect computational result of the emulation of the first instance of the thread (e.g. at least emulator 2075 generating one or more of metadata 2046, module output 2047, register values 2048, or the like that differ from one or more corresponding expected results 2032). Alternatively or additionally, some variants can include a comparator 2010 that can detect that the result is incorrect, such as by comparing actual results 2016 (generated with known parameters 2036, e.g.) that can then be compared with corresponding theoretical results 2014.

Operation 3329 describes configuring an emulation environment in response to the first input from the user interface (e.g. configuration logic 1850 causing core 1910 to access server 1908, to implement fault detection logic 1837 or error recovery logic 1832, to adjust event simulation or other timing 1892, or the like according to information indicated in input 1890). This can occur, for example, in embodiments in which one or more instances of monitoring modules 1803, 2005 perform operation 220 and in which one or more instances of control modules 1804, 1904, 2004 or hosting modules 1806, 1906 perform operation 280. Alternatively or additionally, emulator 1912 can generate or adapt server 1908 virtually (as a database server, web server, or the like) in response to a suitable input 1981 from user interface 1980.

Operation 3382 describes executing at least a portion of the second instance of the thread natively (e.g. core 2040 executing at least instruction sequence 2065 of instance 2068 natively). This can occur, for example, in an embodiment in which another portion has an apparent flaw (e.g. sequence 2062 having apparent flaw 2063), in which emulator 2075 emulates the "first" instance 2069 of thread 2070 in response to "first" input 2051, and in which "second" instance 2068 is manipulated partly in response to "second" input 2052, in which control module 2004 and hosting module 2006 jointly perform operation 280, and in which at least monitoring module 2005 performs operation 220. In some variants, for example, monitoring module 2005 indicates one or more timing error indications 2061, random noise indications 2064, or some other apparent flaw 2067 as parameters 2026 of error record 2020.

Operation 3384 describes presenting a common image graphically distinguishing the first instance of the thread from the second instance of the thread (e.g. display 1987 showing common image 1988 containing icons 1989, windows, or the like respectively representing each of instances 1973, 1974). This can occur, for example, in embodiments in which system 1900 includes at least one of the monitoring modules 1803, 2005 configured to perform operation 220, and in which control module 1904 performs operation 280.

Operation 3388 describes receiving the second input from the user interface after obtaining the software flaw indication resulting from the emulation of the first instance of the thread (e.g. port 1996 or port 1997 receiving input 1982 from user interface 1980 after port 1997 or module 1955 receives or generates a warning or error message). Alternatively or additionally, in some embodiments, emulator 1932 or compiler 1995 can generate the software flaw indication in various modes as described herein, such as by emulating or otherwise processing sequence 1952.

Figure 34:
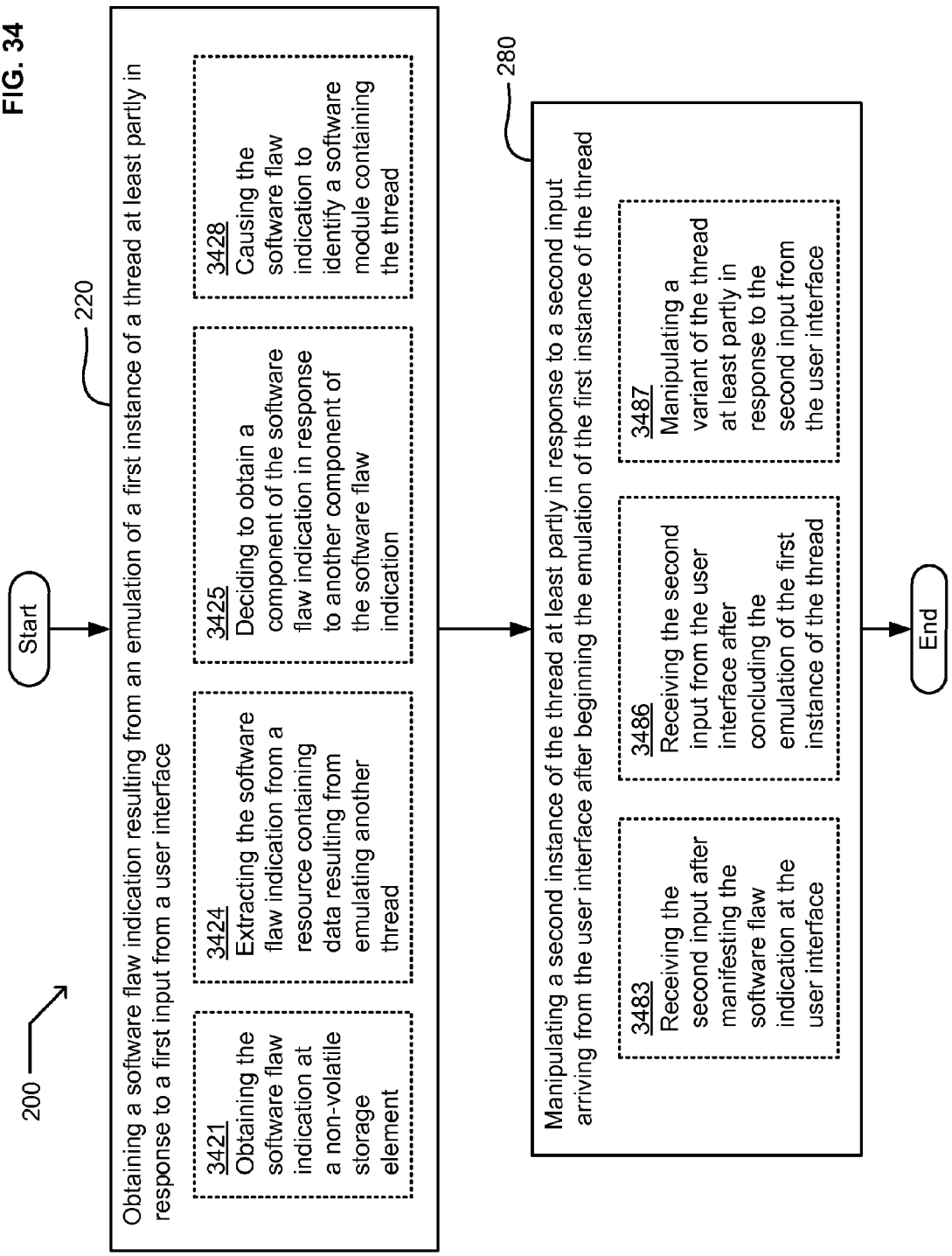

With reference now to FIG. 34, there are shown several variants of the flow 200 of FIG. 2 or 33. Operation 220—obtaining a software flaw indication resulting from an emulation of a first instance of a thread at least partly in response to a first input from a user interface—may include one or more of the following operations: 3421, 3424, 3425, or 3428. Operation 280—manipulating a second instance of the thread at least partly in response to a second input arriving from the user interface after beginning the emulation of the first instance of the thread—may include one or more of the following operations: 3483, 3486, or 3487.

Operation 3421 describes obtaining the software flaw indication at a non-volatile storage element (e.g. aggregation manager 1831 receiving at least flaw indication 1840 resulting from the emulation, such as for archiving on data storage disks 1882 or the like). This can occur, for example, in embodiments in which one or more instances of monitoring modules 1803, 2005 perform operation 220 individually or jointly, and optionally in combination with other structures as described herein.

Operation 3424 describes extracting the software flaw indication from a resource containing data resulting from emulating another thread (e.g. retrieval logic 2038 finding flaw indication 2080 and related parameters 2028 and other information 2029 about an outcome of emulating thread 2070). This can occur, for example, in embodiments in which the instance 2068 of thread 2070 executes in an environment in common with instance 2069 or object 1972 operating in a common environment with a variant 1962 of object 1972, or otherwise in which the "other" object is related to "the" object in some fashion. Alternatively or additionally, some or all of the extraction can be obtained by passing raw emulation data 2034 through data selection filter 2057.

Operation 3425 describes deciding to obtain a component of the software flaw indication in response to another component of the software flaw indication (e.g. event handler 1884 responding to flaw indication component 1846 by creating or otherwise obtaining component 1847). For example, event handler 1884 can respond to computation error indications 1849 by requesting one or more of call stack 1852, interaction history 1853, registry 1854, workspace contents 1855, or other state information 1859. Such a response can be helpful, for example, in a context in which different types of components are most useful for different types of flaw indications.

Operation 3428 describes causing the software flaw indication to identify a software module containing the thread (e.g. event handler 1963 generating an error record 2020 containing a name 2022 or location 2024 of application 1950 or module 1955 containing sequence 1951 being emulated when an apparent flaw 1954 appears). In some circumstances, an earlier-executed instruction sequence 1951 can be associated with the apparent flaw 1954 for example, through human or automatic analysis.

Operation 3483 describes receiving the second input after manifesting the software flaw indication at the user interface (e.g. input device 1985 receiving input 1982 after driver 1991 transmits a graphical, auditory, or other representation 1992 of flaw indication 1840 to output device 1986 or otherwise into a vicinity of input device 1985). For example, such manifestations can prompt a user to push back or otherwise diminish whichever instances are less problematic, or to initiate an evaluation or correction in response to the indication, or to terminate an unneeded instance, or otherwise to act on the second instance of the thread.

Operation 3486 describes receiving the second input from the user interface after concluding the emulation of the first instance of the thread (e.g. port 1996 receiving user action indications from user interface 1980 or other data 1998 after emulator 1922 aborts thread 1976 or otherwise finishes executing instance 1973). This can occur, for example, in embodiments in which hub 1720 includes one or more instances of monitoring modules 1803, 2005 configured to perform operation 220 and in which module 1702 includes one or more instances of control module 1904 (optionally with hosting module 1906) configured to perform operation 280.

Operation 3487 describes manipulating a variant of the thread at least partly in response to the second input from the user interface (e.g. code generator 1907 or editor 1994 adapting at least sequence 1951 of module 1955 in response to user commands or other input 1981). This can occur in an embodiment in which module 1702 includes an instance of system 1900 providing the first and second inputs, for example, from input device 1985. Alternatively or additionally, hub 1720 can include an instance of hosting module 1906 or other systems herein operable to host the emulation from which the software flaw indication results. Such cooperative or distributed systems can facilitate task specialization, load balancing, or other processing efficiencies in light of teachings herein.

Figure 35:
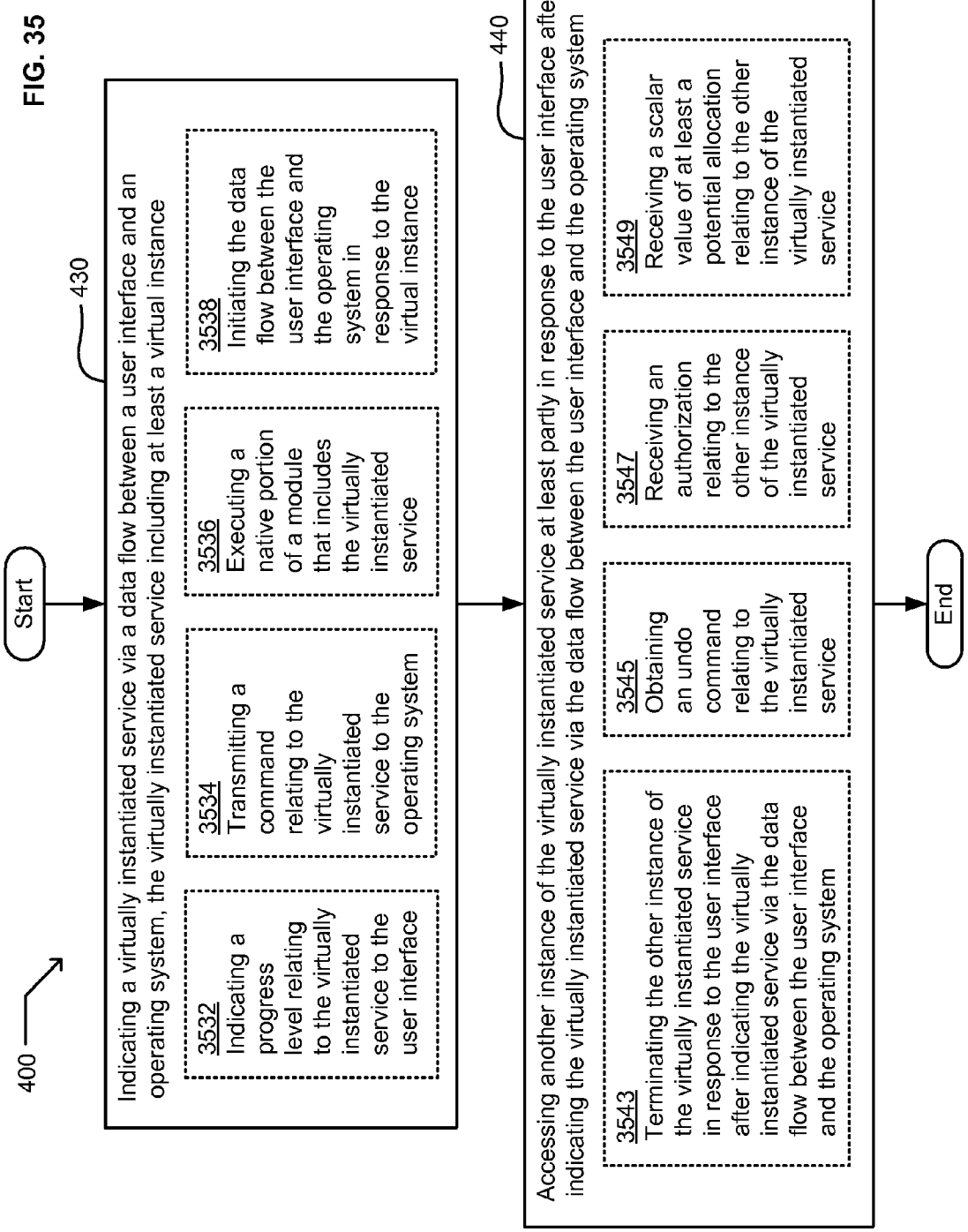
FIG. 35 depicts variants of the flow of FIG. 4.

With reference now to FIG. 35, there are shown several variants of the flow 400 of FIG. 4. Operation 430—indicating a virtually instantiated service via a data flow between a user interface and an operating system, the virtually instantiated service including at least a virtual instance—may include one or more of the following operations: 3532, 3534, 3536, or 3538. Operation 440—accessing another instance of the virtually instantiated service at least partly in response to the user interface after indicating the virtually instantiated service via the data flow between the user interface and the operating system—may include one or more of the following operations: 3543, 3545, 3547, or 3549.

Operation 3532 describes indicating a progress level relating to the virtually instantiated service to the user interface (e.g. evaluation circuitry 2171 indicating a quantity or other expression 2174 of an amount of a task done or yet to do). This can occur, for example, in embodiments in which feedback module 2170 performs operation 430 and in which access module 2190 performs operation 440.

Operation 3534 describes transmitting a command relating to the virtually instantiated service to the operating system (e.g. user interface 2180 indicating a delete, undelete, pause, resume, fetch, terminate, create, undo, reconfigure, or other command relating to an instance 2142 or other aspect of service 2140 to operating system 2120).

Operation 3536 describes executing a native portion of a module that includes the virtually instantiated service (e.g. one or more cores 2115 natively executing at least instruction sequence 2155 while emulator 2111 executes at least instance 2143 of sequence 2141). This can occur, for example, in embodiments in which service 2140 comprises a code module comprising two or more instruction sequences 2141, 2155. Alternatively or additionally, the native portion can be executed before, after, or interleaved with an emulation of the service.

Operation 3538 describes initiating the data flow between the user interface and the operating system in response to the virtual instance (e.g. socket 2121 transmitting output 2144 or some other indication of service 2140 to user interface 2180 responsive to detecting or being notified that instance 2157 has been created or has generated output 2144).

Operation 3543 describes terminating the other instance of the virtually instantiated service in response to the user interface after indicating the virtually instantiated service via the data flow between the user interface and the operating system (e.g. driver 2122 deleting or otherwise stopping instance 2158 of service 2140 in response to input 2185 after feedback module 2170 performs operation 430).

Operation 3545 describes obtaining an undo command relating to the virtually instantiated service (e.g. port 2194 receiving undo command as input 2185 from user interface 2180 or in error response sequence 2193, either of which can relate to an instance or other aspect of service 2140). Input 2185 can indicate a command to undo a "start task" or "delete object" command, for example. Alternatively or additionally, error response sequence 2193 can contain or refer to such an undo operation in response to an error message. In some variants, an "undone" task can be queued to be performed later, for example, under safer circumstances.

Operation 3547 describes receiving an authorization relating to the other instance of the virtually instantiated service (e.g. port 2196 receiving input 2184 comprising some form of authorization 2197 via interface 2180 or instance 2158 of service 2140). In some variants, such authorization can be a requirement for accessing the "other" instance (as instance 2156, for example) or for accessing some other object(s) within core(s) 2115.

Operation 3549 describes receiving a scalar value of at least a potential allocation relating to the other instance of the virtually instantiated service (e.g. port 2192 receiving an actual or forecast allocation 2191 in terms of cost, time, or other resources in relation to instance 2156). This can occur, for example, in embodiments in which access module 2190 performs operation 440, in which "the" virtual instance includes at least a portion of instance 2158, and in which feedback module 2170 performs operation 430 (optionally in concert with or in addition to user interface 2180 or hosting module 2110).

Figure 36:
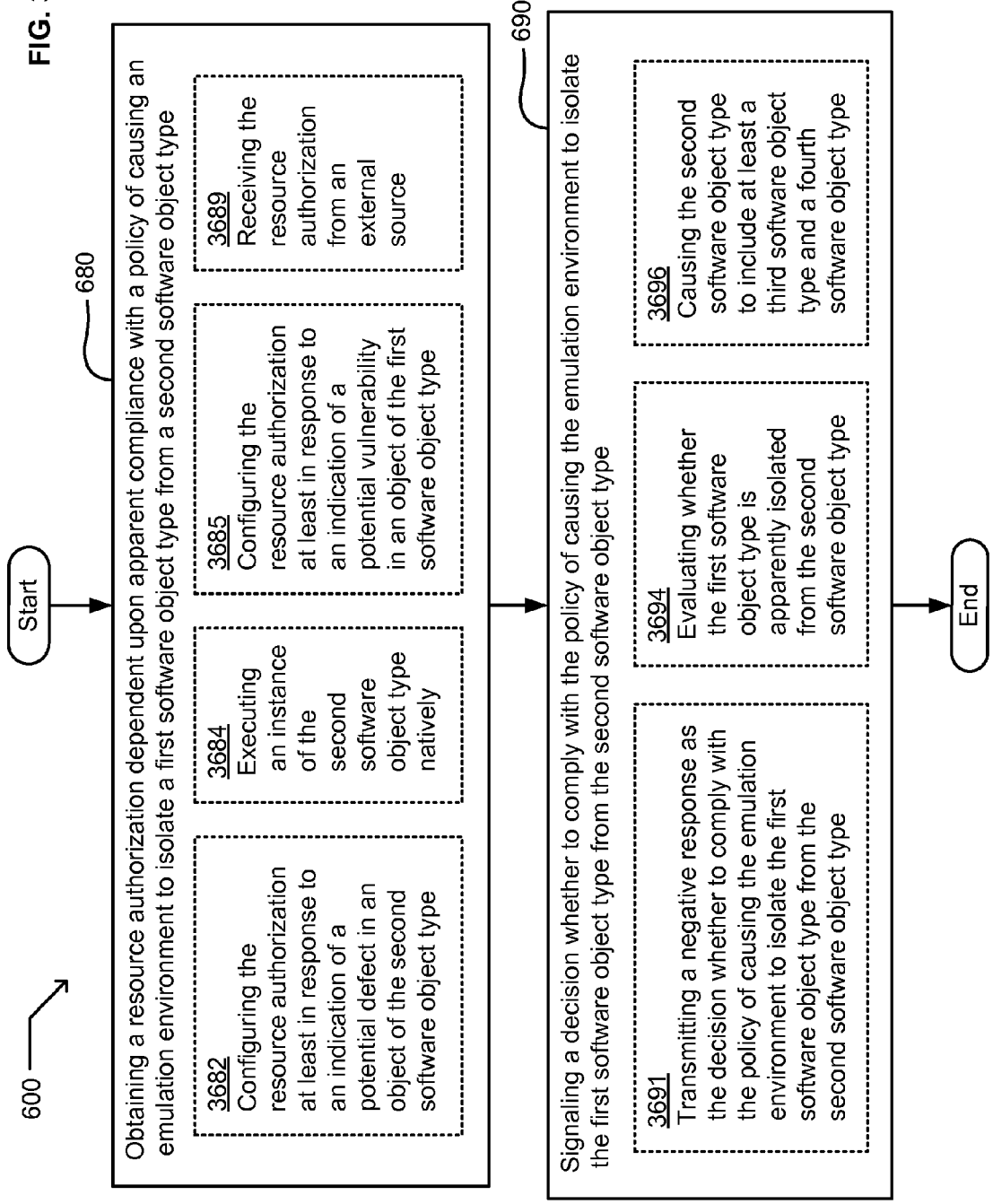
FIGS. 36-38 depict variants of the flow of FIG. 6.

With reference now to FIG. 36, there are shown several variants of the flow 600 of FIG. 6. Operation 680—obtaining a resource authorization dependent upon apparent compliance with a policy of causing an emulation environment to isolate a first software object type from a second software object type—may include one or more of the following operations: 3682, 3684, 3685, or 3689. Operation 690—signaling a decision whether to comply with the policy of causing the emulation environment to isolate the first software object type from the second software object type—may include one or more of the following operations: 3691, 3594, or 3696.

Operation 3682 describes configuring the resource authorization at least in response to an indication of a potential defect in an object of the second software object type (e.g. code generator 2280 creating or adapting resource authorization 2277 in response to object 2383 of "C" type software 2303 apparently having a resource allocation bug or other potential defect 2353). In an environment in which all "Brand X" software is considered prone to include memory leaks, resource authorization 2277 (for a network printer, e.g.) can be configured to depend upon such software being quarantined into a virtual machine or like environment. The "types" into which software is organized can likewise depend on a programmer, a revision number, a distribution mode, a command sequence, a data or file type, or the like.

In some variants, code generator 2280 can receive an indication 2282 of an actualized or other potential defect—a bug report, error log, speculative execution outcome, reputation data, or the like—in association with reference 2281 to the object(s) or type(s). Code generator 2280 can (optionally) respond by implementing a policy of isolating the object(s) or type(s), preferably according to the apparent nature of the potential defect: its severity, a target software type or other vulnerability to which it relates, whether it is apparently malicious, how burdensome emulation may be, or the like.

Operation 3684 describes executing an instance of the second software object type natively (e.g. processor 2242 executing one or more of objects 2381, 2382, 2383 directly and physically in environment 2262, without emulation). This can occur, for example, in embodiments in which the emulation environment comprises environment 2263 hosting object 2384, in which "D" type software 2304 is the "first" type, and in which the "second" type comprises one or more of "A" type software 2301 or "C" type software 2303.

Operation 3685 describes configuring the resource authorization at least in response to an indication of a potential vulnerability in an object of the first software object type (e.g. code generator 2285 creating or adapting resource authorization 2277 in response to object 2384 of "D" type software 2304 apparently having valuable data or other potential vulnerability 2344). In some variants, code generator 2285 receives an indication 2287 of such a potential vulnerability—a contact list or other trade secret, a susceptibility to denial-of-service attacks, a critical function or the like—in association with reference 2286 to the object(s) or type(s). In some variants, all messages from a specific individual, all source code, or all files in a specific location are deemed critical, potential targets of attack. In response, code generator 2285 can (optionally) implementing a policy of isolating the object(s) or type(s), preferably in a selective manner according to the apparent nature of the potential vulnerability.

Operation 3689 describes receiving the resource authorization from an external source (e.g. port 2278 receiving resource authorization 2277 from external system 550). This can occur, for example, in embodiments in which primary system 510 implements or otherwise can access one or more of signaling circuitry 2210, access controller 2270, or media 2300. In some variants, resource authorization 2277 can further comprise a noncontingent authorization to access resource 2275, for example, or a contingent authorization to access resources comprising external system 550.

Operation 3691 describes transmitting a negative response as the decision whether to comply with the policy of causing the emulation environment to isolate the first software object type from the second software object type (e.g. port 2268 transmitting decision 2248 indicating a past or potential noncompliance with the isolation policy in some fashion). Decision 2248 can be included in one or more messages, event reports, or other digital signals, for example.

Operation 3694 describes evaluating whether the first software object type is apparently isolated from the second software object type (e.g. system monitor 2267 determining whether environment 2265 or system 2200 contain any instances of "B" type software 2302 able to access any instances of "A" type software 2301). In some variants, system monitor 2267 can distinguish among various incidents or modes of access: how recent; whether interference is apparently possible; whether an actual interaction was proper; whether accessibility is mutual; which component types, sequences, environments, or systems are/were involved; which object instances were involved; what process outcomes resulted; related resources and authorizations; or the like. Alternatively or additionally, network manager 2266 can optionally aggregate or otherwise respond to data of this type from other (external) systems in a virtual private network.

Operation 3696 describes causing the second software object type to include at least a third software object type and a fourth software object type (e.g. type definition logic 2230 defining "B" type software 2302 to include all objects of "C" type software 2303 or "D" type software 2304). This can be implemented using a "OR" function or other syntactic joining expression 2233, for example. As shown, of course, "B" type software 2302 can likewise be defined to include one or more objects of neither "C" type nor "D" type.

Figure 37:
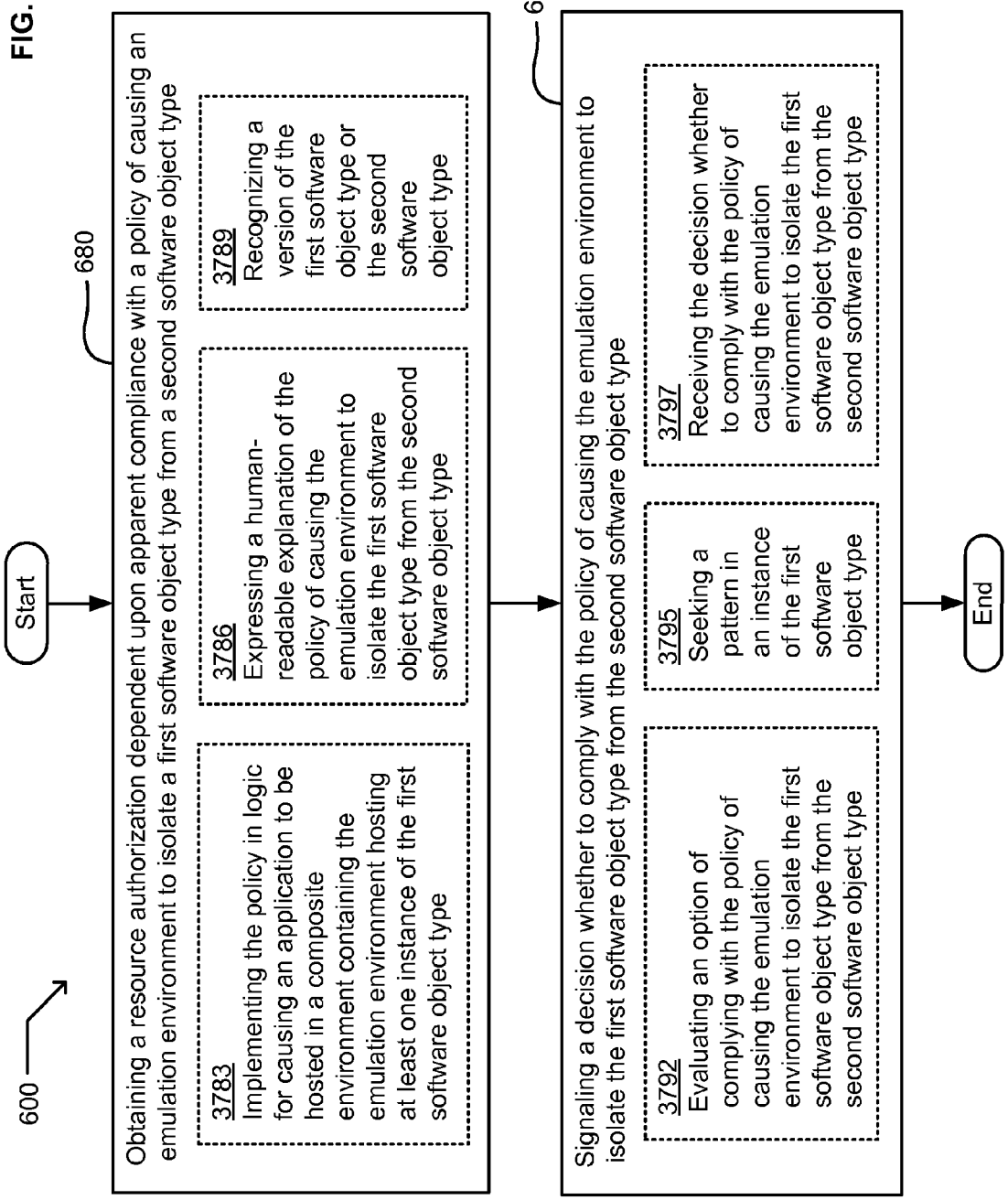

With reference now to FIG. 37, there are shown several variants of the flow 600 of FIG. 6 or 36. Operation 680—obtaining a resource authorization dependent upon apparent compliance with a policy of causing an emulation environment to isolate a first software object type from a second software object type—may include one or more of the following operations: 3783, 3786, or 3789. Operation 690—signaling a decision whether to comply with the policy of causing the emulation environment to isolate the first software object type from the second software object type—may include one or more of the following operations: 3792, 3795, or 3797.

Operation 3783 describes implementing the policy in logic for causing an application to be hosted in a composite environment containing the emulation environment hosting at least one instance of the first software object type (e.g. implementation logic 2290 implementing the isolation policy as policy definition 2291, causing application 2307 to be hosted in a composite environment). In a variant in which environment 2265 is a composite environment, for example, component environment 2262 can optionally host application object 2305 natively while component environment 2263 hosts application object 2306 by emulation.

Operation 3786 describes expressing a human-readable explanation of the policy of causing the emulation environment to isolate the first software object type from the second software object type (e.g. user interface 2295 displaying or playing explanation 2298 that resource authorization 2277 is contingent upon isolating "A" type software 2301). In some circumstances, user interface 2295 subsequently transmits a response 2299, either as received from a user or as a default, which resource authorization 2277 can then take as the apparent compliance or as a refusal to comply.

Operation 3789 describes recognizing a version of the first software object type or the second software object type (e.g. version recognition circuitry 2276 distinguishing among versions of "A" type software 2301 or "D" type software 2304 by version identifiers 2372, 2374). Alternatively or additionally, a version of "C" type software 2303 can be recognized in some variants by one or more of provider identifier 2363, date or other header information, behavior, configuration, or the like.

Operation 3792 describes evaluating an option of complying with the policy of causing the emulation environment to isolate the first software object type from the second software object type (e.g. cost evaluation logic 2247 estimating a monetary, temporal, or other potential resource dispensation, opportunity cost, or the like in association with complying with the policy). Such an evaluation can be obtained as an actual hourly or other flat fee for a peripheral or other resource access, a substitute cost or other comparable resource cost, a number of computations or minutes, an amount of space, a fractional loss in server or other hardware performance, a risk evaluation, or the like. Modeling logic 2257 for generating such valuations can provide one or more suitable determinants/components, which can then be compared or otherwise arithmetically or logically distilled by cost evaluation logic 2247. The distillation can help to explain one or more options to facilitate a user deciding, for example, or can be manifested as an automatic generation of a default response 2256 or of the decision 2248 of operation 690.

Operation 3795 describes seeking a pattern in an instance of the first software object type (e.g. pattern recognition circuitry 2228 seeking one or more instances of provider identifiers 2361, 2362, version identifiers 2372, 2374, or other search terms 2227 to identify or characterize a sequence of instructions as being of the "first" type). Such seeking can help locate the pattern(s), for example, in contexts in which one or more can occur in several locations within an application. This can provide a mode of identifying the "first" type, for example, as a complement to one or more of operations 3783, 3682, 3684, or 3685.

Operation 3797 describes receiving the decision whether to comply with the policy of causing the emulation environment to isolate the first software object type from the second software object type (e.g. port 2258 receiving a reply 2245 from a client or other external source manifesting an indication of non-compliance). In some embodiments, for example, such a reply may be received after query logic 2244 asks the client to indicate the decision in some fashion: by accepting code implementing a conditional resource authorization (in a device driver or driver update module, for example), by taking no action (in a "default=yes" or "default=no" context), by transmitting a device setting configuration indicating the policy compliance, or the like. This can occur, for example, in embodiments in which one or more of access controller 2270 or environment 2265 performs operation 680 and in which signaling circuitry 2210 performs operation 690.

Figure 38:
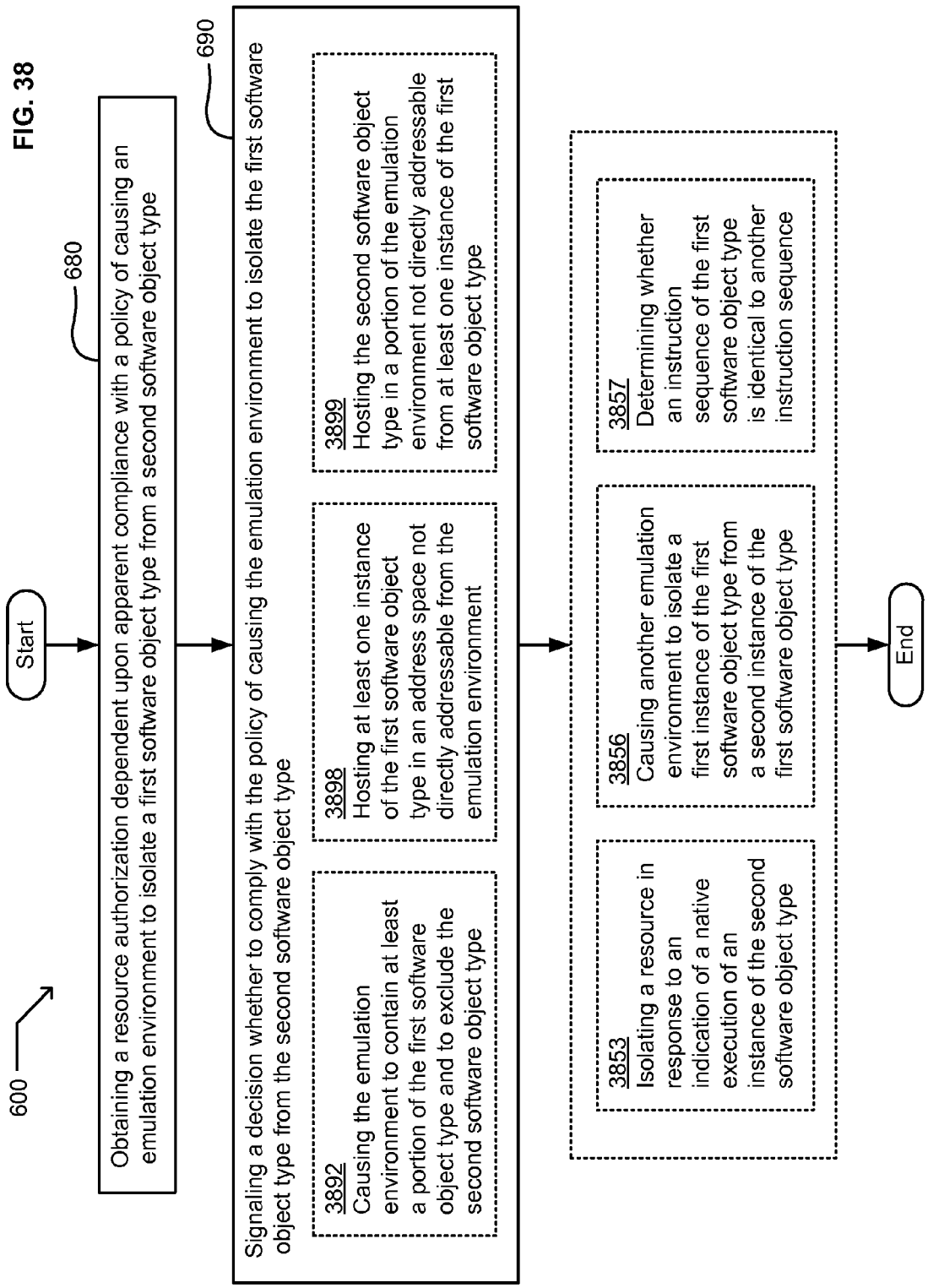

With reference now to FIG. 38, there are shown several variants of the flow 600 of FIG. 6, 36, or 37. Operation 690—signaling a decision whether to comply with the policy of causing the emulation environment to isolate the first software object type from the second software object type—may include one or more of the following operations: 3892, 3898, or 3899. Alternatively or additionally flow 600 may likewise include one or more of operations 3853, 3856, or 3857—each depicted after operation 690 but optionally performed concurrently with it, or in other orders.

Operation 3892 describes causing the emulation environment to contain at least a portion of the first software object type and to exclude the second software object type (e.g. emulator 2460 causing environment 2462 to contain at least object 2383 of "B" type and no "A" type software 2301).

Operation 3898 describes hosting at least one instance of the first software object type in an address space not directly addressable from the emulation environment (e.g. emulator 2470 hosting object 2381 of "A" type in address space 2474, which cannot be addressed by any object placed into any portion of emulation environment 2482). This can occur, for example, in embodiments in which compliance with the policy is signaled by emulator 2480 using environment 2482 to isolate "A" type software 2301 from some or all other software.

Operation 3899 describes hosting the second software object type in a portion of the emulation environment not directly addressable from at least one instance of the first software object type (e.g. emulator 2480 hosting one or more objects of "D" type software 2304 in address space 2487, which cannot be addressed by object 2476 hosted by emulator 2470). This can occur, for example, in a context in which object 2381 (of "A" type software 2301) contains or is contained within an instance of object 2476 in address space 2474. This can optionally work as detailed above with reference to operation 3898, for instance.

Operation 3853 describes isolating a resource in response to an indication of a native execution of an instance of the second software object type (e.g. resource authorization 2437 denying some or all of processing circuitry 2450 access to resource 2491 in response to any indication that environment 2462 permitted any instruction sequence of "B" type software 2302 to execute natively). Each such isolation can be permanent or temporary, complete or partial, and conditional or otherwise. For example, any instruction sequence of "C" type executing natively in address space 2464 (object 2465, e.g.) can optionally cause some environments of processing circuitry 2450 (all except environment 2462, e.g.) to be isolated from resource 2491 until resource authorization 2437 is reset. Alternatively or additionally, any instruction sequence of "D" type (e.g. object 2384) executing natively in address space 2467 can optionally force any objects in environment 2462 to use resource 2492 instead, permanently.

Operation 3856 describes causing another emulation environment to isolate a first instance of the first software object type from a second instance of the first software object type (e.g. routing controller 2420 implementing configuration 2421 so that emulation environment 2482 hosts an instance of object 2306 even while another instance of object 2306 or other "B" type software 2302 executes elsewhere in processing circuitry 2450). This can occur, for example, in variants in which environment 2482 is suitably isolated from one or more other virtual or physical environments of processing circuitry 2450.

Operation 3857 describes determining whether an instruction sequence of the first software object type is identical to another instruction sequence (e.g. sequence comparator 2496 comparing "A" type object 2382 with object 2466). In some embodiments, for example, such a determination may dictate that the "other" instruction sequence is "A" type (if identical) or is of an "unknown" type (if not identical).

Figure 39:
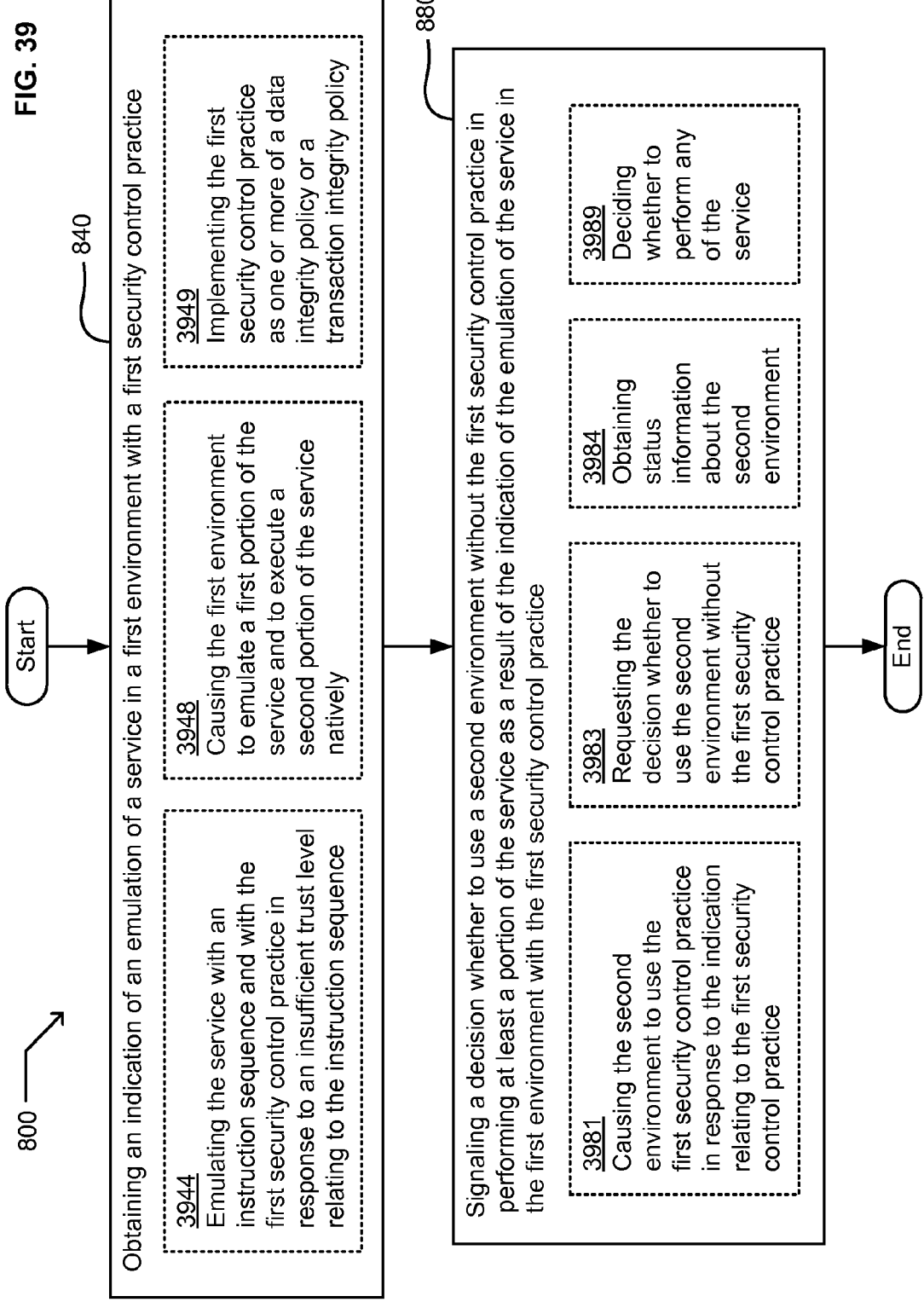
FIGS. 39-40 depict variants of the flow of FIG. 8.

With reference now to FIG. 39, there are shown several variants of the flow 800 of FIG. 8. Operation 840—obtaining an indication of an emulation of a service in a first environment with a first security control practice—may include one or more of the following operations: 3944, 3948, or 3949. Operation 880—signaling a decision whether to use a second environment without the first security control practice in performing at least a portion of the service as a result of the indication of the emulation of the service in the first environment with the first security control practice—may include one or more of the following operations: 3981, 3983, 3984, or 3989.

Operation 3944 describes emulating the service with an instruction sequence and with the first security control practice in response to an insufficient trust level relating to the instruction sequence (e.g. testing logic 2594 causing emulator 2550 to host instruction sequence 2543 in environment 2557 with policy logic 2552 in response to a risk evaluation above a maximum threshold). Testing logic 2594 can receive an indicator of the trust level (or its determinants) from outside system 2500, for example. Alternatively or additionally, testing logic 2594 can establish or refine a trust indicator in response to one or more earlier performances of instruction sequence 2543. In some variants, the trust indicator may be vector valued, comprising more than one of a logic error risk level, a malicious code trust level indicator, an authenticity confidence level, or the like.

Operation 3948 describes causing the first environment to emulate a first portion of the service and to execute a second portion of the service natively (e.g. configuration circuitry 2549 loading instruction sequence 2541 into an emulation portion of environment 2557, loading instruction sequence 2543 into a physical portion of environment 2557, and causing environment 2557 to execute software 2540 accordingly). Such a configuration may be advantageous for identifying defects in software 2540, for example, by permitting breakpoints or other extra tracking during the emulation of sequence 2541 without a loss of performance corresponding to a full emulation of software 2540.

Operation 3949 describes implementing the first security control practice as one or more of a data integrity policy or a transaction integrity policy (e.g. policy selection logic 2503 selecting a data integrity policy in policy logic 2552 for use in emulator 2550). Alternatively or additionally, policy selection logic 2503 can select a data integrity policy of practices 2506 for use in policy logic 2552. In some variants, the implementation can be performed by copying a reference to or code embodying software implementation of the practice, optionally with one or more other practices for use in emulator 2550.

Operation 3981 describes causing the second environment to use the first security control practice in response to the indication relating to the first security control practice (e.g. invocation logic 2515 triggering emulator 2580 to use at least a selected one of practices 2507 as policy logic 2582 for hosting environment 2587). In some embodiments, the selected practice can arise in response to one or more of an error or other anomaly, a configuration or static attribute of the first environment, an aspect of the first security control practice, or the like. Alternatively or additionally, the practice can be selected as a highest-ranked one of a list of practices (excluding "tried" practices such as the "first" security control practice).

Operation 3983 describes requesting the decision whether to use the second environment without the first security control practice (e.g. policy logic 2572 asking security module 2509 for instructions about whether any new practices 2508 should be applied in environment 2577). Alternatively or additionally, security module 2509 or policy logic 2572 can request an instruction sequence 2543 identifying or defining which practices should be applied.

Operation 3984 describes obtaining status information about the second environment (e.g. emulator 2560 monitoring one or more services and their results in environment 2567). The status information can include one or more of a loading level, a task list, a resource inventory, a registry state, a recent event record, or other information that is current when it is initially obtained. Alternatively or additionally, sensor 2592 can likewise obtain such information, in real time or at some later time, optionally providing it to an aggregator as described herein.

Operation 3989 describes deciding whether to perform any of the service (e.g. firewall 2548 deciding that system 2500 will not perform any of instruction sequence 2542, or will not perform it in emulator 2570, or will only perform it with policy logic 2562, at least initially, in response to information indicating that sequence 2542 apparently has no history, certification, or other credentials). For example, the information (or apparent lack thereof) can be received through firewall 2548 with sequence 2542. This can occur, for example, in embodiments in which aggregation module 2590 performs operation 840 and in which signaling logic 2518 and firewall 2548 jointly perform operation 880.

Figure 40:
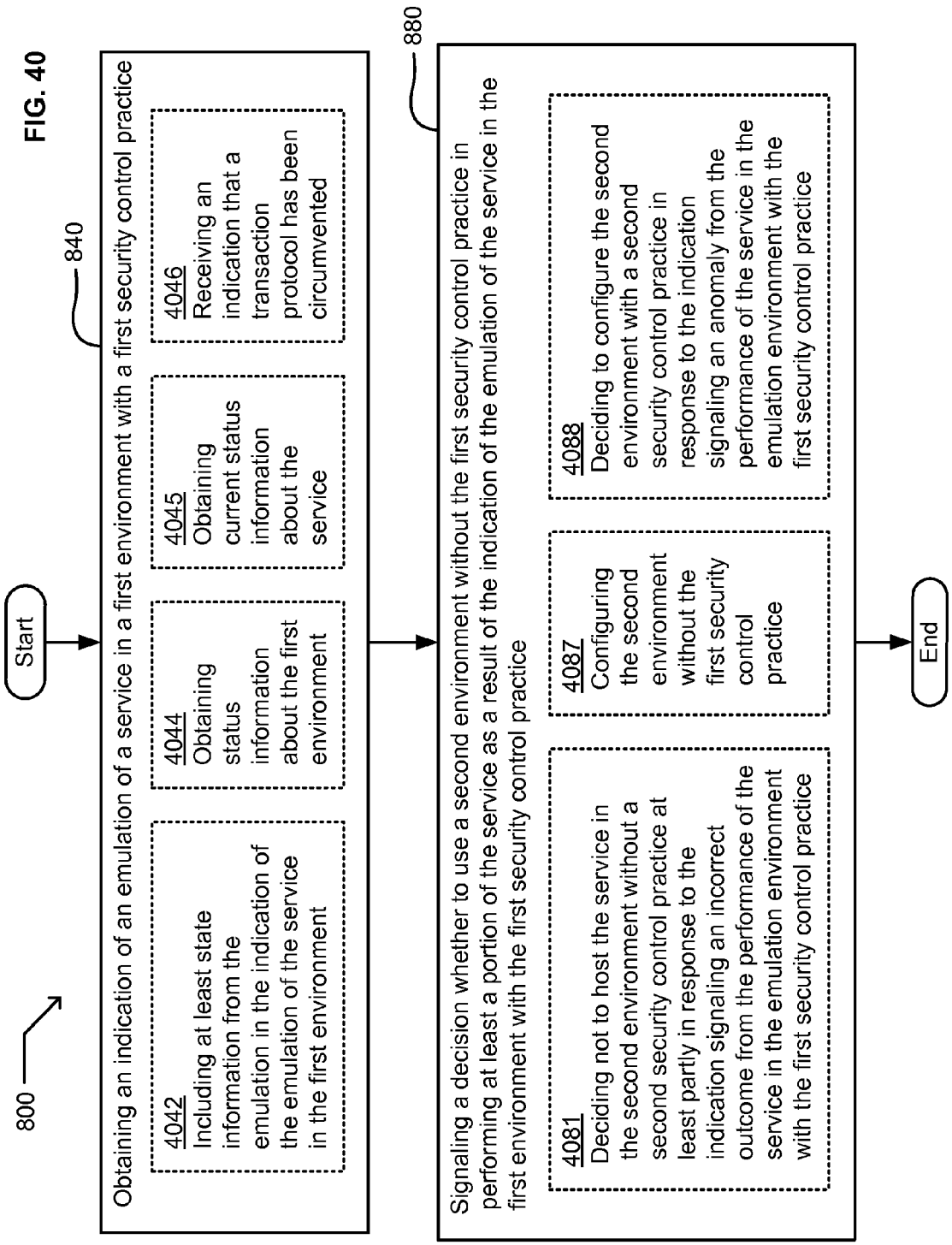

With reference now to FIG. 40, there are shown several variants of the flow 800 of FIG. 8 or 39. Operation 840—obtaining an indication of an emulation of a service in a first environment with a first security control practice—may include one or more of the following operations: 4042, 4044, 4045, or 4046. The service can, for example, comprise executing sequence 1725 or the like, optionally including one or more other sequences as described herein. Operation 880—signaling a decision whether to use a second environment without the first security control practice in performing at least a portion of the service as a result of the indication of the emulation of the service in the first environment with the first security control practice—may include one or more of the following operations: 4081, 4087, or 4088.

Operation 4042 describes including at least state information from the emulation in the indication of the emulation of the service in the first environment (e.g. emulation manager 2502 providing registry values 2596 or a call stack indicative of a state of a process hosted in environment 2577). Some or all of the process can be emulated, or can have been emulated, for example, in environment 2577. Such state information can be useful for characterizing an error (as repeatable or not, e.g.), for spawning variants of the emulation, for determining which software objects in an environment are associated with an anomalous event, for performing speculative executions, or the like.

Operation 4044 describes obtaining status information about the first environment (e.g. system manager 2501 receiving a loading indication, a service listing, a progress report, or the like from some or all of environment 2577). Alternatively or additionally, a network monitor can monitor or aggregate such information from one or more instances of system 300 in a common network.

Operation 4045 describes obtaining current status information about the service (e.g. server 2546 detecting that instruction sequence 2541 currently has a low trust level or has recently been correlated with a higher-than-nominal rate of anomalies in its physical environment, which uses the first security control practice). The practice can include one or more of a data redundancy scheme, an intrusion detection system, firewall 2548, or the like. In some variants, emulation manager 2502 can likewise perform operation 4045 (e.g. by obtaining the information from server 2546) and then complete operation 840 (e.g. by causing emulator 2570 to host sequence 2541 with an emulated practice like the first security control practice).

Operation 4046 describes receiving an indication that a transaction protocol has been circumvented (e.g. sensor 2591 detecting a transaction or other interaction record 2597 for which there is not a corresponding authorization or other support record 2598). Alternatively or additionally, sensor 2591 can be configured to detect any of several types of violations of protocols such as may be implemented in virtual private networks. See, e.g., U.S. Pat. Pub. No. 2006/0010492 ("Method and Apparatus for Monitoring Computer Network Security Enforcement") filed 10 Jun. 2002.

Operation 4081 describes deciding not to host the service in the second environment without a second security control practice at least partly in response to the indication signaling an incorrect outcome from the performance of the service in the emulation environment with the first security control practice (e.g. policy logic 2504 causing one or more new practices 2505 to be used in environment 2577 when emulating or otherwise executing sequence 2543 there, in response to a prior incorrect result from emulating sequence 2543 in environment 2587 without practices 2505). The new practices 2505 may optionally include confirming a correct output from sequence 2543 in a special case, or at least an absence of an error event, for example, before generating other output. (In some embodiments, an "outcome" of a process, input set, or other operational object can include a termination time, an error message, a functional result, or the like resulting from one or more instances of the object. A single outcome can likewise "result from" each of two or more such objects jointly causing the outcome as well.)

Operation 4087 describes configuring the second environment without the first security control practice (e.g. emulator 2580 configuring environment 2587 without one or more practices 2505 used in the first environment). Alternatively or additionally, signaling logic 2518 can likewise signal the decision before (or without) actually configuring the second environment.

Operation 4088 describes deciding to configure the second environment with a second security control practice in response to the indication signaling an anomaly from the performance of the service in the emulation environment with the first security control practice (e.g. emulator 2570 or some portion of security module 2509 deciding to use policy logic 2572 in configuring environment 2577 for sequence 2542, the decision being in response to an anomalous completion of sequence 2542 in environment 2567 with policy logic 2562). The anomalous completion may be marked by an abnormally slow or fast task completion, by a memory leakage event, by an error or incorrect result, or the like as described herein.

Figure 41:
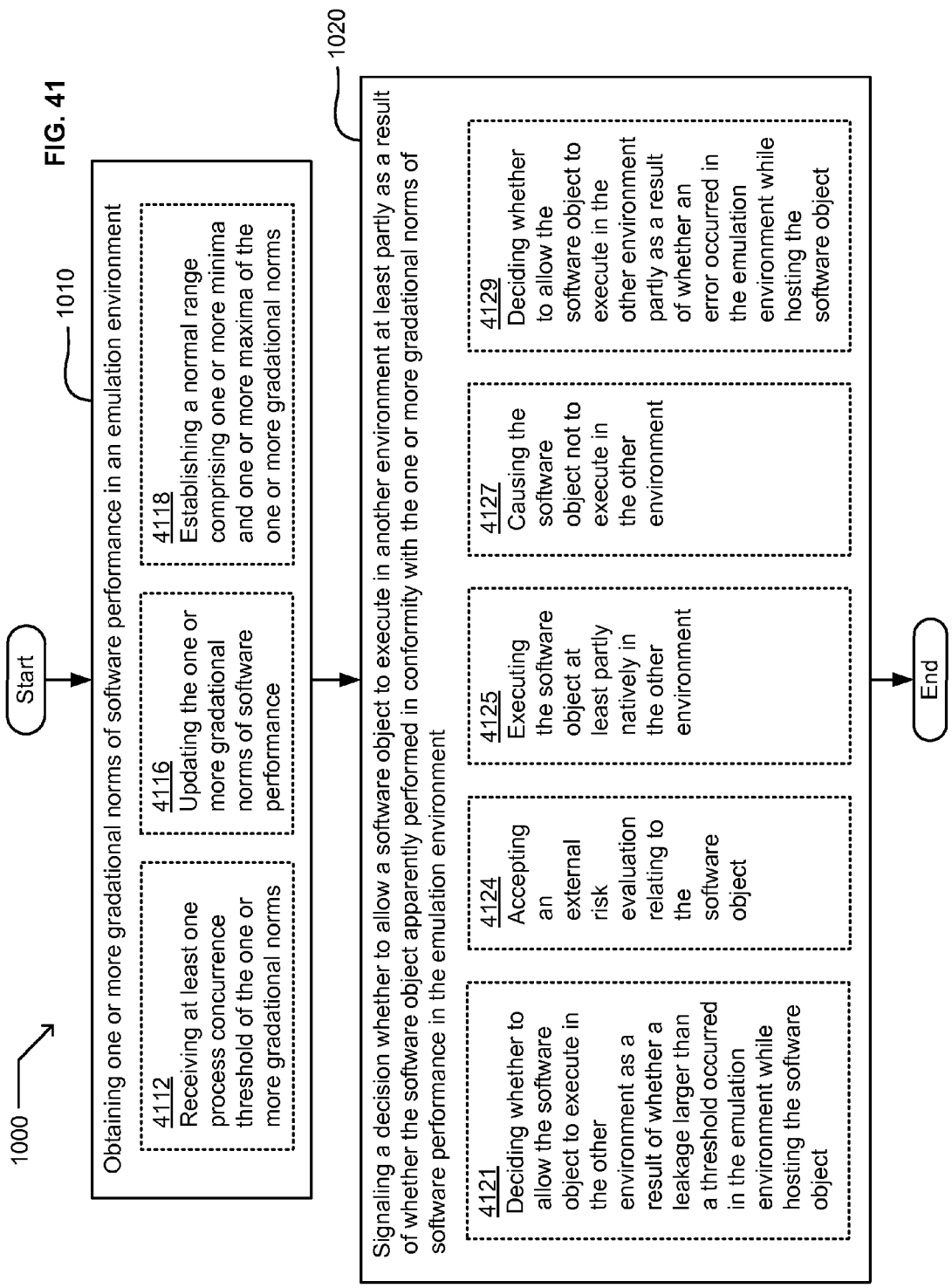
FIG. 41 depicts variants of the flow of FIG. 10.

With reference now to FIG. 41, there are shown several variants of the flow 1000 of FIG. 10. Operation 1010—obtaining one or more gradational norms of software performance in an emulation environment—may include one or more of the following operations: 4112, 4116, or 4118. Operation 1020 signaling a decision whether to allow a software object to execute in another environment at least partly as a result of whether the software object apparently performed in conformity with the one or more gradational norms of software performance in the emulation environment—may include one or more of the following operations: 4121, 4124, 4125, 4127, or 4129.

Operation 4112 describes receiving at least one process concurrence threshold of the one or more gradational norms (e.g. port 2934 receiving an artificial limit 2926 governing how many processes object 2905 may permissibly use without becoming a substantial burden). In some embodiments, for example, object 2905 will not be routed to environment 2977 (at operation 1020) if object 2905 ever employs more processes than limit 2926 in environment 2997.

Operation 4116 describes updating the one or more gradational norms of software performance (e.g. update logic 2932 providing incremental change(s) 2928 to one or more maxima 2924 to be applied by filter 2907, or a replacement module 2908 as an updated version of filter 2907). This can occur, for example, in embodiments in which filter 2907 initially contains or refers to the gradational norm(s) of software performance used in the emulation environment and in which aggregation module 2900 performs operation 1010 as described herein.

Operation 4118 describes establishing a normal range comprising one or more minima and one or more maxima of the one or more gradational norms (e.g. retrieval circuitry 2955 causing filter 2942 to implement a determination of whether a time or frequency of a detectable event falls between X—R/2 and X+R/2, where X is a nominal or expected value and R is a range defining an allowable deviation from X). For example, retrieval circuitry 2955 can provide specific values of X and R to filter 2942, optionally configured to determine whether the event or frequency of software performance falls within this range. In some variants, the gradational norms can include one or more additional minima 2923 relating to a resource consumed in the software performance.

Operation 4121 describes deciding whether to allow the software object to execute in the other environment as a result of whether a leakage larger than a threshold occurred in the emulation environment while hosting the software object (e.g. routing logic 2646 deciding whether to route object 2638 to environment 2681 at least partly based on whether resource monitor detected a memory leakage rate 2627 or other leakage indicator larger than threshold 2629 in the emulation environment). In some embodiments, for example, environment 2987 can implement the emulation environment. This can occur, for example, in embodiments in which aggregation module 2900 (in one or more instances) performs operation 1010 and in which signaling module 2600 performs operation 1020.

Operation 4124 describes accepting an external risk evaluation relating to the software object (e.g. arbiter 2644 confirming that a trusted external system 9xx generated message 2623 or other information associating risk evaluation 2621 with identifier 2622 of software 2630 or software object 2634). Such an evaluation can, for example, arrive either a priori or after request logic 2645 transmits a request for such information to such an external system. Arbiter 2644 can, in some embodiments, indicate that the software object did not conform with the gradational norm(s) in response to a high risk evaluation. Alternatively or additionally, arbiter 2644 can be configured to respond to an external indication of moderate risk by cause the software to be tested by emulation within signaling module 2600.

Operation 4125 describes executing the software object at least partly natively in the other environment (e.g. processor 2672 executing one instruction sequence 2631 of object 2633 natively and another instruction sequence 2632 of object 2633 by emulation). This can occur, for example, in embodiments in which environment 2671 comprises the emulation environment and in which environment 2681 comprises the "other" (partially emulated) environment.

Operation 4127 describes causing the software object not to execute in the other environment (e.g. firewall 2649 preventing object 2637 from placement or execution in environment 2681). Alternatively or additionally, the prevention can be conditional or temporary, such as by causing the placement or execution of object 2637 not to occur anywhere in signaling module 2600 unless or until a suitably isolated environment is created. Such implementations can occur, for example, in embodiments in which signaling module 2600 performs operation 1020 or in which aggregation module 2900 performs operation 1010.

Operation 4129 describes deciding whether to allow the software object to execute in the other environment partly as a result of whether an error occurred in the emulation environment while hosting the software object (e.g. security logic 2648 deciding that environment 2681 will not host object 2638 if exception handler 2647 detects a fatal error 2625 from object 2638 or object 2635 in environment 2671). Alternatively or additionally, in some variants of security logic 2648, whether environment can host object 2638 can depend partly or entirely upon whether object 2639 exists in environment 2671 or environment 2681.

Figure 42:
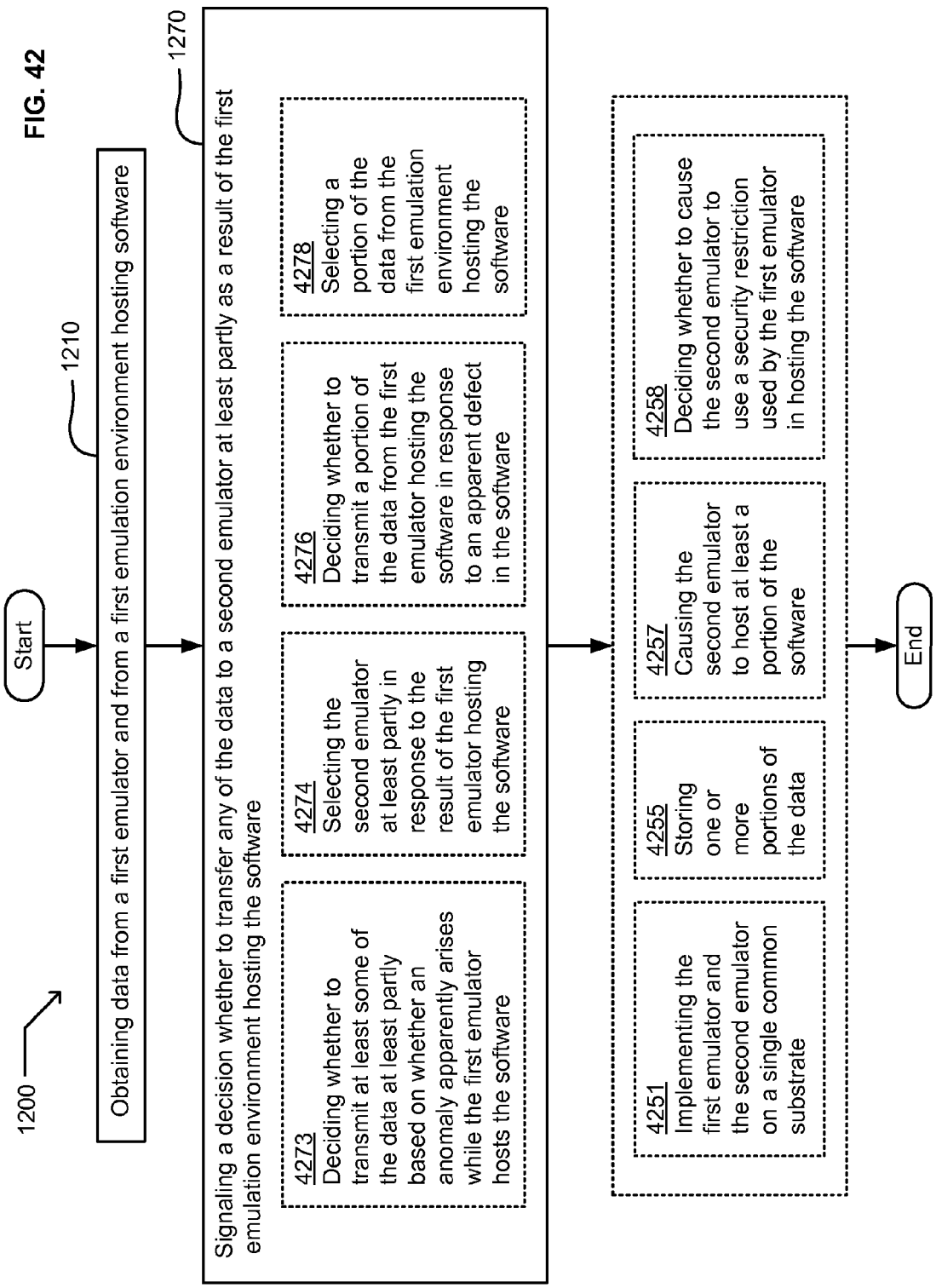
FIGS. 42-44 depict variants of the flow of FIG. 12.

With reference now to FIG. 42, there are shown several variants of the flow 1200 of FIG. 12. Operation 1270—signaling a decision whether to transfer any of the data to a second emulator at least partly as a result of the first emulation environment hosting the software—may include one or more of the following operations: 4273, 4274, 4276, or 4278. Alternatively or additionally flow 1200 may likewise include one or more of operations 4251, 4255, 4257, or 4258—each depicted after operation 1270 but optionally performed concurrently with it, or in other orders.

Operation 4273 describes deciding whether to transmit at least some of the data at least partly based on whether an anomaly apparently arises while the first emulator hosts the software (e.g. security logic 2756 deciding whether to transfer address or state information from environment 2774 to environment 2784 based on the anomaly having arisen as environment 2774 hosts instruction sequence 2703 as process 2777). The decision may be based on prior knowledge that environment 2784 has one or more uncertified services or other risk-indicative objects that environment 2774 does not, for example, or some other indication that environment 2784 is not as safe as environment 2774 in some aspect. The decision may likewise depend on other factors: whether any other objects 2775 in environment 2774 include sensitive information, whether the anomaly is characteristic of malicious code, whether the destination environment is more suitable for hosting sequence 2703, or the like.

In some variants, the source or destination environments can be configured with a security restriction that relates to the anomaly. Watermark data may be provided in response to an indication of improper reading, for example, as described herein. Resource access may likewise be limited or denied in response to excessive loading. Conversely one or more such restrictions may be omitted in a destination environment in response to a sufficient interval of trustworthy behavior or an indication that other software apparently cause the anomaly.

Operation 4274 describes selecting the second emulator at least partly in response to the result of the first emulator hosting the software (e.g. router 2750 choosing among two or more emulators 2769, 2779 in response to result 2788 obtained from emulator 2789 hosting instruction sequence 2703). For example, router 2750 may generate selection 2752 identifying one or more target emulators in response to an event category or description arising in result 2788 (one emulator for malicious-code-indicative or memory-error-indicative results, another for an absence of such an indication, e.g.). In some variants, selection 2752 can specify emulator 2779, optionally with objects 2775 usable for error analysis, in response to router 2750 detecting error indication 2727 in result 2788. These configurations can occur, for example, in embodiments in which one or more instance of signaling module 2740 perform operation 1270.

Operation 4276 describes deciding whether to transmit a portion of the data from the first emulator hosting the software in response to an apparent defect in the software (e.g. filter 2754 transmitting some of result 2768 from emulator 2769 in response to defect-indicative event descriptors therein). Deterministic and non-progressive failures in emulator 2769 executing instruction sequence 2704, for example, can indicate one such type of apparent defect.

Operation 4278 describes selecting a portion of the data from the first emulation environment hosting the software (e.g. mode logic 2847 selecting portion 2808 of data 2809). In some embodiments, portion 2808 can include one or more data segments of raw data, for example, or one or more evaluations or other distillations of raw data. The portion can be a portion to be transferred or a portion used in deciding whether to transfer some of the data as described herein, for example. In another mode of performing operation 1270, of course, the decision signals whether to transfer the whole of the data 2809 and depends upon each portion of the obtained data.

Operation 4251 describes implementing the first emulator and the second emulator on a single common substrate (e.g. processor 2762 and processor 2772 respectively implementing emulator 2769 and emulator 2779 on a single chip). In some embodiments, system 2700 can be implemented on a single shared chip, for example.

Operation 4255 describes storing one or more portions of the data (e.g. storage module 2711 copying at least some of the data to non-volatile medium 2712). Alternatively or additionally, the decision or other information derived from the data can be stored in or on the medium. In some variants, such information can be used in or as an operational history. The history can be arranged and stored, for example, as a lookup table from which a retrieval function returns a historical performance indicator accessed according to an object type and an emulation configuration.

Operation 4257 describes causing the second emulator to host at least a portion of the software (e.g. allocation logic 2718 causing emulator 2769 to execute instruction sequence 2702). In some contexts, such executions can occur before, during, interleaved with, or depending upon the data transmission. Alternatively or additionally, the manner of execution can be affected by the content of data transmitted in some embodiments. In one instance, the data can affect a configuration of emulator 2769 such as by defining or refining one or more of the resources or checkpoints of emulation. Likewise, the data can optionally define events or other software objects 2765 speculatively relating to a result of instruction sequence 2701 executing in environment 2764. See, e.g., Michael E. Locasto et al. ("Speculative Execution as an Operating System Service") at http://mice.cs.columbia.edu/getTechreport.php?techreportID=407.

Operation 4258 describes deciding whether to cause the second emulator to use a security restriction used by the first emulator in hosting the software (e.g. invocation module 2715 instructing emulator 2789 to omit the security restriction in response to result 2778 indicating that software 2706 appeared to be trustworthy in environment 2774). This can occur, for example, in embodiments in which signaling module 2740 performs operation 1270, in which emulator 2779 implements the "first" emulator (operable with security restriction 2716), and in which emulator 2789 implements the "second" emulator (operable with or without security restriction 2716).

Figure 43:
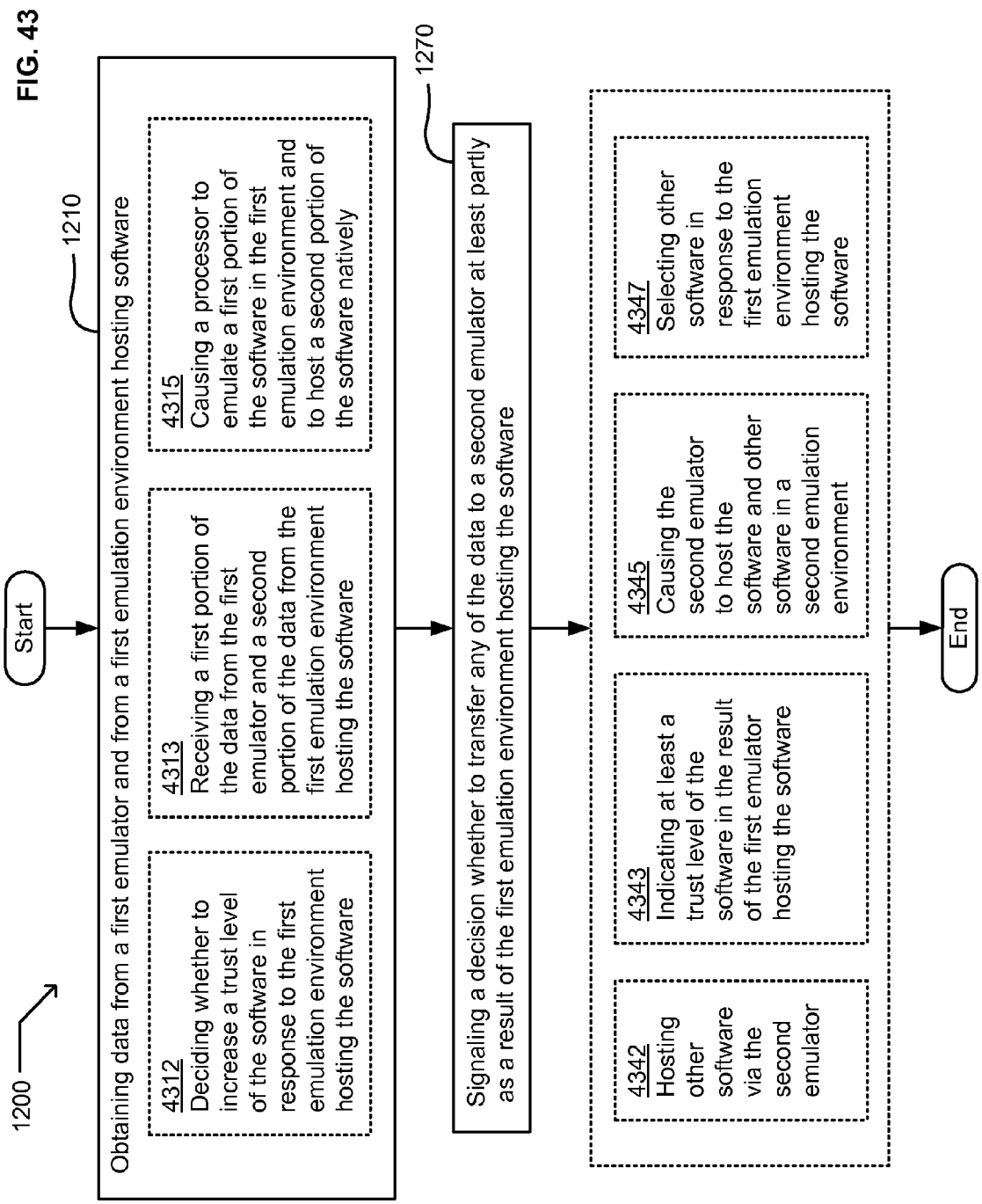

With reference now to FIG. 43, there are shown several variants of the flow 1200 of FIG. 12 or 42. Operation 1210—obtaining data from a first emulator and from a first emulation environment hosting software—may include one or more of the following operations: 4312, 4313, or 4315. Alternatively or additionally flow 1200 may likewise include one or more of operations 4342, 4343, 4345, or 4347—each depicted after operation 1270 but optionally performed concurrently with it, or in other orders.

Operation 4312 describes deciding whether to increase a trust level of the software in response to the first emulation environment hosting the software (e.g. evaluation module 2815 adjusting a default or other prior evaluation 2807 in data 2809 to indicate a higher trust level in association with sequence 2866). This can occur, for example, in response to one or more of sequence 2866, session 2867, user 2868, or other aspect of environment 2864 performing consistently with a respective behavior model, such as by manifesting an error rate below a nominal threshold, by completing tasks on time, by performing a required amount of work, or by meeting one or more other performance-indicative requirements 2816.

Operation 4313 describes receiving a first portion of the data from the first emulator and a second portion of the data from the first emulation environment hosting the software (e.g. port 2818 receiving segment C025 from emulator 2879 and segment C024 from sequence 2876 or otherwise from within environment 2874). This can occur, for example, in embodiments in which one or more portions of system 2800 perform operation 1210 and in which (one or more) signaling modules 2740, 2840 perform operation 1270. In some variants, the data can likewise include logical or arithmetic combinations or other hybrids of such portions: a Boolean indication of whether any of the portions indicated an error, a count of them, a textual summary, or the like.

Operation 4315 describes causing a processor to emulate a first portion of the software in the first emulation environment and to host a second portion of the software natively (e.g. task manager 2817 triggering processor 2892 to generate respective portions of data 2809 from software sequence 2893 in environment 2891 and from software sequence 2895 in environment 2894). This can occur, for example, in variants in which environment 2891 is emulated and in which environment 2894 is native, or vice versa. In some embodiments, a hosting mode for each of the sequences 2892, 2895 is selected at least partly based on an earlier iteration of operation 1210.

Operation 4342 describes hosting other software via the second emulator (e.g. processor 2882 causing emulator 2889 to host at least sequences 2886, 2887 in environment 2874). This can occur, for example, in embodiments in which emulators 2879, 2889 are the "first" and "second" emulators respectively, and in which sequence 2887 is not used in environment 2874. Operation 4342 can be diagnostically useful, for example, in a context in which either of these sequences is suspected of affecting the other, in which either lacks a suitable certification, in which either is or resembles software of critical importance, or the like.

Operation 4343 describes indicating at least a trust level of the software in the result of the first emulator hosting the software (e.g. analyzer 2940 generating level 2919 of trust as an integer or other evaluation of the behavior of segment 2912 in environment 2774). See, e.g., U.S. Pat. Pub. No. 2005/0066195 ("Factor Analysis of Information Risk") filed 6 Aug. 2004. Alternatively or additionally, such an evaluation from analyzer 2940 can be used as a determinant in making the decision of operation 1270.

Operation 4345 describes causing the second emulator to host the software and other software in a second emulation environment (e.g. processor 2882 causing emulator 2889 to host sequence 2876 with sequence 2888). This can occur, for example, in embodiments in which operation 1210 includes environment 2874 hosting sequence 2876 but not sequence 2888, in which one or more portions of system 2800 perform operation 1210, and in which signaling modules 2740, 2840 perform operation 1270.

Operation 4347 describes selecting other software in response to the first emulation environment hosting the software (e.g. selection logic 2814 selecting sequence 2877 in response to environment 2894 hosting sequence 2895). The selection of sequence 2877 over sequence 2878 or other software for use in environment 2874 can be based on the actual or intended presence of sequence 2877 in another environment. The other environment may be a physical environment in which the software (of operation 1210, e.g.) may need to coexist with sequence 2877, for example, or may be an environment in which an anomaly as described herein has been detected in the presence of sequence 2877.

Figure 44:
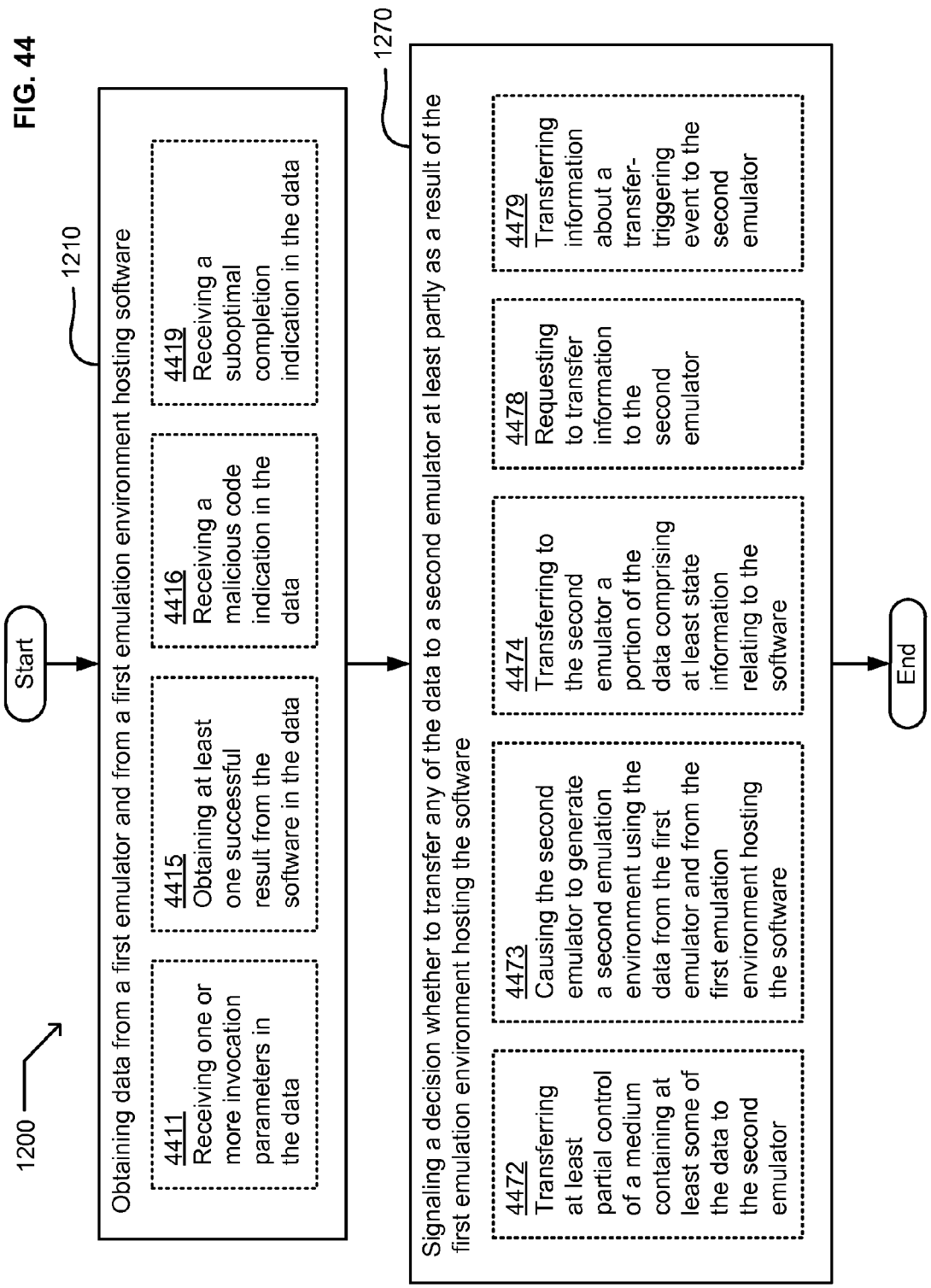

With reference now to FIG. 44, there are shown several variants of the flow 1200 of FIG. 12, 41, or 43. Operation 1210—obtaining data from a first emulator and from a first emulation environment hosting software—may include one or more of the following operations: 4411, 4415, 4416, or 4419. Operation 1270—signaling a decision whether to transfer any of the data to a second emulator at least partly as a result of the first emulation environment hosting the software—may include one or more of the following operations: 4472, 4473, 4474, 4478, or 4479.

Operation 4411 describes receiving one or more invocation parameters in the data (e.g. input 2950 receiving message 2952 indicating a function or procedure call with at least one numeric or other parameter 2902 as provided to invoke software 2909). In some embodiments, such parameters can likewise be received after such a call is performed, optionally as elements of state information as described herein.

Operation 4415 describes obtaining at least one successful result from the software in the data (e.g. sensor 2944 detecting a normal completion of a program call, a normal computation result, or other condition 2918 not indicative of an execution fault or process suspension). This can occur, for example, in embodiments in which (at least) aggregation module 2900 performs operation 1210.

Operation 4416 describes receiving a malicious code indication in the data (e.g. sensor 2945 detecting a pattern 2915 in data 2916 indicative of a known virus or worm). Other conditions can sometimes constitute a malicious code indication 2917, such as an aggressive behavior (making unauthorized contacts, prolific loading, self-modifying code, or the like) or a worsening and nondeterministic pattern of performance. In some embodiments, at least one sensor 2946 is configured to detect such behavioral indications.

Operation 4419 describes receiving a suboptimal completion indication in the data (e.g. analyzer 2940 detecting a data or timing pattern indicative of a sequence 2901 performing worse than a benchmark 2943 of performance for the sequence 2901 under like conditions). Analyzer 2940 can, for example, be configured to detect a completion time relative to a best completion time, a correct or normal completion percentage, or to some other suitable benchmark known in the art or suggested herein.

Operation 4472 describes transferring at least partial control of a medium containing at least some of the data to the second emulator (e.g. media manager 2744 mapping storage or memory region 2723 containing data segment 2722 into environment 2784 as a mode of transferring parameter value 2721 of segment 2722 from environment 2764). Optionally, environment 2764 can maintain full or partial access to region to facilitate other data transfer even after operation 4472.

Operation 4473 describes causing the second emulator to generate a second emulation environment using the data from the first emulator and from the first emulation environment hosting the software (e.g. control module 2742 triggering emulator 2789 to create environment 2784 as a variant of environment 2774 according to parameters received from emulator 2779). This can occur, for example, in embodiments in which signaling module 2740 includes an instance of control module 2742 and is operable to perform at least operation 1270. Such parameters or other data 2720 can optionally include one or more of emulation parameters of environment 2774, invocation modes or other inputs to the software, outcome information, or the like, as described herein. In some variants, a common portion of software 2706 is permitted to execute contemporaneously (overlapping or interleaving in time, e.g.) in two or more such environments 2774, 2784.

Operation 4474 describes transferring to the second emulator a portion of the data comprising at least state information relating to the software (e.g. stack manager 2743 and processor 2782 cooperatively transferring a call sequence or other state information from emulator 2789 from stack 2728 to another emulator). This can occur, for example, in embodiments in which aggregation logic 2719 and machine 2780 jointly perform operation 1210, and in which at least signaling module 2740 performs operation 1270.

Operation 4478 describes requesting to transfer information to the second emulator (e.g. request logic 2758 sending request 2759 to one or more of emulator 2769, emulator 2779, or server 2755). Such a request can be sent, in some embodiments, in preparation for signaling the decision. Alternatively or additionally, the request itself may affect or signal the decision to proceed with the transfer. In some variants, for example, the decision will depend upon request logic 2758 receiving suitable transfer authorization in a reply from server 2755 or emulator 2779. See, e.g., U.S. Pat. Pub. No. 2006/0259947 ("Method for enforcing a Java security policy in a multi virtual machine system") filed 11 May 2005.

Operation 4479 describes transferring information about a transfer-triggering event to the second emulator (e.g. event monitor 2748 sending emulator 2747 an event category or other indication 2746 of what event(s) triggered the decision to transfer the data). The transfer-triggering event can include an operational result, a data pattern match, a timeout, a fault or other interrupt, or the like, as described herein.

Figure 45:
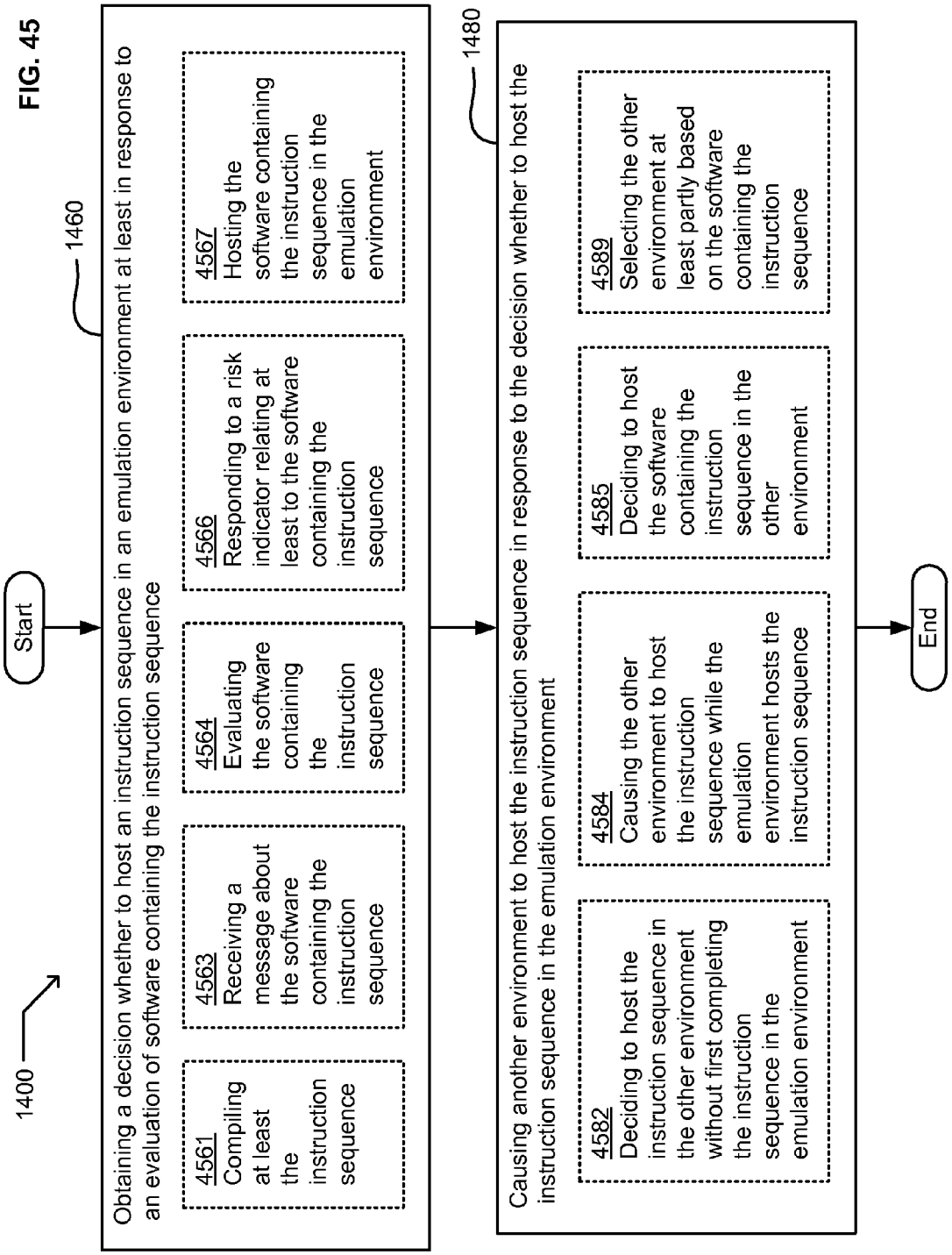
FIGS. 45-46 depict variants of the flow of FIG. 14.

With reference now to FIG. 45, there are shown several variants of the flow 1400 of FIG. 14. Operation 1460—obtaining a decision whether to host an instruction sequence in an emulation environment at least in response to an evaluation of software containing the instruction sequence—may include one or more of the following operations: 4561, 4563, 4564, 4566, or 4567. Operation 1480—causing another environment to host the instruction sequence in response to the decision whether to host the instruction sequence in the emulation environment—may include one or more of the following operations: 4582, 4584, 4585, or 4589.

Operation 4561 describes compiling at least the instruction sequence (e.g. compiler 3192 generating error data 3193 while compiling instruction sequence 3103 from source code or into machine code). See, e.g., U.S. Pat. Pub. No. 2004/0103406 ("Method and Apparatus for Autonomic Compiling of a Program") filed 21 Nov. 2002; and U.S. Pat. Pub. No. 2002/0129335 ("Robust Logging System for Embedded Systems for Software Compilers") filed 18 Dec. 2000. Alternatively or additionally, execution-time data (e.g. errors, resource usages, program results, state data, or the like) can be reflected or used in decisions of where or how the instruction sequence will be hosted.

Operation 4563 describes receiving a message about the software containing the instruction sequence (e.g. port 3121 receiving warnings, recommendations, evaluations, or other input 3124 as described herein about software 3107). Such input can be received via interface 3120 in the embodiment of FIG. 31, as a computer-readable reputation-indicative record, a human-readable warning, sample output from the software, or the like. In some embodiments, a certificate or other trust level indicator relating to the source (device or other party) can likewise be received via interface 3120.

Operation 4564 describes evaluating the software containing the instruction sequence (e.g. rule checker 3196 counting errors in one or more categories arising while executing or otherwise analyzing the software). Alternatively or additionally, the evaluation can provide or automatically result from evaluation data or subjective input from others. See, e.g., U.S. Pat. Pub. No. 2003/0046665 ("Reusable Software Component for Textually Supplementing, Modifying, Evaluating and Processing Procedural Logic for a Compiled Host Program at Run-Time") filed 28 Feb. 2001; U.S. Pat. Pub. No. 2003/0056151 ("Software Evaluation System, Software Evaluation Apparatus, Software Evaluation Method, Recording Medium, and Computer Data Signal") filed 18 Sep. 2002; and U.S. Pat. Pub. No. 2006/0253824 ("Software Evaluation Method and Software Evaluation System") filed 5 Apr. 2006. Those skilled in the art will recognize a variety of techniques for combining such evaluation data, such as by logical or arithmetic combination, in light of these teachings.

Operation 4566 describes responding to a risk indicator relating at least to the software containing the instruction sequence (e.g. policy implementation circuitry 3198 using a default sandbox configuration for instruction sequence 3104 that is not used for other instruction sequences that are suitable for use with critical data). Alternatively or additionally, the implementation circuitry can include a component for migrating or reconfiguring instruction sequence 3104 automatically from one configuration to another at or after an appropriate interval: a minute, an hour, a day, a month, or a year, for example.

Operation 4567 describes hosting the software containing the instruction sequence in the emulation environment (e.g. processor 3172 controllably executing sequence 3103 and sequence 3176 in environment 3174). The manner of execution can be a part of the decision, in some embodiments, such as those in which sequence 3103 obtains access to a resource that sequence 3176 does not, in response to the evaluation. (As described herein, such conditionally-accessible resources can include storage media or other peripheral devices accessible through a network linkage, for example.)

Operation 4582 describes deciding to host the instruction sequence in the other environment without first completing the instruction sequence in the emulation environment (e.g. task manager 3058 spawning a process containing at least an instance of instruction sequence 3004 in each of environment 3094 and environment 3074 so that the two overlap in time). Alternatively or additionally, process 3097 can begin execution of sequence 3004 after one or more successful iterations of sequence 3004 in process 3077. This can occur, for example, in variants in which machine 3090 is configured so that environment 3094 is partly or fully emulated by emulator 3099, as well as variant in which processor 3092 performs sequence 3004 without emulator 3099 (natively). This can occur, for example, in embodiments in which evaluation module 3050 can perform operation 1460 and in which at least the above-mentioned other portions of system 3000 perform operation 1480.

Operation 4584 describes causing the other environment to host the instruction sequence while the emulation environment hosts the instruction sequence (e.g. invocation logic 3051 causing processor 3092 to execute instruction sequence 3096 while processor 3072 executes instruction sequence 3076). This can occur, for example, in stand-alone embodiments of system 3000 as well as those in which primary system 1310 and external system 1340 each include a respective instance of system 3000 in mutual cooperation.

Operation 4585 describes deciding to host the software containing the instruction sequence in the other environment (e.g. host control circuitry 3056 deciding that primary system 1310 will host at least sequence 1301 in environment 1384 in lieu of or in concert with environment 1374 hosting an instance of sequence 1301). This can occur, for example, in embodiments in which at least one instance of evaluation module 1350 is configured to perform operation 1460 and in which an instance of system 3000 configured to perform operation 1480 is embodied in primary system 1310. In many variants described herein, such decisions can be temporary or otherwise provisional: depending on one or more of an apparent safety, timing, content, reputation, behavior, circumstances, analysis, or outcome of instruction sequence 1301 or its execution. In variants in which the software evaluation is also obtained, for example, it can be used to decide how the other environment hosts the instruction sequence (e.g. by executing software in a batch mode in response to an evaluation is "slow" or otherwise runs longer than a threshold duration). The software evaluation can also affect other decisions, such as which environment is used to host the instruction sequence (e.g. by routing one or more sequences having a risk-indicative evaluation to the "other" environment and one or more sequences having a non-risk-indicative evaluation to a third environment).

Operation 4589 describes selecting the other environment at least partly based on the software containing the instruction sequence (e.g. service router 3052 selecting environment 3094 over other environments for use with instruction sequence 3001 in response to one or more environmental attributes identified for use with software 3006). The attributes can include memory or other resource availability, diagnostic utility, load level or content, or the like. In some embodiments, two or more environments are selected from a field of several candidate environments for hosting sequence of a given class (e.g. at-risk software, software with no local history, or the like as described herein).

Figure 46:
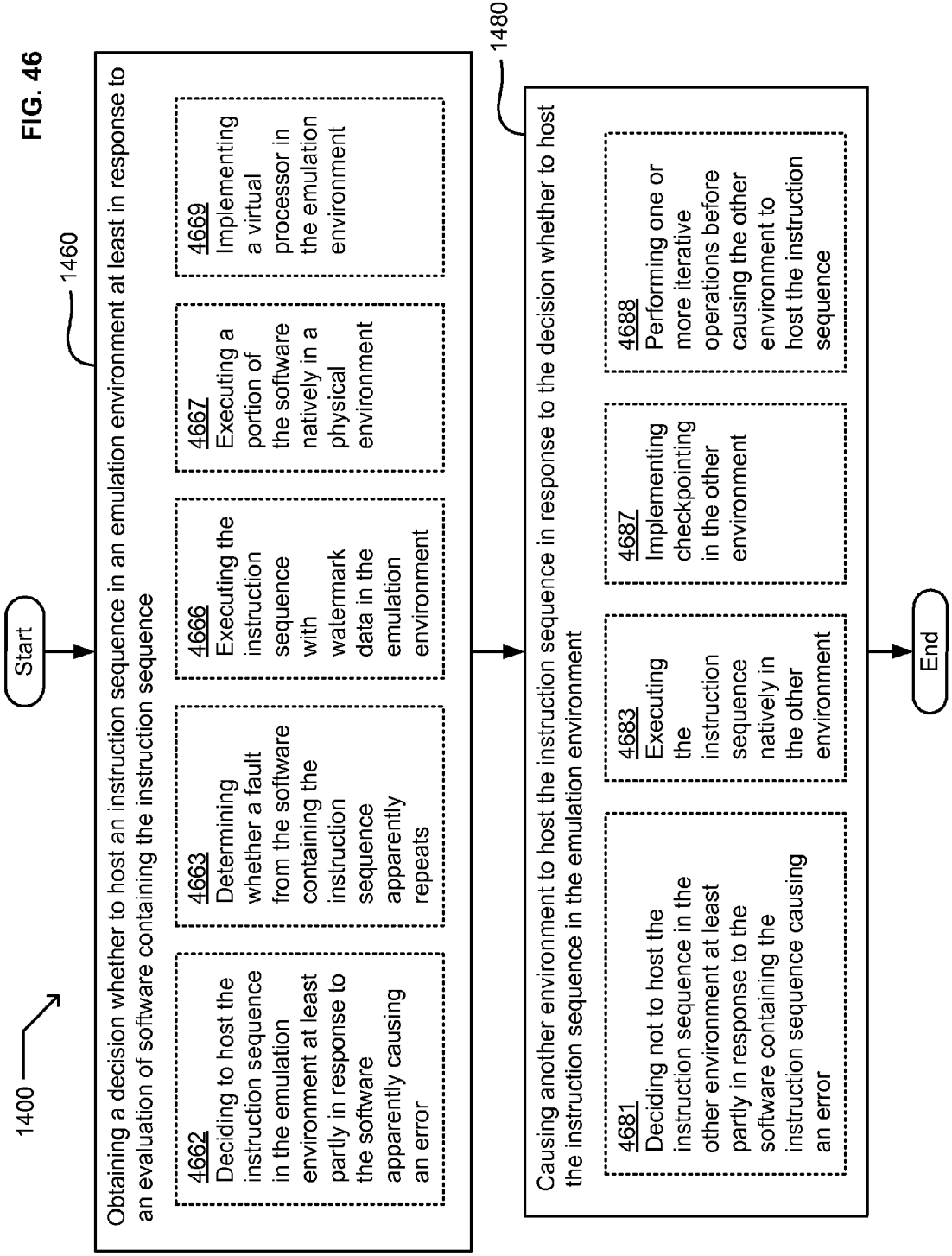

With reference now to FIG. 46, there are shown several variants of the flow 1400 of FIG. 14 or 45. Operation 1460—obtaining a decision whether to host an instruction sequence in an emulation environment at least in response to an evaluation of software containing the instruction sequence—may include one or more of the following operations: 4662, 4663, 4666, 4667, or 4669. The instruction sequence can, for example, comprise sequence 1725 or the like, optionally including one or more other sequences as described herein. Operation 1480—causing another environment to host the instruction sequence in response to the decision whether to host the instruction sequence in the emulation environment—may include one or more of the following operations: 4681, 4683, 4687, or 4688.

Operation 4662 describes deciding to host the instruction sequence in the emulation environment at least partly in response to the software apparently causing an error (e.g. security logic 3197 quarantining instruction sequence 3101 in environment 3174 in response to detecting an illegal operation or other fault event therein). In various embodiments, the hosted instruction sequence can include one or more of such illegal operations, entire software modules, newly-received sequences, all write instructions, periodically sampled portions of software 3101, or the like.

Operation 4663 describes determining whether a fault from the software containing the instruction sequence apparently repeats (e.g. testing logic 3195 evaluating instruction sequence 3103 by re-executing sequence 3103 in a state as it was before generating error data 3194, and comparing the re-execution result set with error data 3194 or other reference data). Alternatively or additionally, comparative parameters can be obtained with execution parameters incrementally or otherwise systematically varied. See, e.g., Feng Qin et al. ("Rx: Treating Bugs as Allergies—A Safe Method to Survive Software Failures") in Proceedings of the Symposium on Systems and Operating Systems Principles (2005). Evaluations that include "repeatable," "memory fault," or other fault categories or attributes can be used in deciding whether or how to select, characterize, analyze or quarantine instruction sequences in light of these teachings.

Operation 4666 describes executing the instruction sequence with watermark data in the emulation environment (e.g. emulator 3178 executing instruction sequence 3101 in environment 3174 that simultaneously contains watermark data 3129). The use of such data can facilitate detection of malicious code that copies or alters watermark data 3129 within environment 3174. In some embodiments, watermark data 3129 can be formatted to resemble a table, list, or executable code. Alternatively or additionally, one or more copies of distinctive naturally-occurring data (in one or more software objects 3106, e.g.) are effectively preserved for later use so that the naturally-occurring data effectively becomes watermark data.

Operation 4667 describes executing a portion of the software natively in a physical environment (e.g. core 3189 natively executing one or more instances of instruction sequence 3102 of software 3107). By hosting only a portion natively, the use or evaluation of software 3107 can optionally be streamlined relative to fully emulated configurations. Alternatively or additionally, in some contexts, some species of malicious behaviors or other defects may be manifested and detected in partly-native configurations that can otherwise remain undetectable.

Operation 4669 describes implementing a virtual processor in the emulation environment (e.g. emulator 3179 supporting one or more virtual instances of processor 3062 in environment 3174, each performing respective processes 3177). In some embodiments, the decision can cause two or more virtual processors each executing a respective instance of instruction sequence 3176, optionally in respective environments.

Operation 4681 describes deciding not to host the instruction sequence in the other environment at least partly in response to the software containing the instruction sequence causing an error (e.g. intrusion protection logic 3057 preventing or terminating a reception or execution of sequence 3001 in environment 1384 in response to detecting an illegal read or write operation or other error while sequence 3001 executes in environment 1374). In some embodiments, the decision "not to host" can be reversed in response to determining that other code (other than sequence 3001, e.g.) apparently caused the error(s) or otherwise determining that software 3006 to which the decision pertains is apparently not at fault.

Operation 4683 describes executing the instruction sequence natively in the other environment (e.g. machine 3080 natively executing instruction sequence 3002 in lieu of processor 3072 executing instruction sequence 3003 in a virtual machine). In some other embodiments, machine 3080 can be configured to host instruction sequence 3001 natively whenever instruction sequence 3001 is deemed suitable for execution machine 3070, and machine 3070 can analyze instruction sequence 3001 and perhaps detect bugs or malicious code in a manner that is invisible to the user.

Operation 4687 describes implementing checkpointing in the other environment (e.g. emulator 3089 permitting or defining one or more checkpoints 3009 within or between executions of instruction sequence 3086 in environment 3084). The checkpointing may be derived from user inputs, instances of a module or instruction class, shortly before or after an error location in a prior execution of the sequence, at random intervals, or the like.

Operation 4688 describes performing one or more iterative operations before causing the other environment to host the instruction sequence (e.g. detection logic 3054 deciding whether to perform an iteration of instruction sequence 3076 in environment 3074 based on an outcome of a loop's conditional statement). The conditional statement can depend on one or more of an iteration count or other timing logic 3007, error pattern 3008 or lack thereof, user input validating the software's behavior in the emulation environment, or the like.

With reference now to FIG. 47, there are shown several variants of the flow 1600 of FIG. 16. Operation 1640—obtaining a decision whether to host an instruction sequence natively in a physical environment in response to an operational history of software apparently containing the instruction sequence—may include one or more of the following operations: 4744, 4745, 4747, or 4748. Operation 1650—signaling a decision whether to cause an emulation environment to host the instruction sequence in response to the decision whether to host the instruction sequence natively in the physical environment—may include one or more of the following operations: 4752, 4754, 4756, or 4758.

Operation 4744 describes aggregating the operational history of the software according to one or more software object identifiers of the software (e.g. aggregator 3291 receiving and storing software object identifiers, version numbers, functional descriptions, code sources or the like in association with operational data such execution outcomes, platform information, information source identifiers, execution times, resource availabilities, or the like as event data 3292). In some embodiments, a resulting operational history 3255 can likewise include one or more risk evaluations, certifications, or other message(s) 3228 in association with various software 3207 or environment(s) as described herein.

Operation 4745 describes deciding whether to host the instruction sequence natively in the physical environment by applying one or more risk evaluation criteria to the operational history of the software apparently containing the instruction sequence (e.g. risk evaluation logic 3299 allowing processor 3282 to host sequence 3202 natively only after determining that prior usage of sequence 3202 or other software 3207 has apparently not generated excessive or severe errors locally). Alternatively or additionally, some or all of software 3207 can be evaluated directly, optionally in an emulation environment as described herein.

Operation 4747 describes obtaining the instruction sequence (e.g. port 3222 receiving source code 3204 or machine code 3205 operable for execution or other evaluation for facilitating the decision). Alternatively or additionally, decision module 1530 can use input 3224 received via interface 3220 or the like in deciding whether to host the instruction sequence natively. This can occur, for example, in embodiments in which decision module 3230 performs operation 1640 and in which signaling module 3250 performs operation 1650. In other instances, the decision is received externally—as decision 1525 via interface 1520, e.g. This can occur, for example, in embodiments in which interface 1520 performs operation 1640 and in which processor 1572 performs operation 1650.

Operation 4748 describes receiving a signal containing the decision whether to host the instruction sequence natively in the physical environment in response to the operational history of the software apparently containing the instruction sequence (e.g. network linkage 3221 receiving machine code 3205 implementing or otherwise conveying decision 3235 from an external source). Decision 3235 can likewise be received, in some embodiments, as a user input, for example via a local or remote interface 3220 as described herein.

Operation 4752 describes implementing at least a virtual memory in the emulation environment (e.g. memory manager 3254 creating at least one contiguous virtual memory 3276 in environment 3274 from two or more real memory or storage spaces). Alternatively or additionally, the emulation environment 3274 can include virtual processor 3277.

Operation 4754 describes deciding to cause the emulation environment to host the instruction sequence without first hosting the instruction sequence natively in the physical environment (e.g. intake circuitry 3251 routing at least instruction sequence 3201 to environment 3274 in response to an indication that instruction sequence 3201 is new). Alternatively or additionally, an emulation of instruction sequence 3201 can occur (in environment 3264, e.g.) before or during a native execution (in environment 3284, e.g.) as a security precaution, optionally in response receiving one or more risk indicators as described herein. (In some embodiments, an "indication of" an event or circumstance can include one or more of a categorization, identification, evaluation, notification, prediction, outcome, distillation, or the like relating to any potential or actual instance(s) of the event or circumstance.)

Operation 4756 describes providing data to the operational history at least partly based on the emulation environment hosting the software apparently containing the instruction sequence (e.g. emulator 3279 routing output 3278 from emulation environment 3274 so that operational history 3255 can record at least the hosting decision). In some embodiments, output 3278 can likewise signal circumstances or results of the hosting as described herein.

Operation 4758 describes displaying an indication of the decision whether to cause the emulation environment to host the instruction sequence (e.g. user interface 3220 notifying a user that some or all of software is being screened or otherwise analyzed). In a network context, for example, such analysis can also include distributing an inquiry about risk indicators such as whether software has been hosted in systems that have since experienced errors.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

In a general sense, those skilled in the art will recognize that the various embodiments described herein can be implemented, individually and/or collectively, by various types of electromechanical systems having a wide range of electrical components such as hardware, software, firmware, or virtually any combination thereof; and a wide range of components that may impart mechanical force or motion such as rigid bodies, spring or torsional bodies, hydraulics, and electro-magnetically actuated devices, or virtually any combination thereof. Consequently, as used herein "electro-mechanical system" includes, but is not limited to, electrical circuitry operably coupled with a transducer (e.g., an actuator, a motor, a piezoelectric crystal, etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), electrical circuitry forming a communications device (e.g., a modem, communications switch, or optical-electrical equipment), and any non-electrical analog thereto, such as optical or other analogs. Those skilled in the art will also appreciate that examples of electro-mechanical systems include but are not limited to a variety of consumer electronics systems, as well as other systems such as motorized transport systems, factory automation systems, security systems, and communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those skilled in the art will recognize that it is common within the art to describe devices and/or processes in the fashion set forth herein, and thereafter use engineering practices to integrate such described devices and/or processes into image processing systems. That is, at least a portion of the devices and/or processes described herein can be integrated into an image processing system via a reasonable amount of experimentation. Those having skill in the art will recognize that a typical image processing system generally includes one or more of a system unit housing, a video display device, a memory such as volatile and non-volatile memory, processors such as microprocessors and digital signal processors, computational entities such as operating systems, drivers, and applications programs, one or more interaction devices, such as a touch pad or screen, control systems including feedback loops and control motors (e.g., feedback for sensing lens position and/or velocity; control motors for moving/distorting lenses to give desired focuses. A typical image processing system may be implemented utilizing any suitable commercially available components, such as those typically found in digital still systems and/or digital motion systems.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

Those skilled in the art will recognize that it is common within the art to implement devices and/or processes and/or systems in the fashion(s) set forth herein, and thereafter use engineering and/or business practices to integrate such implemented devices and/or processes and/or systems into more comprehensive devices and/or processes and/or systems. That is, at least a portion of the devices and/or processes and/or systems described herein can be integrated into other devices and/or processes and/or systems via a reasonable amount of experimentation. Those having skill in the art will recognize that examples of such other devices and/or processes and/or systems might include—as appropriate to context and application—all or part of devices and/or processes and/or systems of (a) an air conveyance (e.g., an airplane, rocket, hovercraft, helicopter, etc.), (b) a ground conveyance (e.g., a car, truck, locomotive, tank, armored personnel carrier, etc.), (c) a building (e.g., a home, warehouse, office, etc.), (d) an appliance (e.g., a refrigerator, a washing machine, a dryer, etc.), (e) a communications system (e.g., a networked system, a telephone system, a Voice over IP system, etc.), (f) a business entity (e.g., an Internet Service Provider (ISP) entity such as Comcast Cable, Quest, Southwestern Bell, etc), or (g) a wired/wireless services entity such as Sprint, Cingular, Nextel, etc.), etc.

All of the above-mentioned U.S. patents, U.S. patent application publications, U.S. patent applications, foreign patents, foreign patent applications and non-patent publications referred to in this specification and/or listed in any Application Data Sheet, are incorporated herein by reference, to the extent not inconsistent herewith.

One skilled in the art will recognize that the herein described components (e.g., steps), devices, and objects and the discussion accompanying them are used as examples for the sake of conceptual clarity and that various configuration modifications are within the skill of those in the art. Consequently, as used herein, the specific exemplars set forth and the accompanying discussion are intended to be representative of their more general classes. In general, use of any specific exemplar herein is also intended to be representative of its class, and the non-inclusion of such specific components (e.g., steps), devices, and objects herein should not be taken as indicating that limitation is desired.

Although users 133, 333, 2868 are shown/described herein each as a single illustrated figure, those skilled in the art will appreciate that such users may be representative of a human user, a robotic user (e.g., computational entity), and/or substantially any combination thereof (e.g., a user may be assisted by one or more robotic agents). In addition, each such user, as set forth herein, although shown as a single entity may in fact be composed of two or more entities. Those skilled in the art will appreciate that, in general, the same may be said of "sender" and/or other entity-oriented terms as such terms are used herein.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

With respect to the appended claims, those skilled in the art will appreciate that recited operations therein may generally be performed in any order. Examples of such alternate orderings may include overlapping, interleaved, interrupted, reordered, incremental, preparatory, supplemental, simultaneous, reverse, or other variant orderings, unless context dictates otherwise. With respect to context, even terms like "responsive to," "related to," or other past-tense adjectives are generally not intended to exclude such variants, unless context dictates otherwise.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
   (a) obtaining data from a first emulator and a first emulation environment, on a first machine, hosting particular software, including at least:
      (1) deciding whether to increase a trust level of at least a portion of the particular software hosted in the first emulation environment as a result of the particular software meeting one or more performance indicators while executed in the first emulation environment, including at least:
         (A) deciding whether to increase a trust level of at least a portion of the particular software hosted in the first emulation environment as a result of the particular software meeting one or more performance indicators while being executed in the first emulation environment that include at least one of manifesting an error rate below a given threshold, completing one or more tasks within a specified time, or completing one or more specific tasks successfully; and (b) signaling a decision to transfer at least some of the data to a second emulator that is configured to host on a second emulation environment at least a portion of the particular software hosted by the first emulation environment on the first machine, wherein the signaling a decision to transfer at least some of the data to a second emulator includes at least signaling a decision to transfer the at least some of the data to a second emulator that is on a second machine that is physically distinct from the first machine, and wherein the signaling a decision to transfer is performed at least partly as a result of the decision to increase or not to increase the trust level of at least a portion of the particular software hosted in the first emulation environment; and (c) wherein at least the signaling a decision to transfer is performed with at least at least one or more processing devices.

2. The method of claim 1, further comprising:
causing the second emulator to host at least one portion of the particular software.

3. The method of claim 1, wherein the obtaining data from a first emulator and a first emulation environment, on a first machine, hosting particular software comprises:
receiving a first portion of the data from the first emulator and a second portion of the data from the first emulation environment hosting the software.

4. The method of claim 1, further comprising:
transferring information about at least one transfer-triggering event to the second emulator.

5. The method of claim 1, wherein said signaling a decision to transfer at least some of the data to a second emulator that is configured to host on a second emulation environment at least a portion of the particular software hosted by the first emulation environment on the first machine, wherein the signaling a decision to transfer at least some of the data to a second emulator includes at least signaling a decision to transfer the at least some of the data to a second emulator that is on a second machine that is physically distinct from the first machine, and wherein the signaling a decision to transfer is performed at least partly as a result of the decision to increase or not to increase the trust level of at least a portion of the particular software hosted in the first emulation environment comprises:
transferring to the second emulator on the second machine at least some that data that includes at least state information relating to the particular software, the state information including at least data associated with hosting of the particular software in the first emulation environment on the first machine.

6. The method of claim 5, wherein said data associated with hosting of the particular software in the first emulation environment on the first machine includes at least one of an action sequence, a conditional determination, a storage configuration, a data aggregation, an execution outcome, a call stack, an interaction history, a registry, or a workspace content.

7. A system comprising:
(a) circuitry for obtaining data from a first emulator and a first emulation environment, on a first machine, hosting particular software, including at least:
(1) circuitry for deciding whether to increase a trust level of at least a portion of the particular software hosted in the first emulation environment as a result of the particular software meeting one or more performance indicators when executed in the first emulation environment, including at least:
(A) circuitry for deciding whether to increase a trust level of at least a portion of the particular software hosted in the first emulation environment as a result of the particular software meeting one or more performance indicators while being executed in the first emulation environment that include at least one of manifesting an error rate below a given threshold, completing one or more tasks within a specified time, or completing one or more specific tasks successfully; and (b) circuitry for signaling a decision to transfer at least some of the data to a second emulator on a second machine that is physically distinct from the first machine at least partly as a result of the decision to increase or not to increase the trust level of at least a portion of the particular software hosted in the first emulation environment, wherein the circuitry for signaling is configured to signal a decision to transfer at least some of the data to a second emulator that is configured to host in a second emulation environment on the second machine at least a portion of the particular software hosted by the first emulation environment on the first machine.

8. The system of claim 7, wherein the circuitry for signaling a decision to transfer at least some of the data to a second emulator on a second machine that is physically distinct from the first machine at least partly as a result of the decision to increase or not to increase the trust level of at least a portion of the particular software hosted in the first emulation environment, wherein the circuitry for signaling is configured to signal a decision to transfer at least some of the data to a second emulator that is configured to host in a second emulation environment on the second machine at least a portion of the particular software hosted by the first emulation environment on the first machine comprises:
circuitry for deciding whether to transmit at least some of the data at least partly based on whether an anomaly arises while the first emulation environment hosts the particular software.

9. The system of claim 7, further comprising:
circuitry for deciding whether to cause the second emulator to use a security restriction used by the first emulator in hosting the particular software.

10. The system of claim 7, further comprising:
circuitry for causing the second emulator to host the particular software and other software in a second emulation environment.

11. The system of claim 7, wherein the circuitry for signaling a decision to transfer at least some of the data to a second emulator on a second machine that is physically distinct from the first machine at least partly as a result of the decision to increase or not to increase the trust level of at least a portion of the particular software hosted in the first emulation environment, wherein the circuitry for signaling is configured to signal a decision to transfer at least some of the data to a second emulator that is configured to host in a second emulation environment on the second machine at least a portion of the particular software hosted by the first emulation environment on the first machine comprises:
circuitry for receiving at least one malicious code indication in the data.

12. The system of claim 7, further comprising:
circuitry for obtaining at least one result of the first emulation environment hosting the particular software.

13. The system of claim 7, wherein the circuitry for signaling a decision to transfer at least some of the data to a second emulator on a second machine that is physically distinct from the first machine at least partly as a result of the decision to increase or not to increase the trust level of at least a portion of the particular software hosted in the first emulation environment, wherein the circuitry for signaling is configured to signal a decision to transfer at least some of the data to a second emulator that is configured to host in a second emulation environment on the second machine at least a portion of the particular software hosted by the first emulation environment on the first machine comprises:

circuitry for transferring at least some of the data to a second emulator on a second machine that is physically distinct from the first machine to configure at least one emulation environment of the second machine to host at least some of the particular software based at least partly on at least one indication of suboptimal completion.

14. The system of claim 7, wherein the circuitry for obtaining data from a first emulator and a first emulation environment, on a first machine, hosting particular software comprises:

circuitry for obtaining state information from the first emulator on the first machine hosting the particular software.

15. The system of claim 7, further comprising:
circuitry for indicating at least one trust level for the particular software.

16. The system of claim 7, further comprising:
circuitry for selecting a second emulation environment on the second machine based at least partly on at least one environmental attribute.

17. The system of claim 7, circuitry for signaling a decision to transfer at least some of the data to a second emulator on a second machine that is physically distinct from the first machine at least partly as a result of the decision to increase or not to increase the trust level of at least a portion of the particular software hosted in the first emulation environment, wherein the circuitry for signaling is configured to signal a decision to transfer at least some of the data to a second emulator that is configured to host in a second emulation environment on the second machine at least a portion of the particular software hosted by the first emulation environment on the first machine comprises:

circuitry for deciding whether to transmit a portion of the data from the first emulator hosting the particular software in response to a detected defect in the particular software.

18. The system of claim 7, further comprising:
circuitry for identifying at least one risk indicator for the particular software.

19. The system of claim 7, further comprising:
circuitry for identifying at least one resource requirement for the particular software.

20. The system of claim 7, wherein the first emulator includes a software program configured to run within the first emulation environment hosting software.

21. The system of claim 7, wherein the first emulator is configured to emulate at least one of a network device, a video display program, or a security logic.

22. The system of claim 7, wherein the first emulation environment hosting software includes at least one of an operating system, security logic, a standalone system, one or more primary hardware elements, a processor, a processor working space, one or more primary software elements, a library module or one or more instruction sequences.

23. The system of claim 7, wherein the circuitry for signaling a decision includes at least one of circuitry for implementing a virtual memory, circuitry for indicating an event, circuitry for signaling whether software has been hosted in a system that has experienced errors, or circuitry for emulating a standalone decision.

24. The system of claim 7, wherein the second emulator includes at least one of circuitry complementary to first emulator, circuitry for implementing security logic, circuitry for maintaining partial access to memory, or circuitry for quarantining instruction sequences.

25. The system of claim 7, further comprising:
circuitry for determining that prior usage of the hosting software hosting the first emulator has failed to generate greater than a predetermined number of errors.

26. The system of claim 25 wherein the predetermined number of errors results from prior usage of the first emulator or other software.

27. The system of claim 25, wherein the circuitry for determining that prior usage of the hosting software hosting the first emulator has failed to generate greater than a predetermined number of errors includes at least circuitry for determining all instructions of the first emulator are working correctly.

28. The system of claim 25, wherein circuitry for determining that prior usage of the hosting software hosting the first emulator has failed to generate greater than a predetermined number of errors includes at least circuitry for determining that prior usage of the first emulator has failed to generate greater than a predetermined number of errors.

29. The system of claim 7, wherein at least one of the first emulation environment or the second emulation environment is a virtual machine.

30. The system of claim 29, wherein at least the first emulation environment is a Java virtual machine.

31. The system of claim 29, wherein at least the second emulation environment is a Java virtual machine.

32. A system comprising:
(a) circuitry for obtaining at least error data from a first emulator and a first virtual machine, on a first machine, hosting particular software, including at least:
(1) circuitry for deciding whether to increase a trust level of at least a portion of the particular software hosted in the first virtual machine as a result of the particular software manifesting an error rate below a given threshold when executed in the first virtual machine; and
(b) circuitry for signaling a decision to transfer at least some of the error data to a second emulator on a second machine that is physically distinct from the first machine at least partly as a result of the decision to increase or not to increase the trust level of at least a portion of the particular software hosted in the first virtual machine, wherein the circuitry for signaling is configured to signal a decision to transfer at least some of the error data to a second emulator that is configured to host in a second virtual machine on the second machine at least a portion of the particular software hosted by the first virtual machine on the first machine.

33. The system of claim 32, wherein the circuitry for signaling a decision to transfer at least some of the error data to a second emulator on a second machine that is physically distinct from the first machine at least partly as a result of the decision to increase or not to increase the trust level of at least a portion of the particular software hosted in the first virtual machine, wherein the circuitry for signaling is configured to signal a decision to transfer at least some of the error data to a second emulator that is configured to host in a second virtual machine on the second machine at least a portion of the particular software hosted by the first virtual machine on the first machine comprises:

circuitry for deciding whether to transmit a portion of the error data from the first emulator hosting the particular software at least partly in response to a detected defect in the particular software.

34. The system of claim 32, further comprising:
   circuitry for causing the second emulator to host at least a portion of the particular software.

35. The system of claim 32, further comprising:
   circuitry for deciding whether to cause the second emulator to use a security restriction used by the first emulator in hosting the particular software.

36. The system of claim 32, wherein the circuitry for obtaining at least error data from a first emulator and a first virtual machine, on a first machine, hosting particular software comprises:
   circuitry for receiving a first portion of the error data from the first emulator and a second portion of the error data from the first virtual machine hosting the particular software.

37. The system of claim 32, wherein the circuitry for obtaining at least error data from a first emulator and a first virtual machine, on a first machine, hosting particular software comprises:
   circuitry for receiving at least one indication of malicious code in the error data.

38. The system of claim 32, wherein the circuitry for obtaining at least error data from a first emulator and a first virtual machine, on a first machine, hosting particular software comprises:
   circuitry for receiving at least one indication of suboptimal completion in the error data.

39. The system of claim 32, wherein the circuitry for signaling a decision to transfer at least some of the error data to a second emulator on a second machine that is physically distinct from the first machine at least partly as a result of the decision to increase or not to increase the trust level of at least a portion of the particular software hosted in the first virtual machine, wherein the circuitry for signaling is configured to signal a decision to transfer at least some of the error data to a second emulator that is configured to host in a second virtual machine on the second machine at least a portion of the particular software hosted by the first virtual machine on the first machine comprises:
   circuitry for transferring to the second emulator at least a portion of the error data that includes at least state information relating to the particular software.

40. The system of claim 32, wherein the circuitry for signaling a decision to transfer at least some of the error data to a second emulator on a second machine that is physically distinct from the first machine at least partly as a result of the decision to increase or not to increase the trust level of at least a portion of the particular software hosted in the first virtual machine, wherein the circuitry for signaling is configured to signal a decision to transfer at least some of the error data to a second emulator that is configured to host in a second virtual machine on the second machine at least a portion of the particular software hosted by the first virtual machine on the first machine comprises:
   circuitry for transferring information about at least one transfer-triggering event to the second emulator.

41. A computer program product comprising:
   one or more non-transitory media including at least:
   (a) one or more instructions for obtaining data from a first emulator and a first emulation environment, on a first machine, hosting software, including at least:
      (1) one or more instructions for deciding whether to increase a trust level of at least a portion of the particular software hosted in the first emulation environment as a result of the particular software meeting one or more performance indicators when executed in the first emulation environment, including at least:
         (A) one or more instructions for deciding whether to increase a trust level of at least a portion of the particular software hosted in the first emulation environment as a result of the particular software meeting one or more performance indicators while being executed in the first emulation environment that include at least one of manifesting an error rate below a given threshold, completing one or more tasks within a specified time, or completing one or more specific tasks successfully; and
   (b) one or more instructions for signaling a decision to transfer at least some of the data to a second emulator on a second machine that is physically distinct from the first machine at least partly as a result of the decision to increase or not to increase the trust level of at least a portion of the particular software hosted in the first emulation environment, wherein the one or more instructions for signaling are configured to signal a decision to transfer at least some of the data to a second emulator that is configured to host in a second emulation environment on the second machine at least a portion of the particular software hosted by the first emulation environment on the first machine.

* * * * *